United States Patent
Nishiyama

(10) Patent No.: US 7,592,126 B2
(45) Date of Patent: Sep. 22, 2009

(54) POSITIVE RESIST COMPOSITION AND PATTERN FORMING METHOD USING THE RESIST COMPOSITION

(75) Inventor: Fumiyuki Nishiyama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 363 days.

(21) Appl. No.: 11/377,728

(22) Filed: Mar. 17, 2006

(65) Prior Publication Data

US 2006/0210922 A1    Sep. 21, 2006

(30) Foreign Application Priority Data

Mar. 17, 2005   (JP) ................. P.2005-077103

(51) Int. Cl.
*G03F 7/004* (2006.01)
*G03F 7/30* (2006.01)

(52) U.S. Cl. .............. 430/270.1; 430/326; 430/905; 430/907; 430/910

(58) Field of Classification Search .......... 430/270.1, 430/326, 330, 905, 907, 910
See application file for complete search history.

(56) References Cited

U.S. PATENT DOCUMENTS

| | | | |
|---|---|---|---|
| 6,383,713 B1* | 5/2002 | Uetani et al. ............. | 430/270.1 |
| 6,548,221 B2* | 4/2003 | Uetani et al. ............. | 430/270.1 |
| 7,005,230 B2* | 2/2006 | Yamamoto et al. ........ | 430/270.1 |
| 7,341,817 B2* | 3/2008 | Wada et al. .............. | 430/270.1 |
| 7,449,573 B2* | 11/2008 | Kodama et al. ............ | 540/482 |
| 2001/0016298 A1 | 8/2001 | Nakanishi et al. | |
| 2005/0266336 A1* | 12/2005 | Kodama ................... | 430/270.1 |
| 2006/0040203 A1* | 2/2006 | Kodama et al. ........... | 430/270.1 |
| 2007/0054217 A1* | 3/2007 | Kodama et al. ........... | 430/270.1 |

FOREIGN PATENT DOCUMENTS

JP    2001-215704 A    8/2001

* cited by examiner

*Primary Examiner*—John S Chu
(74) *Attorney, Agent, or Firm*—Sughrue Mion, PLLC

(57) ABSTRACT

A positive resist composition comprising: (A) a resin insoluble or sparingly soluble in an alkali but capable of decomposing under an action of an acid to increase a solubility in an alkali developer, the resin having a β-(meth)acroyloxy-γ-butyrolactone repeating unit represented by the following formula (1) containing a lactone ring which may have a substituent; and (B) a compound capable of generating an organic acid represented by the formula (2), (3), (3'), (4) or (5) as defined herein upon irradiation of actinic rays or radiation.

7 Claims, No Drawings

POSITIVE RESIST COMPOSITION AND PATTERN FORMING METHOD USING THE RESIST COMPOSITION

FIELD OF THE INVENTION

The present invention relates to a resist composition capable of changing in the properties by undergoing a reaction upon irradiation of actinic rays or radiation, a compound for use in the resist composition, and a pattern forming method using the resist composition. More specifically, the present invention relates to a resist composition for use in the step of producing a semiconductor such as IC, in the production of a circuit board for liquid crystal, thermal head and the like, in other photofabrication processes, or in a lithographic printing plate or an acid-curable composition, and also relates to a compound for use in the resist composition and a pattern forming method using the resist composition.

BACKGROUND OF THE INVENTION

A chemical amplification resist composition is a pattern forming material of forming a pattern on a substrate by producing an acid in the exposed part upon irradiation of radiation such as far ultraviolet light, and changing the solubility in a developer between the part irradiated with actinic radiation and the non-irradiated part resulting from a reaction using the generated acid as a catalyst.

In the case of using a KrF excimer laser as the exposure light source, a good pattern with high sensitivity and high resolution is formed because a resin exhibiting small absorption mainly in the 248-nm region and having poly(hydroxystyrene) as the basic skeleton is used as the main component, and this is a good system as compared with the conventional naphthoquinone diazide/novolak resin system.

On the other hand, in the case where a light source at a shorter wavelength, for example, an AfF excimer laser (193 nm) is used as the exposure light source, the above-described chemical amplification system is insufficient because the compound having an aromatic group inherently exhibits large absorption in the 193-nm region.

Therefore, development of a resist for an ArF excimer laser, containing a resin having an alicyclic hydrocarbon structure, is proceeding.

It is known that the resin having an alicyclic hydrocarbon structure, which is used in the resist for an ArF excimer laser, generally has high hydrophobicity and poor affinity for a developer. When the affinity for a developer is poor, the development does not proceed uniformly and this may adversely affect the dimensional uniformity of pattern or may give rise to a development defect. As for the measures to solve this problem, JP-A-2001-215704 (the term "JP-A" as used herein means an "unexamined published Japanese patent application") discloses that a resin having a certain high-polarity polymerization unit is effective for the improvement of wettability to an alkali developer. However, even such measures cannot be said to have a satisfactory performance with respect to the mask error factor (hereinafter referred to as "MEF") which is one of the image performances. The MEF indicates a phenomenon that the fluctuation in the mask precision is magnified by the resist.

SUMMARY OF THE INVENTION

Considering these problems of conventional techniques, an object of the present invention is to provide a positive resist composition capable of improving the MEF performance.

The present invention has the following constitutions and by these constitutions, the above-described object of the present invention can be attained.

(1) A positive resist composition comprising (A) a resin insoluble or sparingly soluble in an alkali but capable of decomposing under the action of an acid to increase the solubility in an alkali developer, the resin having a β-(meth)acroyloxy-γ-butyrolactone repeating unit represented by formula (1) containing a lactone ring which may have a substituent, and (B) a compound capable of generating an organic acid represented by the following formula (2), (3), (3'), (4) or (5) upon irradiation of actinic rays or radiation:

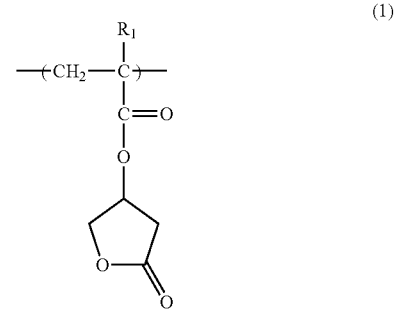

wherein $R_1$ represents a hydrogen atom or an alkyl group, and the lactone ring may have a substituent;

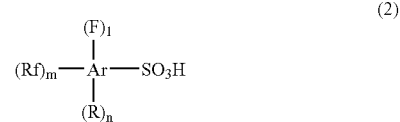

wherein
Rf represents an organic group having a fluorine atom,
R represents a hydroxyl group or an organic group,
Ar represents an aromatic group,
l represents an integer of 1 to 6,
m represents an integer of 0 to 4, and
n represents an integer of 0 to 4,
provided that m+n represents an integer of 1 or more;

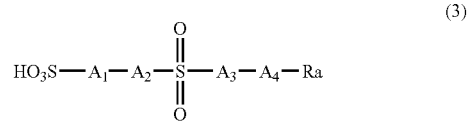

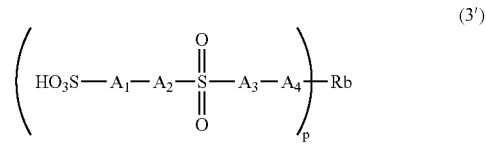

wherein

A₁ represents a divalent linking group,

A₂ and A₃ each independently represents a single bond, an oxygen atom or —N(Rx)-, Rx represents a hydrogen atom, an aryl group, an alkyl group or a cycloalkyl group, A₄ represents a single bond or —C(=O)—, Ra represents a hydrogen atom or an organic group, p represents 2 or 3, Rb represents a p-valent linking group, and when A₃ is —N(Rx)-, Ra and Rx, or Rb and Rx may combine to form a ring; and

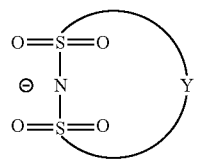
(4)

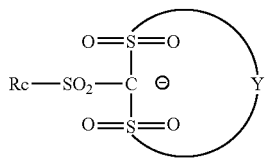
(5)

wherein

Y represents an alkylene group substituted by at least one fluorine atom, and

Rc represents an alkyl group or a cycloalkyl group.

(2) A pattern forming method comprising steps of forming a resist film from the positive resist composition claimed in claim 1, and exposing and developing said resist film.

DETAILED DESCRIPTION OF THE INVENTION

The present invention is described in detail below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] (A) Resin which Decomposes Under the Action of an Acid to Increase the Solubility in an Alkali Developer (Hereinafter Sometimes Referred to as a "Component (A)")

The resin contained in the positive resist composition of the present invention is a resin (acid-decomposable resin) insoluble or sparingly soluble in an alkali but capable of decomposing under the action of an acid to increase the solubility in an alkali developer, the resin having a β-(meth)acryloxy-γ-butyrolactone repeating unit represented by formula (1) containing a lactone ring which may have a substituent.

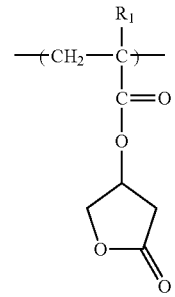
(1)

wherein R₁ represents a hydrogen atom or an alkyl group, and the lactone ring may have a substituent.

The alkyl group as R₁ preferably has a carbon number of 1 to 5, and a methyl group is preferred.

The alkyl group as R₁ may have a substituent and examples of the substituent include a halogen atom (e.g., fluorine), an alkoxy group and a hydroxyl group.

Examples of the substituent which the lactone ring in formula (1) may have include an alkyl group, an alkoxy group and an alkoxyalkyl group, and the substituent preferably has a carbon number of 10 or less.

Specific examples thereof include, but are not limited to, the followings.

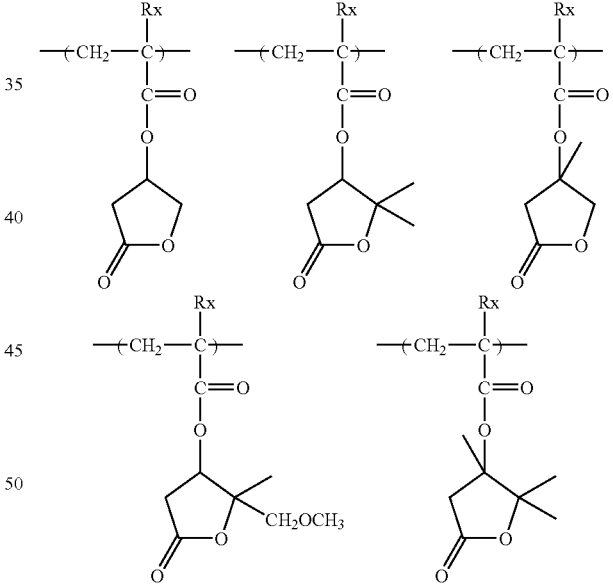

(wherein Rx is H, CH₃ or CF₃).

The amount added of the repeating unit represented by formula (1) is preferably from 5 to 95 mol %, more preferably from 20 to 80 mol %, based on all repeating units constituting the resin.

The resin for use in the positive resist composition of the present invention, which decomposes under the action of an acid to increase the solubility in an alkali developer (acid-decomposable resin), is a resin having a group capable of decomposing under the action of an acid (hereinafter sometimes referred to as an "acid-decomposable group"), in either one or both of the main chain and the side chain. A resin having an acid-decomposable group in the side chain is preferred.

The acid-decomposable group is preferably a group resulting from substituting the hydrogen atom of a —COOH group or —OH group by a group which dissociates under the action of an acid.

In particular, the acid-decomposable resin preferably has a monocyclic or polycyclic alicyclic hydrocarbon structure.

The resin having a monocyclic or polycyclic alicyclic hydrocarbon structure and decomposing under the action of an acid to increase the solubility in an alkali developer (hereinafter sometimes referred to as an "alicyclic hydrocarbon-based acid-decomposable resin") is preferably a resin containing a repeating unit having an alicyclic hydrocarbon-containing partial structure represented by any one of the following formulae (pI) to (pVI).

The alicyclic hydrocarbon-based acid-decomposable resin may contain at least one repeating unit selected from a repeating unit having an alicyclic hydrocarbon-containing partial structure represented by any one of the following formulae (pI) to (pVI), and a repeating unit of a copolymerization component which is described later. [Repeating unit having an alicyclic hydrocarbon-containing partial structure represented by any one of the following formulae (pI) to (pVI)]

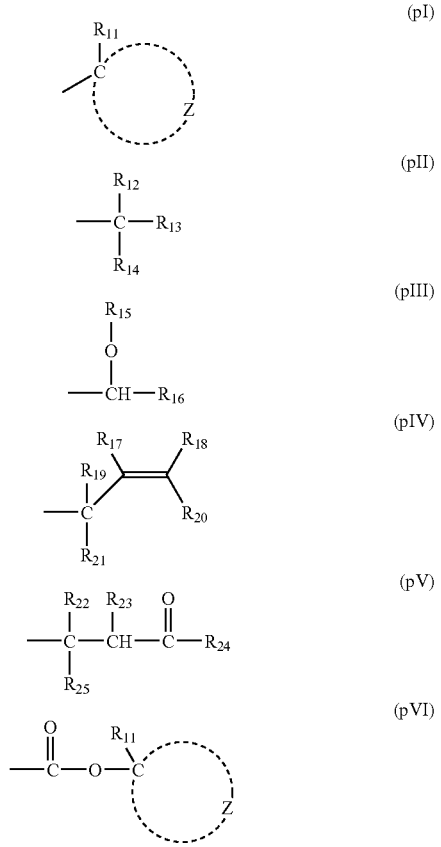

In formulae (pI) to (pVI), $R_{11}$ represents a methyl group, an ethyl group, an n-propyl group, an isopropyl group, an n-butyl group, an isobutyl group or a sec-butyl group, Z represents an atomic group necessary for forming a cycloalkyl group together with the carbon atom, $R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group, $R_{17}$ to $R_{21}$ each independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group, and $R_{22}$ to $R_{25}$ each independently represents a hydrogen atom, a linear or branched alkyl group having a carbon number of 1 to 4 or a cycloalkyl group, provided that at least one of $R_{22}$ to $R_{25}$ represents a cycloalkyl group and that $R_{23}$ and $R_{24}$ may combine with each other to form a ring.

In formulae (pI) to (pVI), the alkyl group of $R_{12}$ to $R_{25}$ is a linear or branched alkyl group having from 1 to 4 carbon atoms, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group may have include an alkoxy group having a carbon number of 1 to 4, a halogen atom (e.g., fluorine, chlorine, bromine, iodine), an acyl group, an acyloxy group, a cyano group, a hydroxyl group, a carboxy group, an alkoxycarbonyl group and a nitro group.

The cycloalkyl group of $R_{11}$ to $R_{25}$ and the cycloalkyl group formed by Z together with the carbon atom each may be monocyclic or polycyclic. Specific examples thereof include a group having a monocyclic, bicyclic, tricyclic or tetracyclic structure with a carbon number of 5 or more. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent for the cycloalkyl group include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably an alkyl group selected from the group consisting of a methyl group, an ethyl group, a propyl group and an isopropyl group. The alkoxy group includes an alkoxy group having a carbon number of 1 to 4, such as methoxy group, ethoxy group, propoxy group and butoxy group. Examples of the substituent which these alkyl group, alkoxy group and alkoxycarbonyl group may further have include a hydroxy group, a halogen atom and an alkoxy group.

The structure represented by any one of formulae (pI) to (pVI) in the resin is used for the protection of an alkali-soluble group and can form a group of producing an alkali-soluble group by decomposing under the action of an acid (acid-decomposable group).

Examples of the alkali-soluble group include a carboxylic acid group, a sulfonic acid group, a phenol group and a thiol group. A carboxylic acid group and a sulfonic acid group are preferred.

The alkali-soluble group protected by the structure represented by any one of formulae (pI) to (pVI) in the resin is preferably a structure where a hydrogen atom of a carboxyl group is substituted by the structure represented by any one of formulae (pI) to (pVI).

The repeating unit having a structure where an alkali-soluble group is protected by the structure represented by any one of formulae (pI) to (pVI) is preferably a repeating unit represented by the following formula (pA):

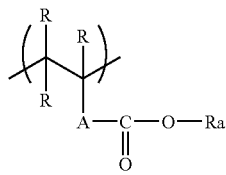

(pA)

wherein R represents a hydrogen atom, a halogen atom or a linear or branched alkyl group having from 1 to 4 carbon atoms, and a plurality of R's may be the same or different;

A represents a single bond, or a sole group or a combination of two or more groups, selected from the group consisting of an alkylene group, an ether group, a thioether group, a carbonyl group, an ester group, an amido group, a sulfonamido group, a urethane group and a urea group; and Ra represents any one group of formulae (pI) to (pVI).

The repeating unit represented by formula (pA) is most preferably a repeating unit comprising a 2-alkyl-2-adamantyl (meth)acrylate or a dialkyl(1-adamantyl)methyl (meth)acrylate.

Specific examples of the repeating unit represented by formula (pA) are set forth below.

(In the following formulae, Rx is H, $CH_3$ or $CF_3$.)

1

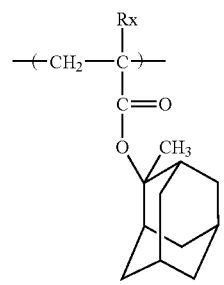

2

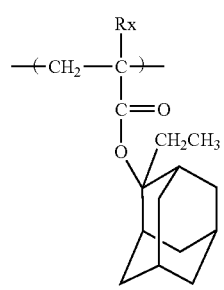

3

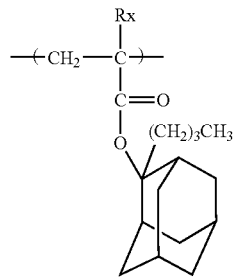

4

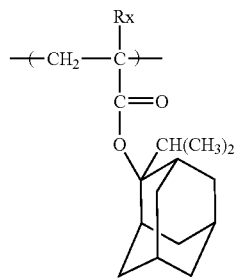

5

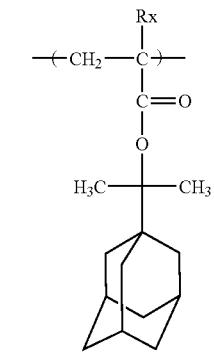

6

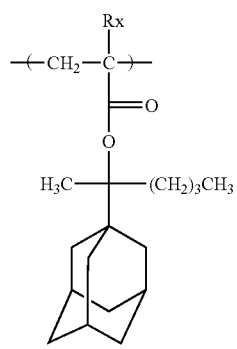

7

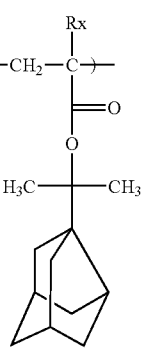

-continued
8
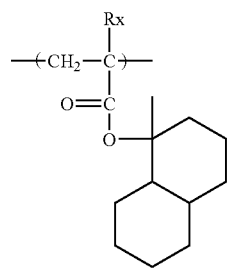
9
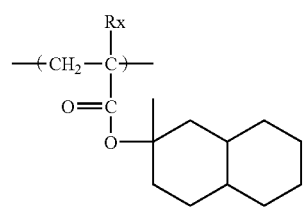
10
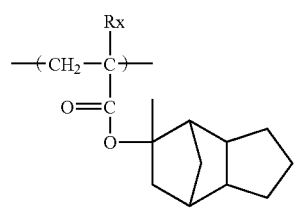
11
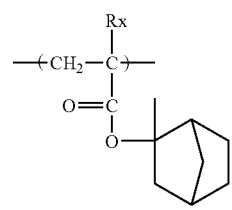
12
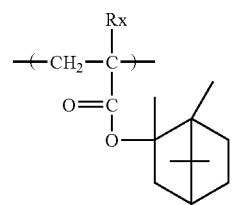
13
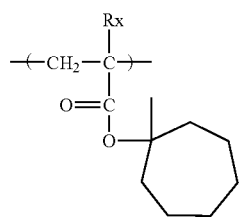
14
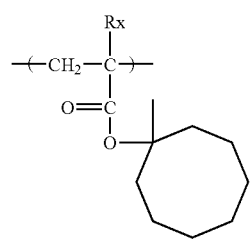
-continued
15
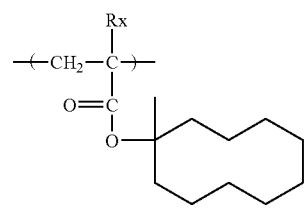
16
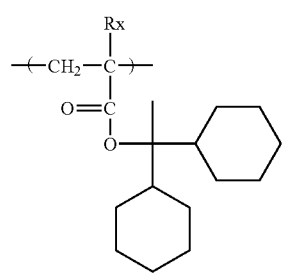
17
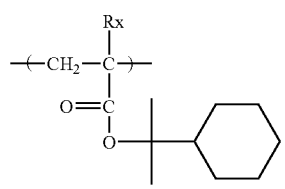
18
19
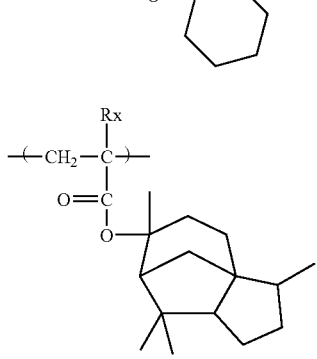
20
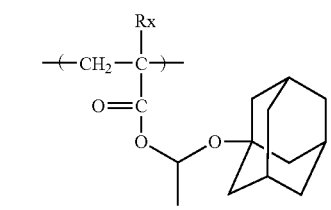
21
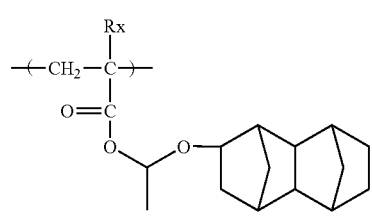

-continued

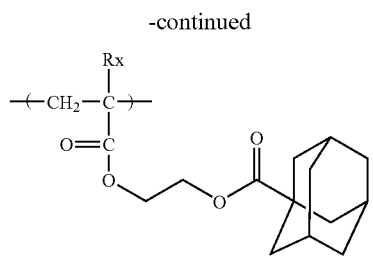
22

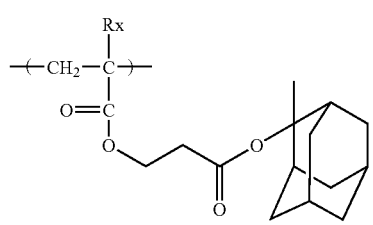
23

The acid-decomposable resin for use in the resist composition of the present invention preferably contains a repeating unit having a group represented by the following formula (VII) (hydroxyadamantane) together with a repeating unit represented by formula (1) and a repeating unit having an acid-decomposable group.

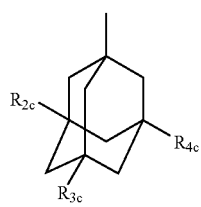
(VII)

wherein $R_{2c}$ to $R_{4c}$ each independently represents a hydrogen atom or a hydroxyl group, provided that at least one of $R_{2c}$ to $R_{4c}$ represents a hydroxyl group.

The group represented by formula (VII) is preferably a dihydroxy form or a monohydroxy form, more preferably a dihydroxy form.

Examples of the repeating unit having a group represented by formula (VII) include a repeating unit represented by the following formula (AII):

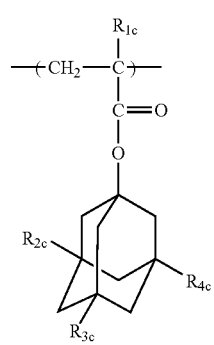
(AII)

wherein $R_{1c}$ represents a hydrogen atom or a methyl group, and $R_{2C}$ to $R_{4c}$ each independently represents a hydrogen atom or a hydroxyl group, provided that at least one of $R_{2c}$ to $R_{4c}$ represents a hydroxyl group. A repeating unit where two members out of $R_{2c}$ to $R_{4c}$ are a hydroxyl group is preferred.

Specific examples of the repeating unit having the structure represented by formula (AII) are set forth below, but the present invention is not limited thereto.

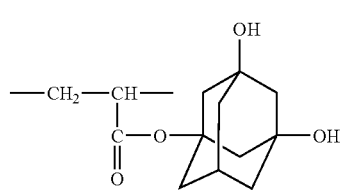
(1)

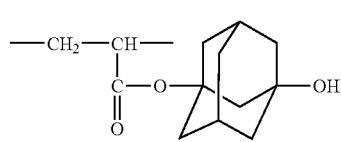
(2)

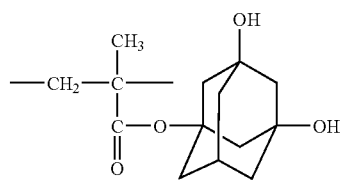
(3)

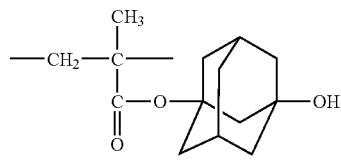
(4)

In addition to the repeating unit other than the repeating unit represented by formula (1), a repeating unit containing a group having a lactone structure represented by the following formula (Lc) or by any one of formulae (V-1) to (V-5) may be contained. Also, the group having a lactone structure may be bonded directly to the main chain.

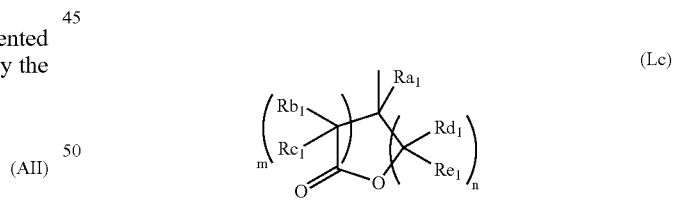
(Lc)

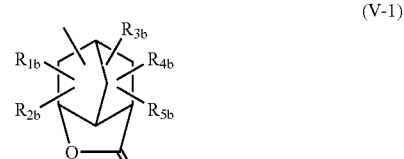
(V-1)

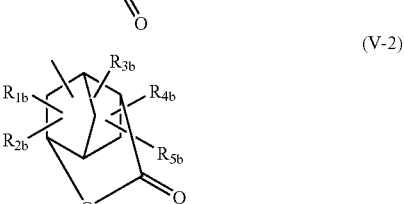
(V-2)

-continued

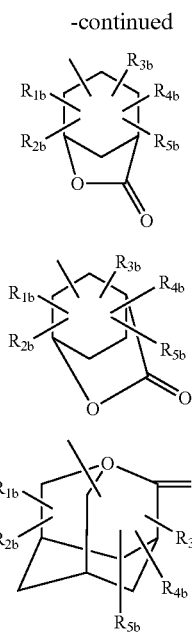

(V-3)

(V-4)

(V-5)

In formula (Lc), $Ra_1$, $Rb_1$, $Rc_1$, $Rd_1$ and $Re_1$ each independently represents a hydrogen atom or an alkyl group, m and n each independently represents an integer of 0 to 3, and m+n is from 2 to 6, provided that m and n are not 1 at the same time.

In formulae (V-1) to (V-5), $R_{1b}$ to $R_{5b}$ each independently represents a hydrogen atom, an alkyl group, a cycloalkyl group, an alkoxy group, an alkoxycarbonyl group, an alkylsulfonylimino group or an alkenyl group, and two members out of $R_{1b}$ to $R_{5b}$ may combine to form a ring.

The alkyl group of $Ra_1$ to $Re_1$ in formula (Lc) and the alkyl group in the alkyl group, alkoxy group, alkoxycarbonyl group and alkylsulfonylimino group of $R_{1b}$ to $R_{5b}$ in formulae (V-1) to (V-5) include a linear or branched alkyl group and may have a substituent. Preferred examples of the substituent which the alkyl group may have include a hydroxyl group, a halogen atom, a carboxyl group, an alkoxy group, an acyl group, a cyano group, an acyloxy group and a cycloalkyl group.

Examples of the repeating unit containing a group having a lactone structure represented by formula (Lc) or by any one of formulae (V-1) to (V-5) include a repeating unit represented by the following formula (AI):

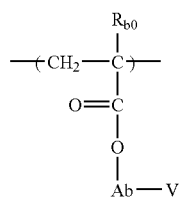

(AI)

In formula (AI), $R_{b0}$ represents a hydrogen atom, a halogen atom or an alkyl group having a carbon number of 1 to 4. Preferred examples of the substituent which the alkyl group of $R_{b0}$ may have include those described above as preferred examples of the substituent which the alkyl group of $R_{1b}$ in formulae (V-1) to (V-5) may have.

Examples of the halogen atom of $R_{b0}$ include a fluorine atom, a chlorine atom, a bromine atom and an iodine atom. $R_{b0}$ is preferably a hydrogen atom.

Ab represents a single bond, an ether group, an ester group, a carbonyl group, an alkylene group or a divalent group comprising a combination thereof V represents a group represented by formula (Lc) or by any one of formulae (V-1) to (V-5).

Specific examples of the repeating unit containing a group having a lactone structure are set forth below, but the present invention is not limited thereto.

(In the following formulae, Rx is H, $CH_3$ or $CF_3$.)

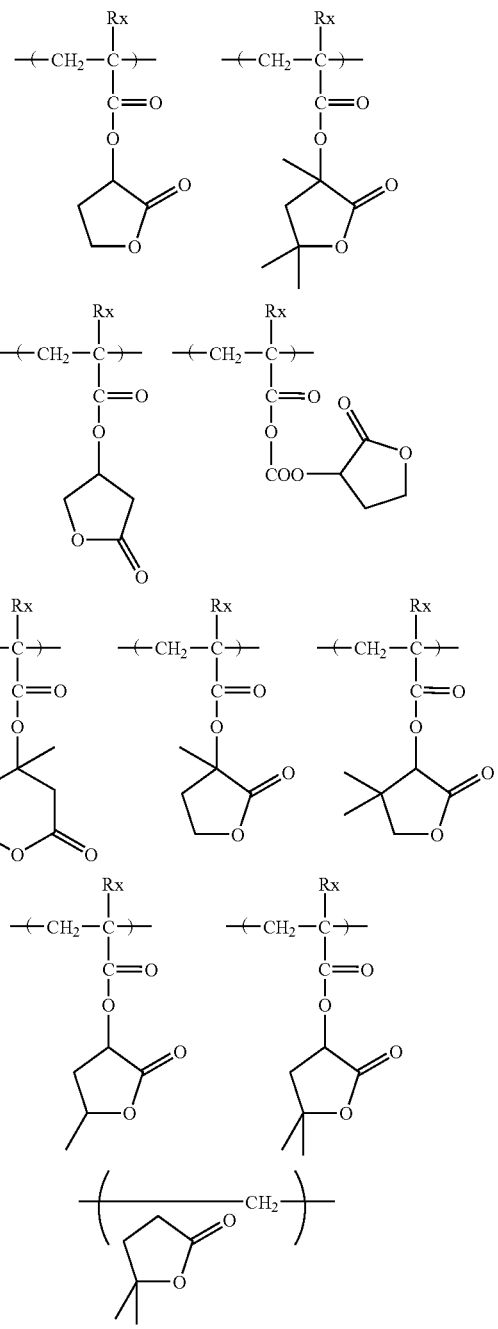

-continued
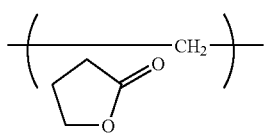
(In the following formulae, Rx is H, CH₃ or CF₃.)
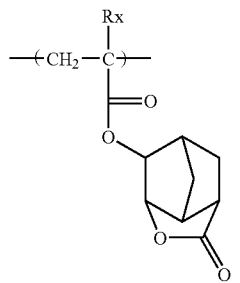 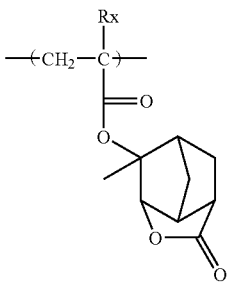
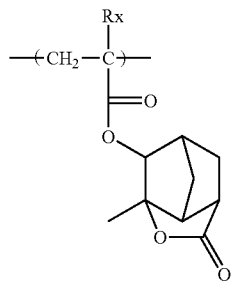 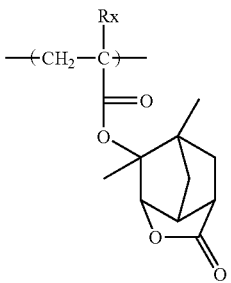
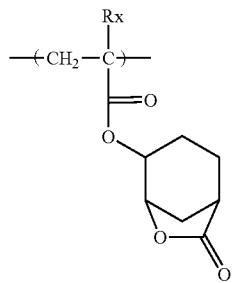 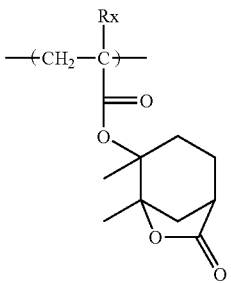
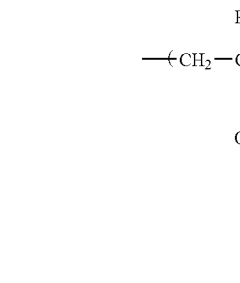
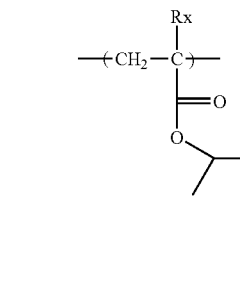
-continued
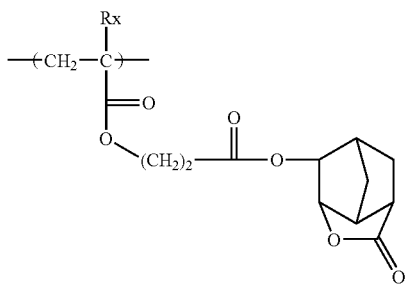
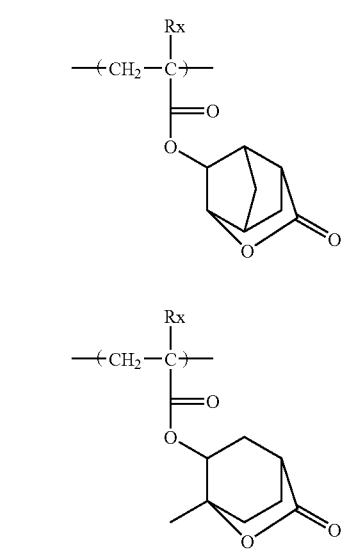
(In the following formulae, Rx is H, CH₃ or CF₃.)
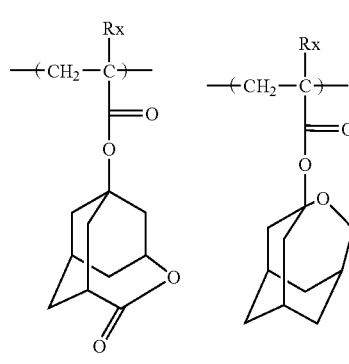
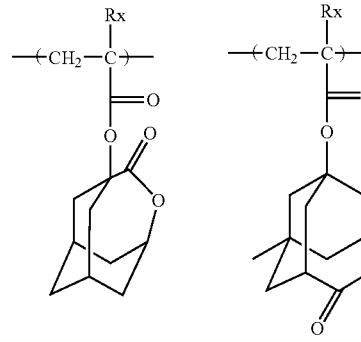

-continued

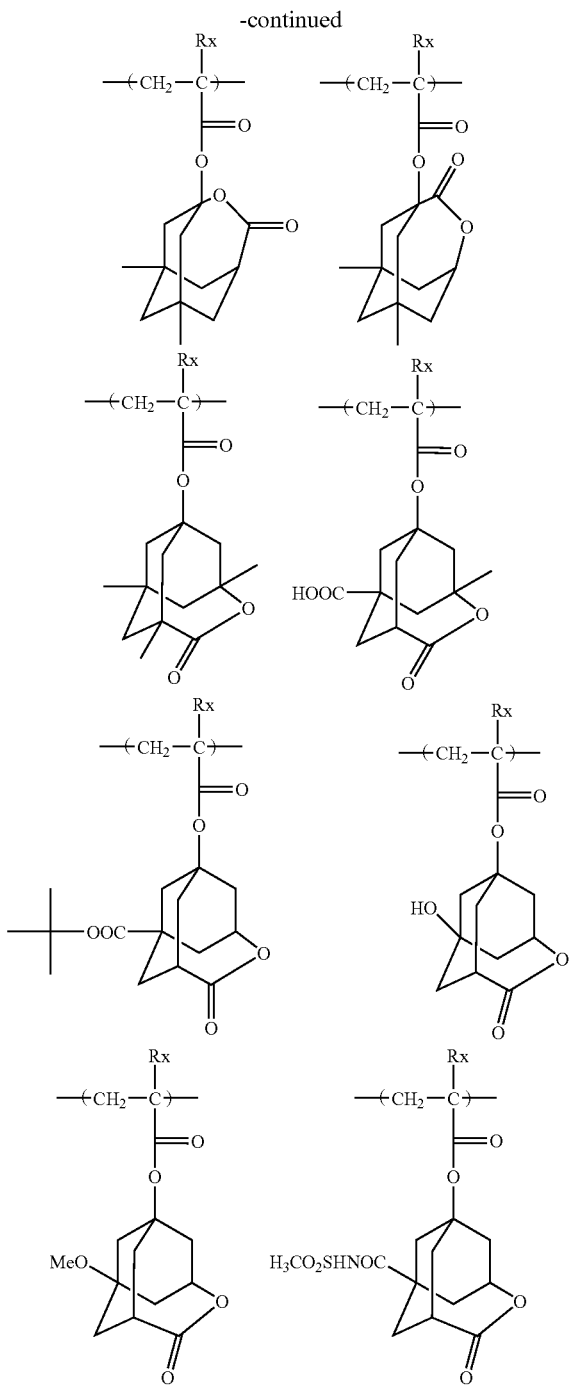

The acid-decomposable resin may also contain a repeating unit represented by the following formula (VIII):

$$\text{—CH—CH—} \atop {O=C \quad C=O \atop \diagdown Z_2 \diagup}$$ (VIII)

wherein $Z_2$ represents —O— or —N($R_{41}$)—, $R_{41}$ represents a hydrogen atom, a hydroxyl group, an alkyl group or —OSO$_2$—$R_{42}$, and $R_{42}$ represents an alkyl group, a cycloalkyl group or a camphor residue. The alkyl group of $R_{41}$ and $R_{42}$ may be substituted by a halogen atom (preferably a fluorine atom) or the like.

Specific examples of the repeating unit represented by formula (VIII) are set forth below, but the present invention is not limited thereto.

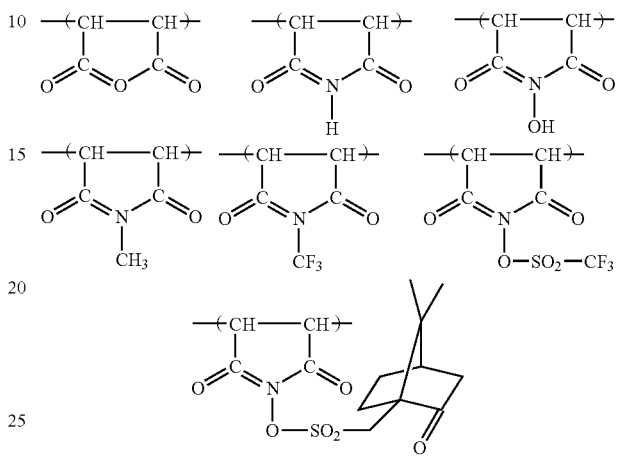

The alicyclic hydrocarbon-based acid-decomposable resin for use in the present invention preferably contains a repeating unit having an alkali-soluble group, more preferably a repeating unit having a carboxyl group. By containing such a group, the resolution in usage for the formation of contact holes is enhanced. As for the repeating unit containing a carboxyl group, a repeating unit containing a carboxyl group directly bonded to the main chain of the resin, such as repeating unit by an acrylic or methacrylic acid, and a repeating unit containing a carboxyl group bonded to the main chain of the resin through a linking group, are both preferred. The linking group may have a monocyclic or polycyclic hydrocarbon structure. An acrylic acid and a methacrylic acid are most preferred.

The alicyclic hydrocarbon-based acid-decomposable resin for use in the present invention may contain, in addition to the above-described repeating units, various repeating structural units for the purpose of controlling the dry etching resistance, suitability for standard developer, adhesion to substrate, resist profile and properties generally required of the resist, such as resolving power, heat resistance and sensitivity.

Examples of such a repeating structural unit include the repeating structural units corresponding to the monomers described below, but the present invention is not limited thereto.

By containing such a repeating structural unit, the performance required of the alicyclic hydrocarbon-based acid-decomposable resin, particularly, (1) solubility in the coating solvent, (2) film-forming property (glass transition point), (3) alkali developability, (4) film loss (selection of hydrophilic, hydrophobic or alkali-soluble group), (5) adhesion of unexposed part to substrate, (6) dry etching resistance and the like can be subtly controlled.

Examples of the monomer include a compound having one addition-polymerizable unsaturated bond, selected from acrylic acid esters, methacrylic acid esters, acrylamides, methacrylamides, allyl compounds, vinyl ethers and vinyl esters.

Other than these, an addition-polymerizable unsaturated compound copolymerizable with the monomer corresponding to the above-described various repeating structural units may be copolymerized.

In the alicyclic hydrocarbon-based acid-decomposable resin, the molar ratio of respective repeating structural units contained is appropriately determined to control the dry etching resistance of resist, suitability for standard developer, adhesion to substrate, resist profile and performances generally required of the resist, such as resolving power, heat resistance and sensitivity.

The embodiment of the alicyclic hydrocarbon-based acid-decomposable resin for use in the present invention includes the followings:

(1) a resin containing a repeating unit having an alicyclic hydrocarbon-containing partial structure represented by any one of formulae (pI) to (pVI) (side chain type), and (2) a resin containing a repeating unit having an alicyclic structure such as norbornene in the main chain, and also containing a maleic anhydride derivative and a (meth)acrylate structure (hybrid type).

In the acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the acid-decomposable resin, the content of the repeating unit having an alicyclic hydrocarbon-containing partial structure represented by any one of formulae (pI) to (pVI) is preferably from 30 to 70 mol %, more preferably from 35 to 65 mol %, still more preferably from 40 to 60 mol %, based on all repeating structural units.

In the acid-decomposable resin, the content of the repeating unit containing hydroxyadamantane is preferably 50 mol % or less, more preferably from 5 to 40 mol %, based on all repeating structural units.

When the composition of the present invention is used for exposure with ArF, the resin preferably has no aromatic group in view of the transparency to ArF light.

The alicyclic hydrocarbon-based acid-decomposable resin for use in the present invention can be synthesized by an ordinary method (for example, radical polymerization). In the general synthesis method, for example, monomer species are charged into a reactor all at once or on the way of reaction and dissolved, if desired, in a reaction solvent such as tetrahydrofuran, 1,4-dioxane, ethers (e.g., diisopropyl ether), ketones (e.g., methyl ethyl ketone, methyl isobutyl ketone) and ester (e.g., ethyl acetate), or in a solvent capable of dissolving the composition of the present invention, which is described later, such as propylene glycol monomethyl ether acetate. The obtained uniform solution is, if desired, heated in an inert gas atmosphere such as nitrogen or argon, and the polymerization is started by using a commercially available radical initiator (e.g., azo-based initiator, peroxide). If desired, the initiator is added additionally or in parts. After the completion of reaction, the reactant is charged into a solvent and the desired polymer is recovered by a powder or solid recovery method or the like. The reaction concentration is 20 mass % (weight %) or more, preferably 30 mass % or more, more preferably 40 mass % or more, and the reaction temperature is from 10 to 150° C., preferably from 30 to 120° C., more preferably from 50 to 100° C.

The weight average molecular weight of the resin as the component (A) for use in the present invention is preferably from 1,000 to 200,000 in terms of polystyrene by the GPC method. With a weight average molecular weight of 1,000 or more, the heat resistance and dry etching resistance can be enhanced and with a weight average molecular weight of 200,000 or less, the developability and by virtue of extreme decrease in the viscosity, the film-forming property can be enhanced.

In the positive resist composition of the present invention, the blending amount of the component (A) for use in the present invention is preferably from 40 to 99.99 mass %, more preferably from 50 to 99.97 mass %, based on the entire composition.

[2] Compound Capable of Generating an Organic Acid Represented by Formula (2), (3), (3'), (4) or (5) Upon Irradiation of Actinic Rays or Radiation (Photoacid Generator)

The compound (B) capable of generating a specific organic acid upon irradiation of actinic rays or radiation, which is contained in the resist composition of the present invention, is described below.

(B1) Compound Capable of Generating a Sulfonic Acid Represented by Formula (2) upon irradiation of actinic rays or radiation

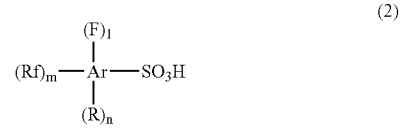

wherein

Rf represents an organic group having a fluorine atom,

R represents a hydroxyl group or an organic group,

Ar represents an aromatic group, l represents an integer of 1 to 6, m represents an integer of 0 to 4, and n represents an integer of 0 to 4, provided that m+n represents an integer of 1 or more.

In formula (2), examples of the organic group of R include an alkyl group, a cycloalkyl group, an alkoxy group, an aryloxy group, an aralkyloxy group, a cycloalkoxy group, an alkoxycarbonyl group, an aryloxycarbonyl group, an acyloxy group, an alkylthio group, an arylthio group, an acyl group, an acylamino group, an alkenyloxy group, an arylcarbonyloxy group, an alkylcarbonyloxy group, an alkylaminocarbonyl group, an alkylcarbonylamino group, an alkylsilyloxy group and a cyano group. A plurality of these organic groups may be connected through a single bond, an ether bond, an ester bond, an amide bond, a sulfide bond, a urea bond or the like. The organic group of R preferably has a carbon number of 2 to 30, more preferably from 4 to 30, still more preferably from 6 to 30, yet still more preferably from 8 to 24.

The alkyl group in the organic group of R is preferably a linear or branched alkyl group having a carbon number of 1 to 30, and examples thereof include a methyl group, an ethyl group, a propyl group, an isopropyl group, an n-butyl group, a sec-butyl group, a tert-butyl group, a hexyl group, a heptyl group, an octyl group, a nonyl group, a decyl group, an undecyl group and a dodecyl group. The alkyl group may have a substituent. Preferred examples of the substituent for the alkyl group include an alkoxy group, a cycloalkyl group, an acyl group, an acyloxy group, a chlorine atom, a bromine atom, an iodine atom, a hydroxyl group and a carboxyl group.

The cycloalkyl group in the organic group of R is preferably a monocyclic or polycyclic cycloalkyl group having a carbon number of 3 to 30, and examples thereof include a cyclopropyl group, a cyclobutyl group, a cyclopentyl group, a cyclohexyl group, a norbornyl group and an adamantyl group. The cycloalkyl group may have a substituent. Preferred examples of the substituent for the cycloalkyl group include an alkyl group, an alkoxy group, an acyl group, an acyloxy group, a chlorine atom, a bromine atom, an iodine atom, a hydroxyl group and a carboxyl group.

The alkoxy group in the organic group of R is preferably a linear or branched alkoxy group having a carbon number of 1 to 30, and examples thereof include a methoxy group, an ethoxy group, a propoxy group, an isopropoxy group, an n-butoxy group, an isobutoxy group, a sec-butoxy group, a tert-butoxy group, a hexyloxy group, a heptyloxy group, an octyloxy group, a nonyloxy group, a decyloxy group, an undecyloxy group and a dodecyloxy group. The alkoxy group may have a substituent. Preferred examples of the substituent for the alkoxy group include an alkoxy group, an aryl group, an acyl group, an acyloxy group, a chlorine atom, a bromine atom, an iodine atom, a cycloalkyl group, a cycloalkoxy group, a siloxane group, a hydroxyl group and a carboxyl group.

The aryloxy group in the organic group of R is preferably an aryloxy group having a carbon number of 6 to 20, and examples thereof include a phenoxy group. The aryloxy group may have a substituent. Preferred examples of the substituent for the aryloxy group include an alkyl group, a cycloalkyl group, an alkoxy group, an acyl group, a formyl group, a nitro group, an acylamino group, a sulfonylamino group, a chlorine atom, a bromine atom, an iodine atom, an alkoxycarbonyl group, a cyano group, a hydroxyl group and a carboxyl group.

The aralkyloxy group is preferably an aralkyloxy group having a carbon number of 6 to 20, and examples thereof include an aralkyloxy group such as benzyloxy group and phenethyloxy group. The aralkyloxy group may have a substituent. Preferred examples of the substituent for the aralkyloxy group include an alkyl group, a cycloalkyl group, an alkoxy group, an acyl group, a formyl group, a nitro group, an acylamino group, a sulfonylamino group, a chlorine atom, a bromine atom, an iodine atom, an alkoxycarbonyl group, a cyano group, a hydroxyl group and a carboxyl group.

The cycloalkoxy group in the organic group of R is preferably a monocyclic or polycyclic cycloalkoxy group having a carbon number of 3 to 30, and examples thereof include a cyclopropoxy group, a cyclobutoxy group, a cyclopentyloxy group, a cyclohexyloxy group, a norbonyloxy group, a menthyloxy group and an adamantyloxy group. The cycloalkoxy group may have a substituent. Preferred examples of the substituent for the cycloalkoxy group include an alkyl group, an alkoxy group, an acyl group, an acyloxy group, a chlorine atom, a bromine atom, an iodine atom, a hydroxyl group and a carboxyl group.

The alkoxycarbonyl group in the organic group of R is preferably an alkoxycarbonyl group having a carbon number of 1 to 30, and examples thereof include a methoxycarbonyl group, an ethoxycarbonyl group, a butoxycarbonyl group, an octyloxycarbonyl group and a dodecyloxycarbonyl group. The alkoxycarbonyl group may have a substituent. Preferred examples of the substituent for the alkoxycarbonyl group include an alkoxy group, an acyl group, an acyloxy group, a cycloalkyl group, a chlorine atom, a bromine atom, an iodine atom, a hydroxyl group and a carboxyl group.

The aryloxycarbonyl group in the organic group of R is preferably an aryloxycarbonyl group having a carbon number of 6 to 20, and examples thereof include a phenoxycarbonyl group. The aryloxycarbonyl group may have a substituent. Preferred examples of the substituent for the aryloxycarbonyl group include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The acyloxy group in the organic group of R is preferably an acyloxy group having a carbon number of 1 to 30, and examples thereof include an acetoxy group, a methyl-butynoyloxy group, a methyl-decynoyloxy group, a propionyloxy group, a butyryloxy group, a valeryloxy group, a palmitoyloxy group and a benzoyloxy group. The acyloxy group may have a substituent. Preferred examples of the substituent for the acyloxy group include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The alkylthio group in the organic group of R is preferably an alkylthio group having a carbon number of 1 to 30, and examples thereof include a methylthio group, an ethylthio group, a propylthio group, an isopropylthio group, an n-butylthio group, a sec-butylthio group, a tert-butylthio group, a hexylthio group, a heptylthio group, an octylthio group, a nonylthio group, a decylthio group, an undecylthio group and a dodecylthio group. The alkylthio group may have a substituent. Preferred examples of the substituent for the alkylthio group include an alkoxy group, an acyl group, an acyloxy group, a cycloalkyl group, a chlorine atom, a bromine atom, an iodine atom, a hydroxyl group and a carboxyl group.

The arylthio group in the organic group of R is preferably an arylthio group having a carbon number of 6 to 20, and examples thereof include a phenylthio group. The arylthio group may have a substituent. Preferred examples of the substituent for the arylthio group include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The acyl group in the organic group of R is preferably an acyl group having a carbon number of 1 to 30, and examples thereof include an acetyl group, a propionyl group, a pivaloyl group, a butyryl group, a valeryl group, a palmitoyl group and a benzoyl group. The acyl group may have a substituent. Preferred examples of the substituent for the acyl group include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The acylamino group in the organic group of R is preferably an acylamino group having a carbon number of 1 to 30, and examples thereof include an acetylamino group, a propionylamino group, a pivaloylamino group, a butyrylamino group and a benzoylamino group. The acylamino group may have a substituent. Preferred examples of the substituent for the acylamino group include an alkyl group, a cycloalkyl group, an alkoxy group, an acyl group, a formyl group, a nitro group, an acylamino group, a sulfonylamino group, a chlorine atom, a bromine atom, an iodine atom, a hydroxyl group, a carboxyl group, an alkoxycarbonyl group and a cyano group.

The alkenyloxy group in the organic group of R is preferably an alkenyloxy group having a carbon number of 1 to 30, and examples thereof include a vinyloxy group, a propenyloxy group and a butenyloxy group. The alkenyloxy group may have a substituent. Preferred examples of the substituent for the alkenyloxy group include an alkoxy group, an acyl group, an acyloxy group, a cycloalkyl group, a chlorine atom, a bromine atom, an iodine atom, a hydroxyl group and a carboxyl group.

The arylcarbonyloxy group in the organic group of R is preferably an arylcarbonyloxy group having a carbon number of 6 to 20, and examples thereof include a phenylcarbonyloxy group. The arylcarbonyloxy group may have a substituent. Preferred examples of the substituent for the arylcarbonyloxy group include an alkyl group, a cycloalkyl group, an alkoxy group, an acyl group, a formyl group, a nitro group, an acylamino group, a sulfonylamino group, an alkoxycarbonyl group, a cyano group, a chlorine atom, a bromine atom, an iodine atom, a hydroxyl group and a carboxyl group.

The alkylcarbonyloxy group in the organic group of R is preferably an alkylcarbonyloxy group having a carbon number of 1 to 30, and examples thereof include a methylcarbonyloxy group, an ethylcarbonyloxy group, a propylcarbonyloxy group and a butylcarbonyloxy group. The alkylcarbonyloxy group may have a substituent. Preferred examples of the substituent for the alkylcarbonyloxy group include an alkoxy group, an acyl group, an acyloxy group, a cycloalkyl group, a chlorine atom, a bromine atom, an iodine atom, a hydroxyl group and a carboxyl group.

The alkylaminocarbonyl group in the organic group of R is preferably an alkylaminocarbonyl group having a carbon number of 1 to 30, and examples thereof include a methylaminocarbonyl group, an ethylaminocarbonyl group, a propylaminocarbonyl group and a butylaminocarbonyl group. The alkylaminocarbonyl group may have a substituent. Preferred examples of the substituent for the alkylaminocarbonyl group include an alkoxy group, an acyl group, an acyloxy group, a cycloalkyl group, a chlorine atom, a bromine atom, an iodine atom, a hydroxyl group and a carboxyl group.

The alkylcarbonylamino group in the organic group of R is preferably an alkylcarbonylamino group having a carbon number of 1 to 30, and examples thereof include a methylcarbonylamino group, an ethylcarbonylamino group, a propylcarbonylamino group and a butylcarbonylamino group. The alkylcarbonylamino group may have a substituent. Preferred examples of the substituent for the alkylcarbonylamino group include an alkoxy group, an acyl group, an acyloxy group, a cycloalkyl group, a chlorine atom, a bromine atom, an iodine atom, a hydroxyl group and a carboxyl group.

The alkylsilyloxy group in the organic group of R is preferably an alkylsilyloxy group having a carbon number of 1 to 30, and examples thereof include a trimethylsilyloxy group and a tert-butyldimethylsilyloxy group. The alkylsilyloxy group may have a substituent. Preferred examples of the substituent for the alkylsilyloxy group include an alkoxy group, an acyl group, an acyloxy group, a cycloalkyl group, a chlorine atom, a bromine atom, an iodine atom, a hydroxyl group and a carboxyl group.

The alkyl or cycloalkyl group in these alkyl group, cycloalkyl group, alkoxy group, aralkyloxy group, cycloalkoxy group, alkoxycarbonyl group, an acyloxy group, alkylthio group, acyl group and acylamino group may have one linking group or a plurality of linking groups, such as oxygen atom, sulfur atom and ester group, in the alkyl or cycloalkyl chain.

R is preferably an alkyl group, a cycloalkyl group, an alkoxy group, an aralkyloxy group, a cycloalkoxy group, an alkylthio group or an arylthio group, more preferably an alkoxy group, an aralkyloxy group, a cycloalkoxy group, an alkylthio group or an arylthio group, still more preferably an alkoxy group, an aralkyloxy group, a cycloalkoxy group, an alkylthio group or an arylthio group, yet still more preferably an alkylthio group or an arylthio group. In the case where R is an alkylthio group or an arylthio group, a high-sensitivity resist composition excellent in the PEB temperature dependency as well as in the profile can be obtained.

When n is an integer of 2 or more, a plurality of R's may be the same or different.

Examples of the organic group having a fluorine atom of Rf include those where the hydrogen atom in the organic group of R is partially or entirely substituted by a fluorine atom. When m is an integer of 2 or more, a plurality of Rf's may be the same or different.

The sum of carbon numbers of Rf and R is preferably from 4 to 34, more preferably from 6 to 30, still more preferably from 8 to 24. By adjusting the carbon numbers of Rf and R, the diffusibility of an acid can be controlled and the resolving power can be enhanced.

The aromatic group of Ar is preferably an aromatic group having a carbon number of 6 to 20, and examples thereof include a phenyl group and a naphthyl group. The aromatic group may have a substituent. Preferred examples of the substituent for the aromatic group include a nitro group, a sulfonylamino group, a chlorine atom, a bromine atom, an iodine atom and a carboxyl group.

m is preferably an integer of 0 to 3, more preferably from 0 to 2, still more preferably 0 or 1.

n is preferably an integer of 0 to 3, more preferably from 0 to 2, still more preferably 0 or 1.

l is preferably an integer of 2 to 5, more preferably 3 or 4, still more preferably 4.

m+n is preferably an integer of 1 to 3, more preferably 1 or 2, still more preferably 1.

The sulfonic acid represented by formula (2) and a salt thereof are novel compounds.

Examples of the sulfonate include a metal sulfonate and an onium sulfonate.

Examples of the metal in the metal sulfonate include $Na^+$, $Li^+$, $K^+$, $Cs^+$, $Ca^{2+}$ and $Ba^{2+}$.

Examples of the onium cation in the onium sulfonate include ammonium cation.

The sulfonic acid represented by formula (2) is preferably represented by the following formula (Ia), more preferably by formula (Ib), still more preferably by formula (Ic). In the formulae, R, Rf, l, m and n have the same meanings as in formula (2).

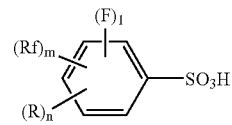
(Ia)

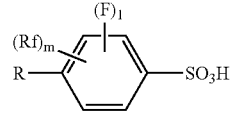
(Ib)

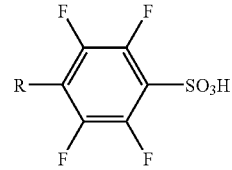
(Ic)

Specific preferred examples of the sulfonic acid represented by formula (2) are set forth below, but the present invention is not limited thereto.

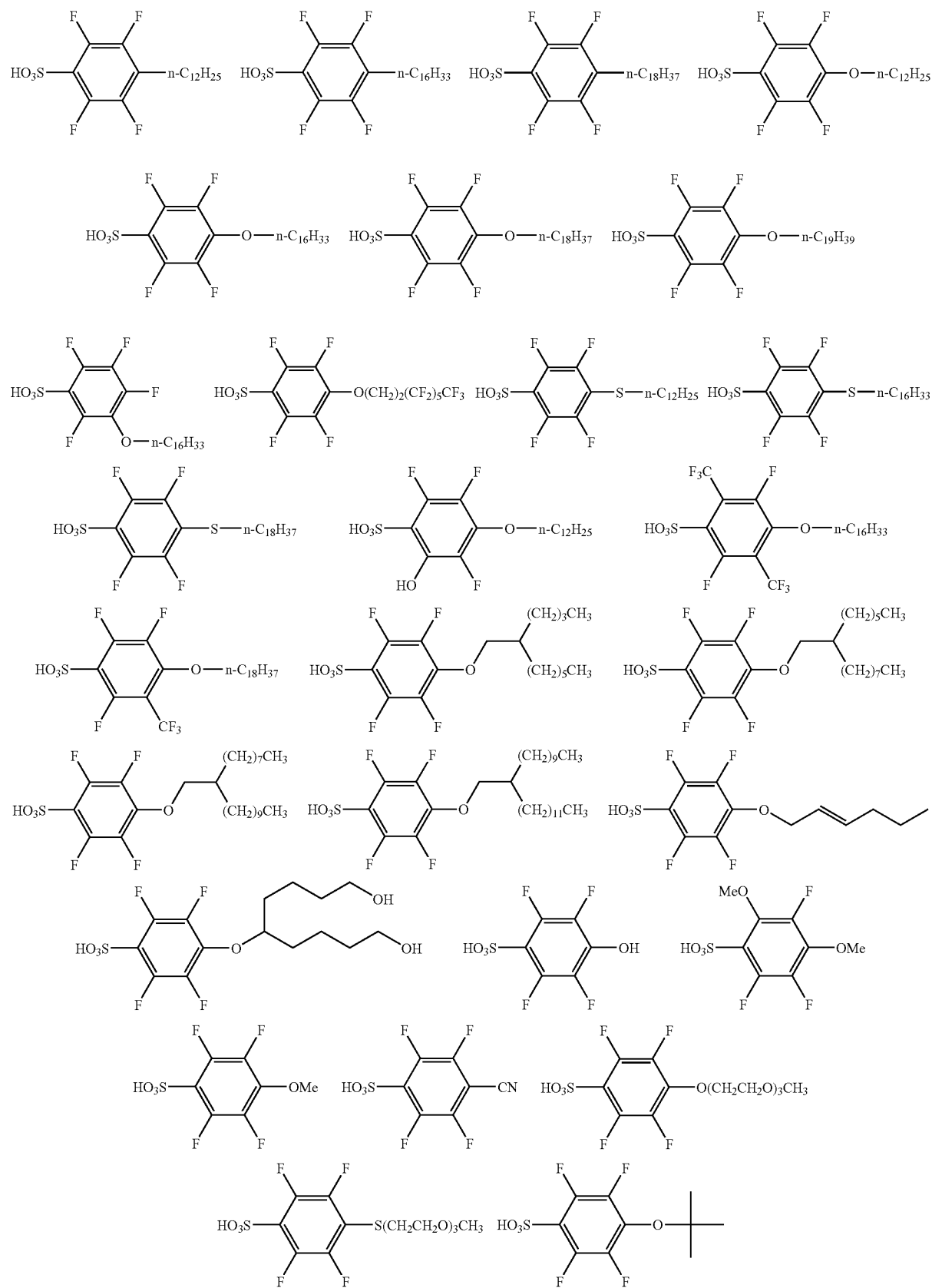

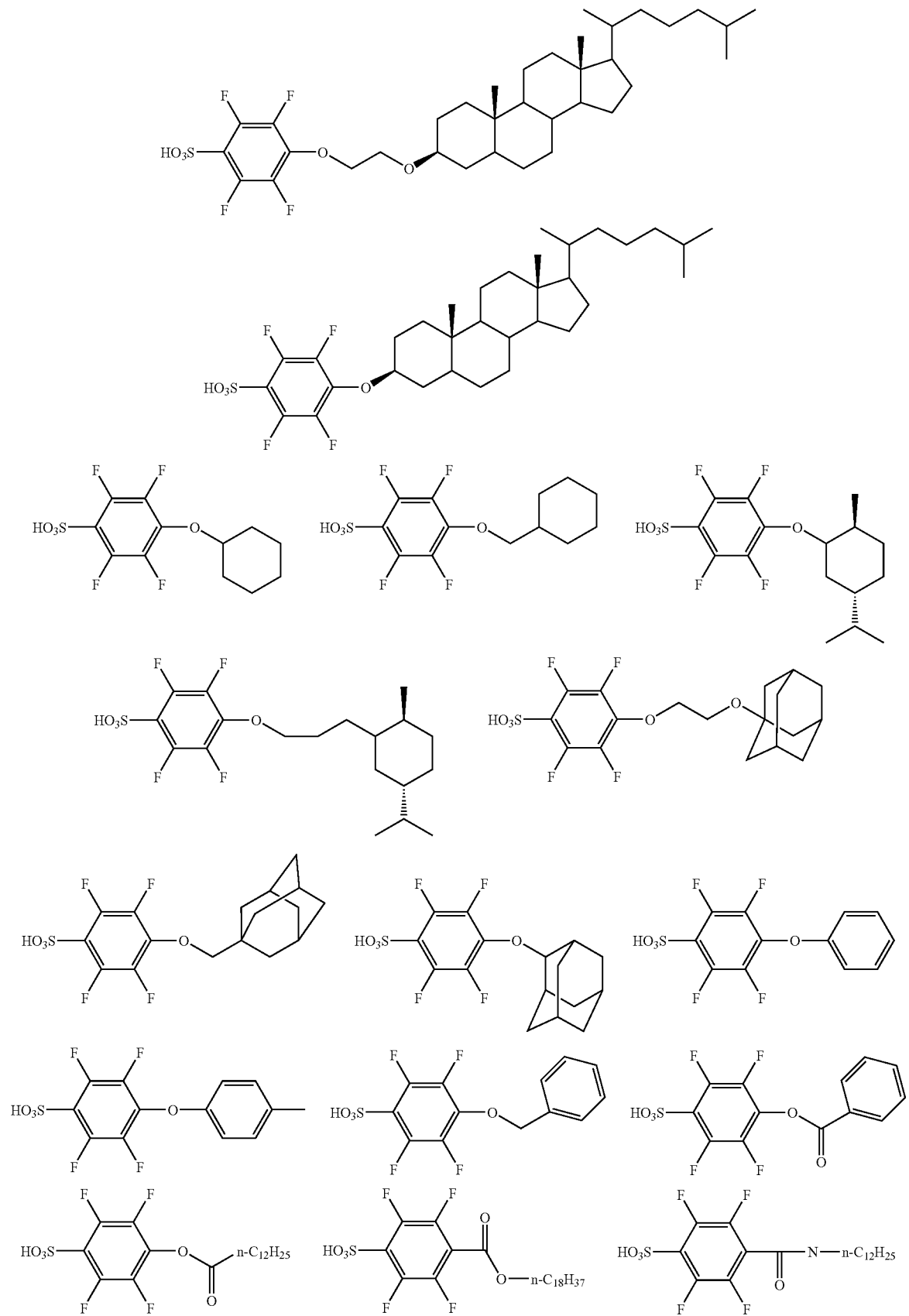

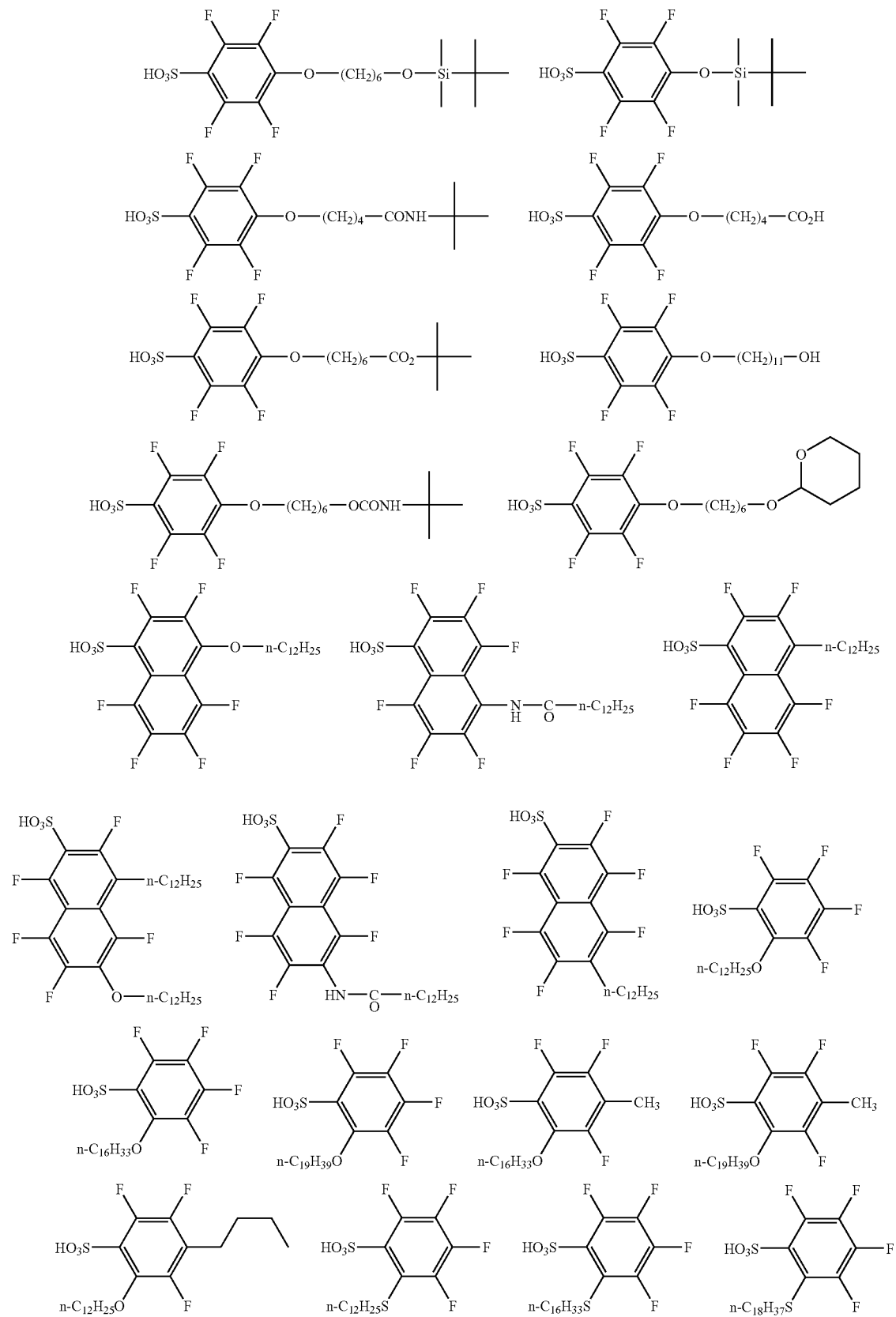

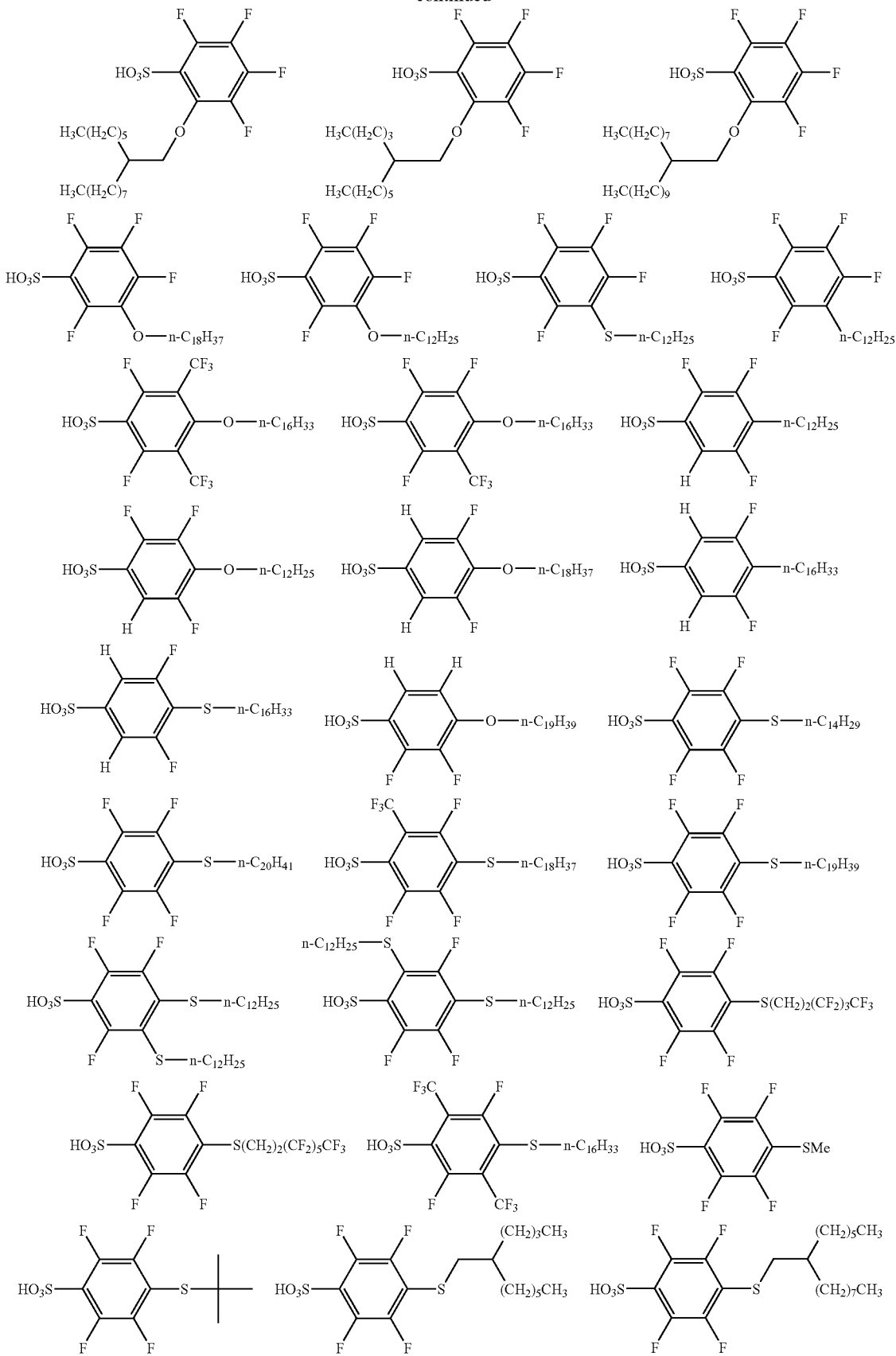

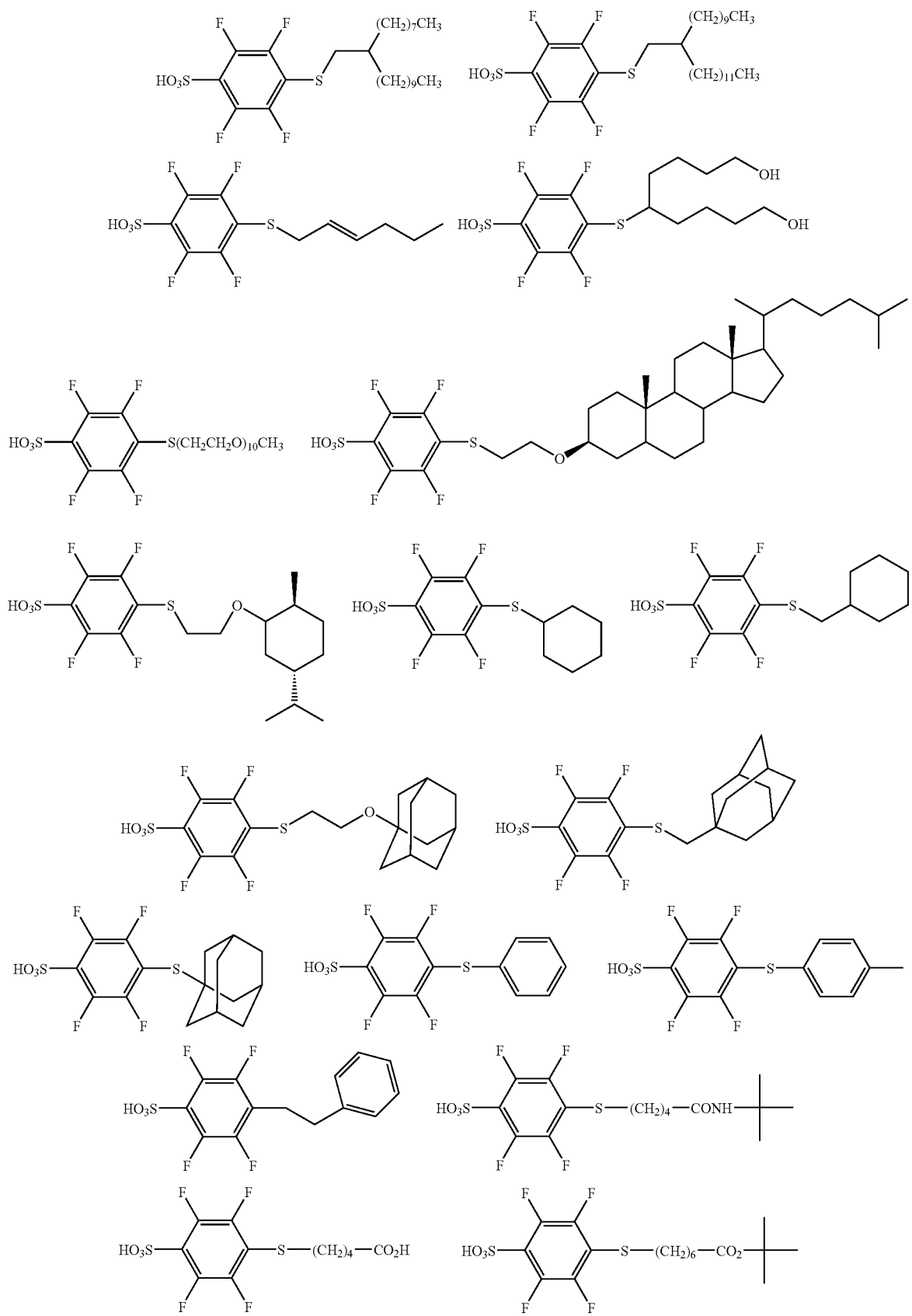

-continued

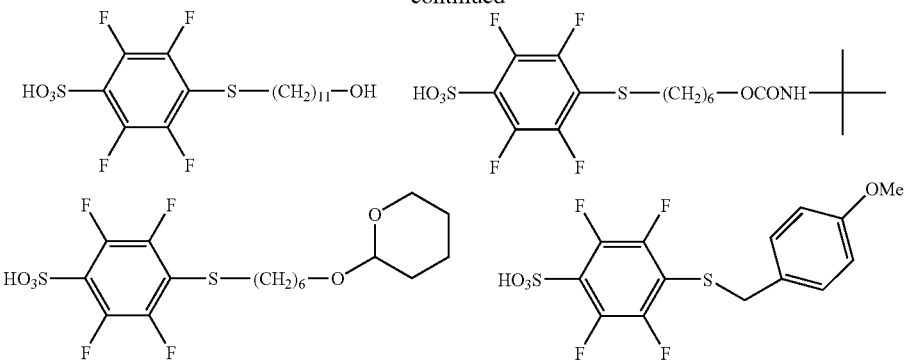

The compound capable of generating a sulfonic acid represented by formula (2) upon irradiation of actinic rays or radiation is preferably a sulfonium salt compound of the sulfonic acid represented by formula (2) or an iodonium salt compound of the sulfonic acid represented by formula (2), more preferably a compound represented by any one of the following formulae (A1) to (A5):

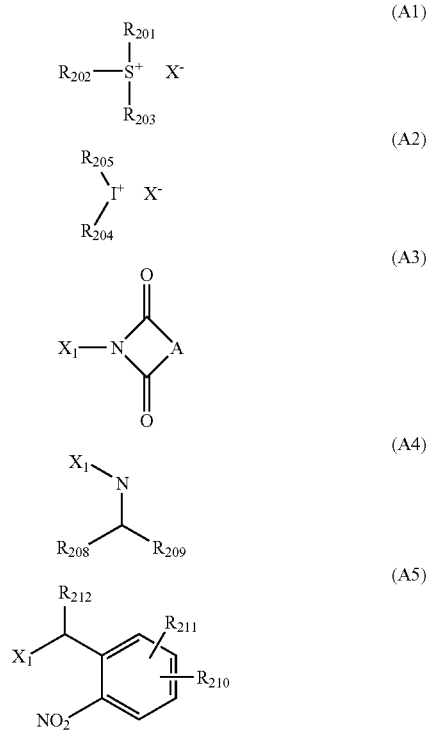

In formula (A1), $R_{201}$, $R_{202}$ and $R_{203}$ each independently represents an organic group.

Specific examples of the organic group as $R_{201}$, $R_{202}$ and $R_{203}$ include the corresponding groups in the compounds (A1a), (A1b) and (A1c) described later.

The compound may have a plurality of structures represented by formula (A1). For example, the compound may be a compound having a structure that at least one of $R_{201}$ to $R_{203}$ in the compound represented by formula (A1) is bonded to at least one of $R_{201}$ to $R_{203}$ in anot X⁻ represents a sulfonate anion resulting from removal of the hydrogen atom of —SO$_3$H in a sulfonic acid.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

her compound represented by formula (A1).

The component (A1) is more preferably a compound (A1a), (A1b) or (A1c) described below.

The compound (A1a) is an arylsulfonium compound where at least one of $R_{201}$ to $R_{203}$ in formula (A1) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound and an aryldialkylsulfonium compound.

The aryl group in the arylsulfonium compound is preferably a phenyl group or a naphthyl group, more preferably a phenyl group. In the case where the arylsulfonium compound has two or more aryl groups, these two or more aryl groups may be the same of different.

The alkyl group which is present, if desired, in the arylsulfonium compound is preferably a linear or branched alkyl group having a carbon number of 1 to 15, such as methyl group, ethyl group, propyl group, n-butyl group, sec-butyl group and tert-butyl group. Also, the cycloalkyl group is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12 or a linear, branched or cyclic alkoxy group having a carbon number of 1 to 12, and most preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (A1b) is described below.

The compound (A1b) is a compound when $R_{201}$ to $R_{203}$ in formula (A1) each represents an organic group not containing an aromatic ring. The aromatic ring as used herein includes an aromatic ring containing a heteroatom.

The organic group as $R_{201}$ to $R_{203}$ not containing an aromatic ring has a carbon number of generally from 1 to 30, preferably from 1 to 20.

$R_{201}$ to $R_{203}$ each independently represents preferably an alkyl group, a cycloalkyl group, a linear, branched or cyclic oxoalkyl group which may have a double bond in the chain, an alkoxycarbonylmethyl group, an allyl group or a vinyl group, more preferably a linear, branched or cyclic 2-oxoalkyl group, and most preferably a linear or branched 2-oxoalkyl group.

The alkyl group as $R_{201}$ to $R_{203}$ may be either linear or branched and is preferably a linear or branched alkyl group having a carbon number of 1 to 20 (e.g., methyl, ethyl, propyl, butyl).

The cycloalkyl group as $R_{201}$ to $R_{203}$ is preferably a cycloalkyl group having a carbon number of 3 to 10, and examples thereof include a cyclopentyl group, a cyclohexyl group and a norbornyl group.

The 2-oxoalkyl group as $R_{201}$ to $R_{203}$ may be linear, branched or cyclic and is preferably a group having >C=O at the 2-position of the above-described alkyl group.

Preferred examples of the alkoxy group in the alkoxycarbonylmethyl group as $R_{201}$ to $R_{203}$ include an alkyl group having a carbon number of 1 to 5 (e.g., methyl, ethyl, propyl, butyl, pentyl).

$R_{201}$ to $R_{203}$ each may be further substituted by a halogen atom, an alkoxy group (for example, an alkoxy group having a carbon number of 1 to 5), a hydroxyl group, a cyano group or a nitro group.

Two members out of $R_{201}$ to $R_{203}$ may combine to form a ring structure and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

The compound (A1c) is a compound represented by the following formula (A1c), and this is a compound having an arylacylsulfonium salt structure.

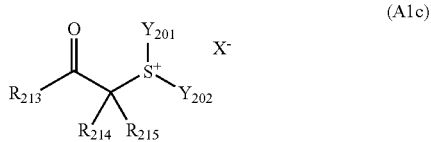

(A1c)

In formula (A1c), $R_{213}$ represents an aryl group which may be substituted, and is preferably a phenyl group or a naphthyl group.

Preferred examples of the substituent on $R_{213}$ include an alkyl group, a cycloalkyl group, an alkoxy group, an acyl group, a nitro group, a hydroxyl group, an alkoxycarbonyl group and a carboxy group.

$R_{214}$ and $R_{215}$ each represents a hydrogen atom, an alkyl group or a cycloalkyl group.

$Y_{201}$ and $Y_{202}$ each independently represents an alkyl group (particularly, examples of the substituted alkyl group include a 2-oxoalkyl group, an alkoxycarbonylalkyl group and a carboxyalkyl group), a cycloalkyl group, an aryl group or a vinyl group.

Each pair of $R_{213}$ and $R_{214}$, $R_{214}$ and $R_{215}$, and $Y_{201}$ and $Y_{202}$ may combine to form a ring structure, and the ring structure may contain an oxygen atom, a sulfur atom, an ester bond and an amide bond.

The alkyl group as $Y_{201}$ and $Y_{202}$ is preferably a linear or branched alkyl group having a carbon number of 1 to 20.

The cycloalkyl group as $R_{214}$, $R_{215}$, $Y_{201}$ and $Y_{202}$ is preferably a cycloalkyl group having a carbon number of 3 to 20.

The 2-oxoalkyl group includes a group having >C=O at the 2-position of the alkyl group as $Y_{201}$ and $Y_{202}$.

The alkoxycarbonyl group in the alkoxycarbonylalkyl group is preferably an alkoxycarbonyl group having a carbon number of 2 to 20.

Examples of the group formed by combining $Y_{201}$ and $Y_{202}$ include a butylene group and a pentylene group.

$Y_{201}$ and $Y_{202}$ each is preferably an alkyl group having a carbon number of 4 or more, more preferably from 4 to 16, still more preferably from 4 to 12.

At least either one of $R_{214}$ and $R_{215}$ is preferably an alkyl group, and more preferably, $R_{214}$ and $R_{215}$ both are an alkyl group.

In formula (A2), $X^-$ represents a sulfonate anion resulting from removal of the hydrogen atom of —$SO_3H$ in a sulfonic acid.

$R_{204}$ and $R_{205}$ each independently represents an aryl group, an alkyl group or a cycloalkyl group.

The aryl group of $R_{204}$ and $R_{205}$ is preferably a phenyl group or a naphthyl group, more preferably a phenyl group.

The alkyl group as $R_{204}$ and $R_{205}$ may be either linear or branched and is preferably a linear or branched alkyl group having a carbon number of 1 to 10 (e.g., methyl, ethyl, propyl, butyl, pentyl).

The cycloalkyl group as $R_{204}$ and $R_{205}$ is preferably a cycloalkyl group having a carbon number of 3 to 10, and examples thereof include a cyclopentyl group, a cyclohexyl group and a norbornyl group.

Examples of the substituent which each group as $R_{204}$ and $R_{205}$ may have include an alkyl group (for example, an alkyl group having a carbon number of 1 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

In formulae (A3) to (A5), $X_1$ represents a monovalent group resulting from removal of the hydrogen atom of —$SO_3H$ in the sulfonic acid of formula (2).

In formula (A3), A represents an alkylene group, an alkenylene group or an arylene group and preferably has a carbon number of 1 to 6.

In formula (A4), $R_{208}$ represents an alkyl group, a cycloalkyl group or an aryl group.

$R_{209}$ represents an alkyl group (particularly, an oxoalkyl group as the substituted alkyl group), a cycloalkyl group, a cyano group or an alkoxycarbonyl group, preferably a halogen-substituted alkyl group or a cyano group.

The alkyl group and cycloalkyl group as $R_{208}$ and $R_{209}$ are the same as the alkyl group and cycloalkyl group as $R_{204}$ and $R_{205}$.

The aryl group as $R_{208}$ is the same as the aryl group as $R_{204}$ and $R_{205}$.

The alkoxycarbonyl group as $R_{209}$ is preferably an alkoxycarbonyl group having a carbon number of 2 to 11, and examples thereof include a methoxycarbonyl group, an ethoxycarbonyl group, a propoxycarbonyl group and a butoxycarbonyl group.

In formula (A5), $R_{210}$ and $R_{211}$ each represents a hydrogen atom, an alkyl group, a cycloalkyl group, a cyano group, a nitro group or an alkoxycarbonyl group, preferably a halogen-substituted alkyl group, a nitro group or a cyano group.

$R_{212}$ represents a hydrogen atom, an alkyl group, a cycloalkyl group, a cyano group or an alkoxycarbonyl group.

The alkyl group and cycloalkyl group as $R_{210}$ to $R_{212}$ are the same as the alkyl group and cycloalkyl group as $R_{204}$ and $R_{205}$.

The alkoxycarbonyl group as $R_{212}$ is the same as the alkoxycarbonyl group as $R_{209}$.

Among formulae (A1) to (A5), the compound represented by formula (A1) is preferred, and the compounds represented by formulae (A1a) to (A1c) are more preferred.

Specific examples of the compound capable of generating a sulfonic acid represented by formula (2) upon irradiation of actinic rays or radiation are set forth below, but the present invention is not limited thereto.

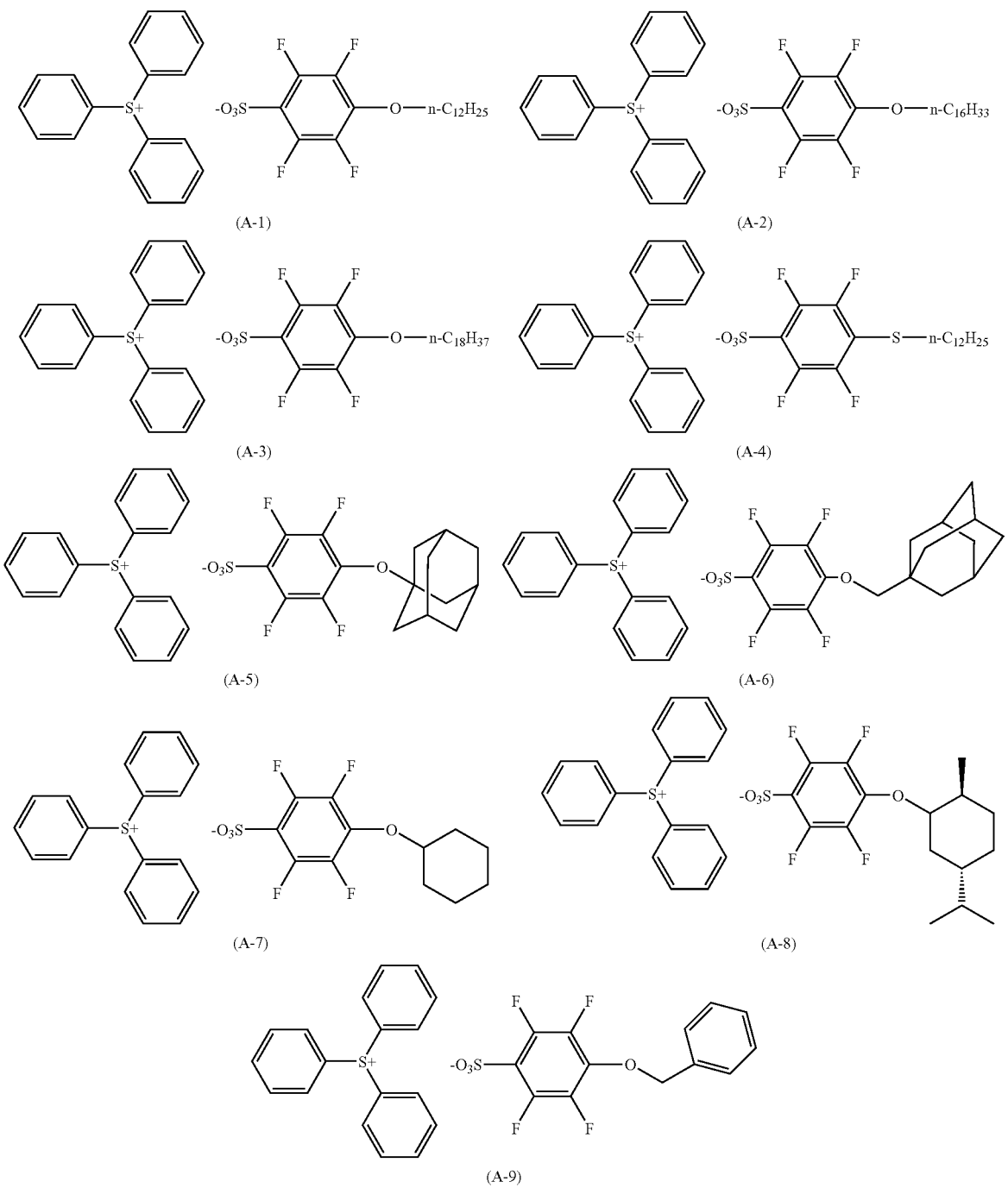

-continued
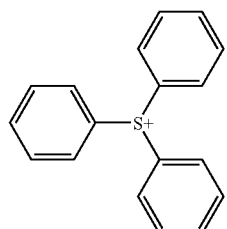
(A-10)
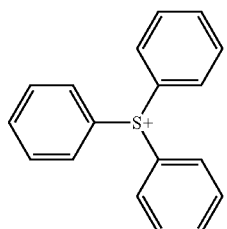
(A-11)
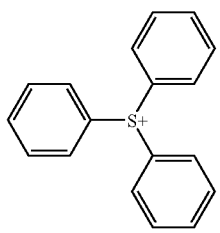
(A-12)
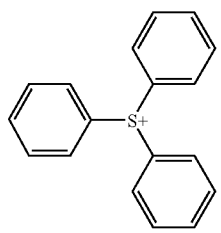
(A-13)
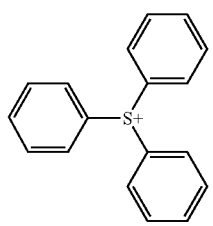
(A-14)
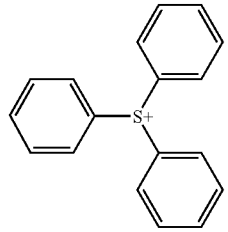
(A-15)
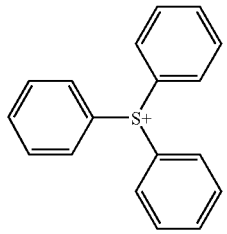
(A-16)
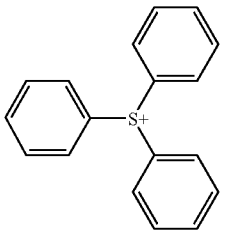
(A-17)
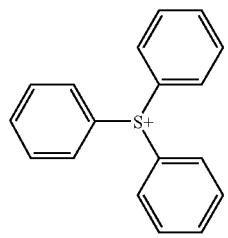
(A-18)
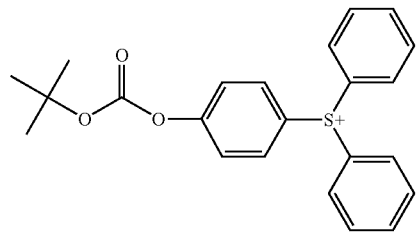
(A-19)

-continued
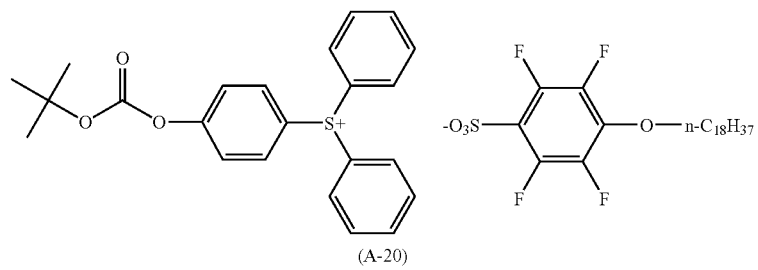
(A-20)
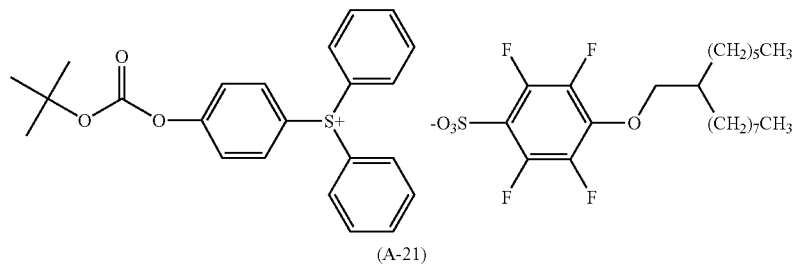
(A-21)
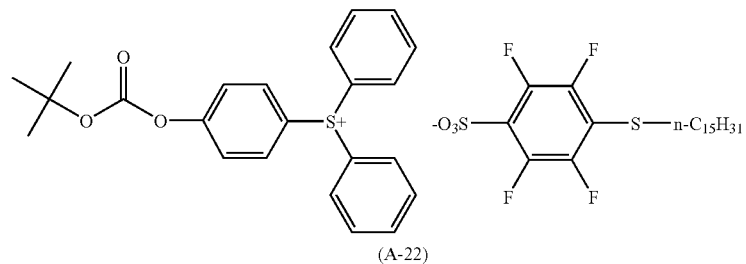
(A-22)
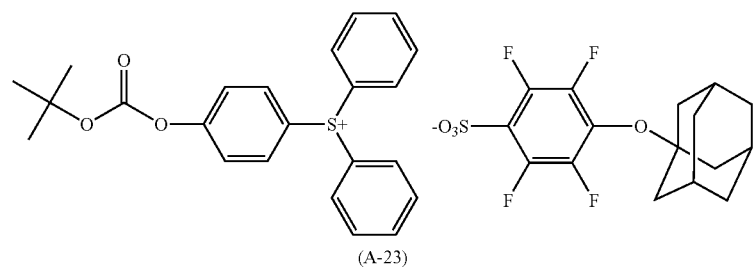
(A-23)
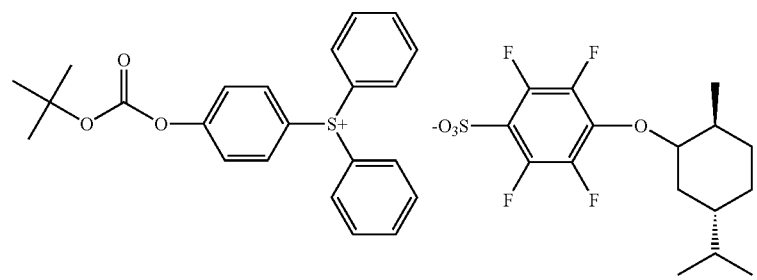
(A-24)
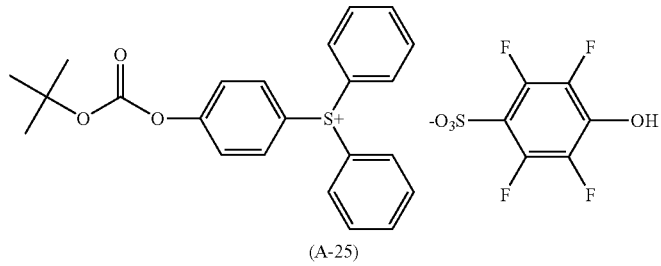
(A-25)

-continued
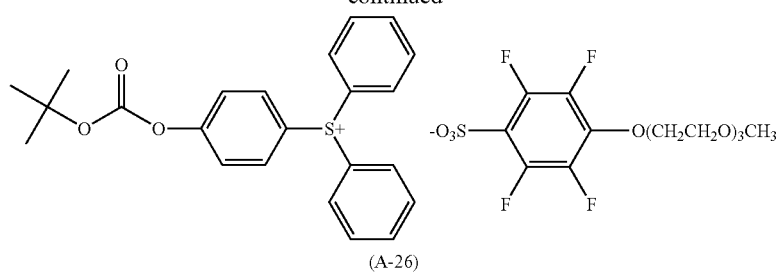
(A-26)
(A-27)
(A-28)
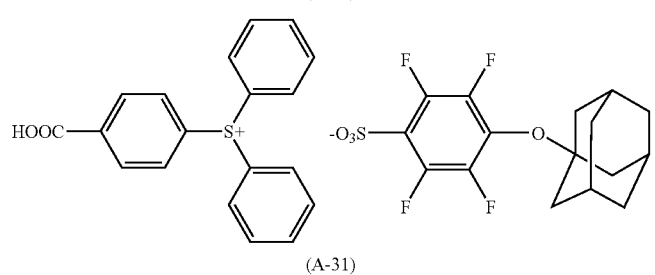
(A-29)
(A-30)
(A-31)

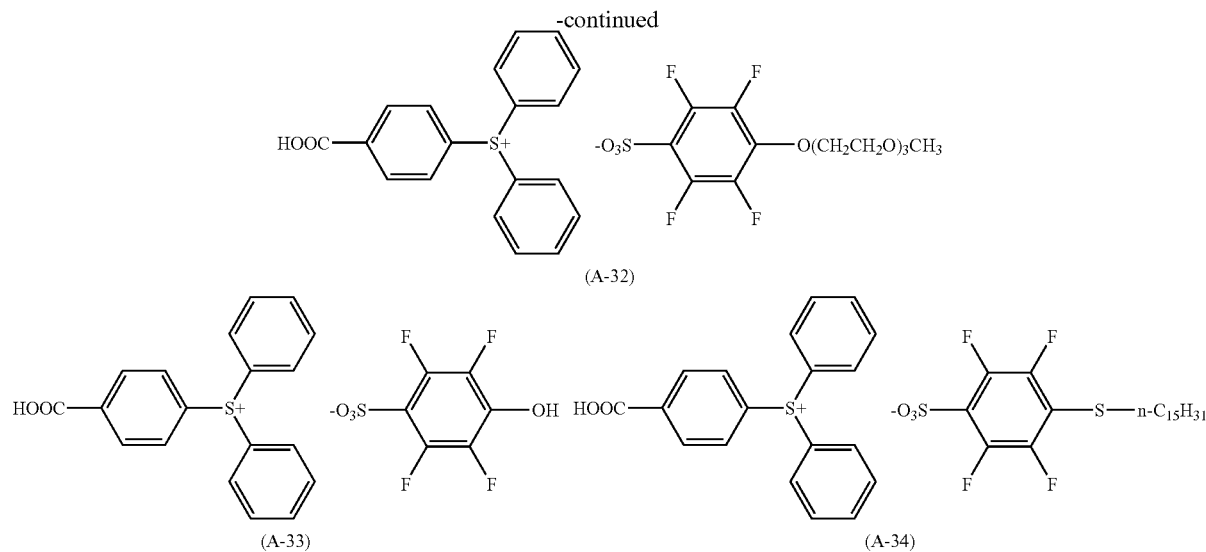

(A-32)

(A-33)    (A-34)

The compound capable of generating a sulfonic acid represented by formula (2) upon irradiation of actinic rays or radiation can be synthesized by synthesizing a derivative of the sulfonic acid represented by formula (2), and then subjecting the derivative to salt exchange with an onium halide or the like or esterification with a hydroxyl group-containing compound. The derivative of the sulfonic acid represented by formula (2) can be synthesized by the method described, for example, in *J. Chem. Soc., Perkin Tans.* 1, pp. 4265-4278 (2000).

(B2) Compound Capable of Generating a Sulfonic Acid Represented by the Following Formula (3) or (3') upon Irradiation of Actinic Rays or Radiation

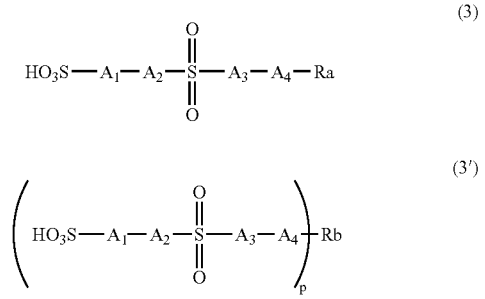

In formulae (3) and (3'), $A_1$ represents a divalent linking group, $A_2$ and $A_3$ each independently represents a single bond, an oxygen atom or —N(Rx)-, Rx represents a hydrogen atom, an aryl group, an alkyl group or a cycloalkyl group, $A_4$ represents a single bond or —C(=O)—, Ra represents a hydrogen atom or an organic group, p represents 2 or 3, Rb represents a p-valent linking group, and when $A_3$ is —N(Rx)-, Ra and Rx, or Rb and Rx may combine to form a ring.

The divalent linking group as $A_1$ is preferably an organic group having a carbon number of 1 to 20, more preferably an alkylene group (preferably having a carbon number of 1 to 10, more preferably from 2 to 6, still more preferably from 3 to 4). The alkylene chain may contain a linking group such as oxygen atom, sulfur atom, —C(=O)— group and ester group.

The divalent linking group as $A_1$ is still more preferably an alkylene group substituted by a fluorine atom, yet still more preferably an alkylene group with 30 to 100% by number of the hydrogen atom being substituted by a fluorine atom. In the case of an alkylene group substituted by a fluorine atom, the carbon atom bonded to the —$SO_3H$ group preferably has the fluorine atom. Furthermore, a perfluoroalkylene group is preferred, and a perfluoroethylene group, a perfluoropropylene group and a perfluorobutylene group are most preferred.

The aryl group as Rx may have a substituent and is preferably an aryl group having a carbon number of 6 to 14, such as phenyl group and naphthyl group.

The alkyl group as Rx may have a substituent and is preferably a linear or branched alkyl group having a carbon number of 1 to 20, and the alkyl chain may contain an oxygen atom, a sulfur atom or a nitrogen atom. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The alkyl group having a substituent particularly includes a group where a cycloalkyl group is substituted to a linear or branched alkyl group, such as adamantylmethyl group, adamantylethyl group, cyclohexylethyl group and camphor residue.

The cycloalkyl group as Rx may have a substituent and is preferably a cycloalkyl group having a carbon number of 3 to 20, and the ring may contain an oxygen atom. Specific examples thereof include a cyclopropyl group, a cyclopentyl group, a cyclohexyl group, a norbornyl group and an adamantyl group.

Ra represents a hydrogen atom or a monovalent organic group.

The monovalent organic group as Ra preferably has a carbon number of 1 to 20, and examples thereof include an alkyl group, a cycloalkyl group, an aryl group, an aralkyl group and an alkenyl group.

The alkyl group, cycloalkyl group and aryl group as Ra are the same as those described for Rx.

The aralkyl group as Ra is preferably an aralkyl group having a carbon number of 7 to 20, and examples thereof include a benzyl group, a phenethyl group, a naphthylmethyl group and a naphthylethyl group.

The alkenyl group as Ra includes a group having a double bond at an arbitrary position of the alkyl group described for Rx.

The p-valent linking group as Rb preferably has a carbon number of 1 to 20. When p=2 in formula (3'), examples of the divalent linking group as Rb include an alkylene group (preferably having a carbon number of 1 to 20), an arylene group (preferably having a carbon number of 6 to 10), an aralkylene group (preferably having a carbon number of 7 to 13) and an alkenylene group (preferably having a carbon number of 2 to 12), and each group may have a substituent.

When p=3, examples of the trivalent linking group as Rb include a trivalent group resulting from removal of an arbitrary hydrogen atom in the above-described divalent linking group.

Examples of the substituent which each group may have include a halogen atom, a hydroxyl group, a nitro group, a cyano group, a carboxy group, a carbonyl group, a cycloalkyl group (preferably having a carbon number of 3 to 20), an aryl group (preferably having a carbon number of 6 to 14), an alkoxy group (preferably having a carbon number of 1 to 20), an acyl group (preferably having a carbon number of 2 to 20), an acyloxy group (preferably having a carbon number of 2 to 20), an alkoxycarbonyl group (preferably having a carbon number of 2 to 20) and an aminoacyl group (preferably having a carbon number of 2 to 20). As for the cyclic structure in the aryl group and cycloalkyl group, examples of the substituent further include an alkyl group (preferably having a carbon number of 1 to 20). Also, as for the aminoacyl group, examples of the substituent further include one or two alkyl group(s) (preferably having a carbon number of 1 to 20).

The sulfonic acid of formula (3) or (3') is preferably a sulfonic acid represented by any one of the following formulae (IA) to (IC) and (I'A) to (I'C):

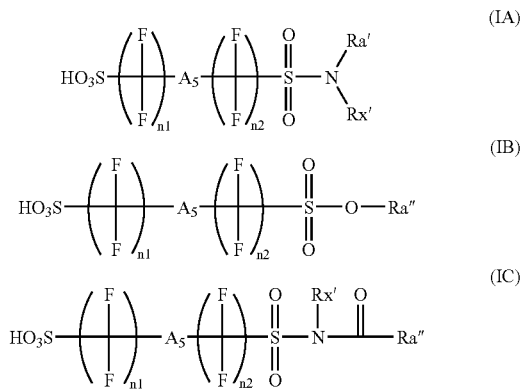

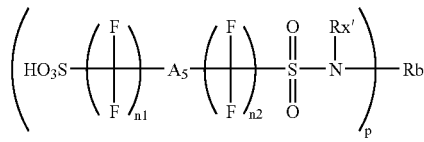

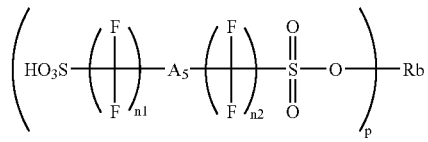

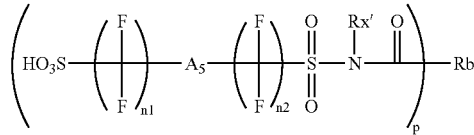

In formulae (IA) to (IC) and (I'A) to (I'C),

Ra' has the same meaning as Ra in formula (3),

Rb and p have the same meanings as Rb and p in formula (3'),

Ra" represents an alkyl group, an aralkyl group or an alkenyl group,

Rx' has the same meaning as Rx in formulae (3) and (3'), n1 represents an integer of 1 to 10, n2 represents an integer of 0 to 10, and $A_5$ represents an alkylene group or an arylene group.

The alkylene group as $A_5$ is preferably an alkylene or cycloalkylene group not substituted by fluorine.

In formula (IA), Ra' and Rx' are preferably combined to form a ring. By forming a ring structure, the stability is enhanced and a composition using this sulfonic acid is also enhanced in the storage stability. The ring formed is preferably a ring having a carbon number of 4 to 20, and the ring may be monocyclic or polycyclic and may contain an oxygen atom, a sulfur atom or a nitrogen atom.

Examples of the monocyclic structure include a nitrogen atom-containing 4-, 5-, 6-, 7- or 8-membered ring, and examples of the polycyclic structure include a structure comprising a combination of two monocyclic structures or three or more monocyclic structures. Such a ring may contain an oxygen atom or a sulfur atom. The monocyclic structure and the polycyclic structure each may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15) and an aminoacyl group (preferably having a carbon number of 2 to 20). As for the cyclic structure in the aryl group and cycloalkyl group, preferred examples of the substituent further include an alkyl group (preferably having a carbon number of 1 to 15). Also, as for the aminoacyl group, preferred examples of the substituent further include one or two alkyl group(s) (preferably having a carbon number of 1 to 15).

The alkyl group, aryl group, aralkyl group and alkenyl group as Ra" are the same as the alkyl group, aryl group, aralkyl group and alkenyl group as Ra.

n1+n2 is preferably an integer of 2 to 8, more preferably from 2 to 6.
Specific preferred examples of the sulfonic acid represented by formula (3) or (3') are set forth below, but the present invention is not limited thereto.
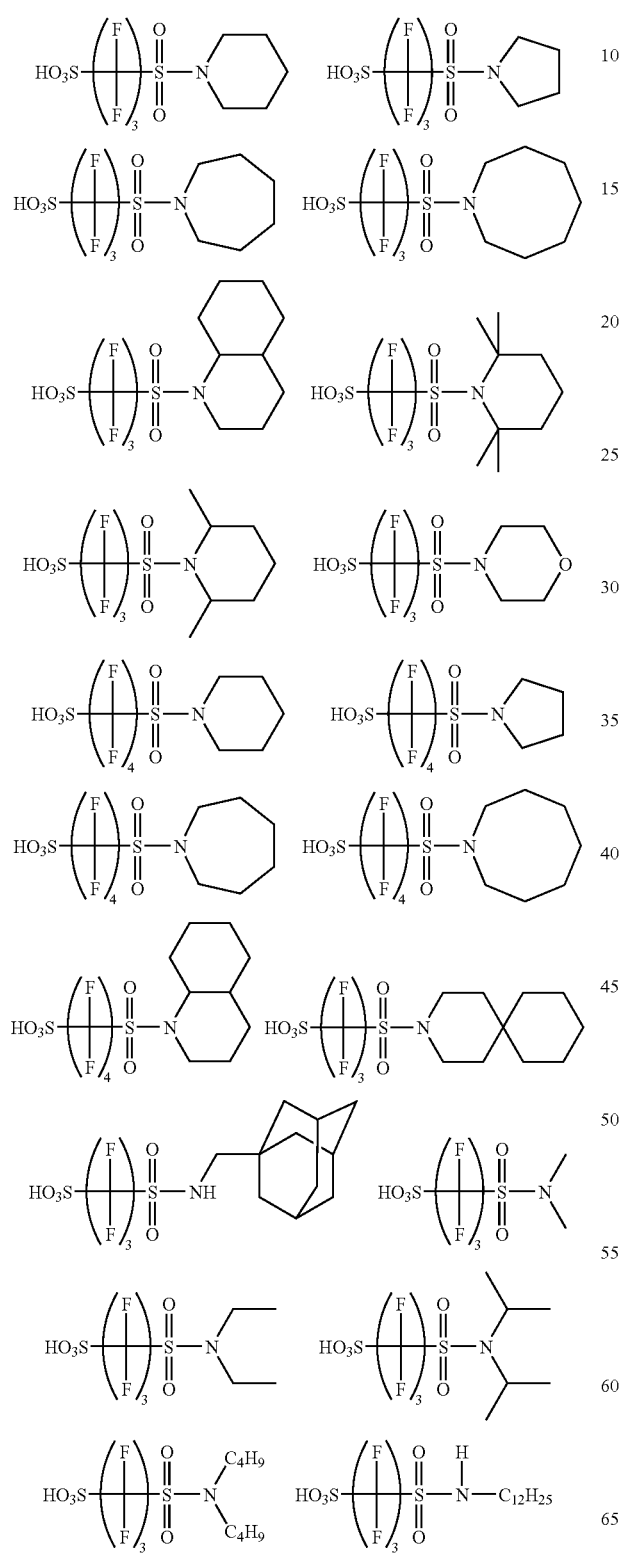
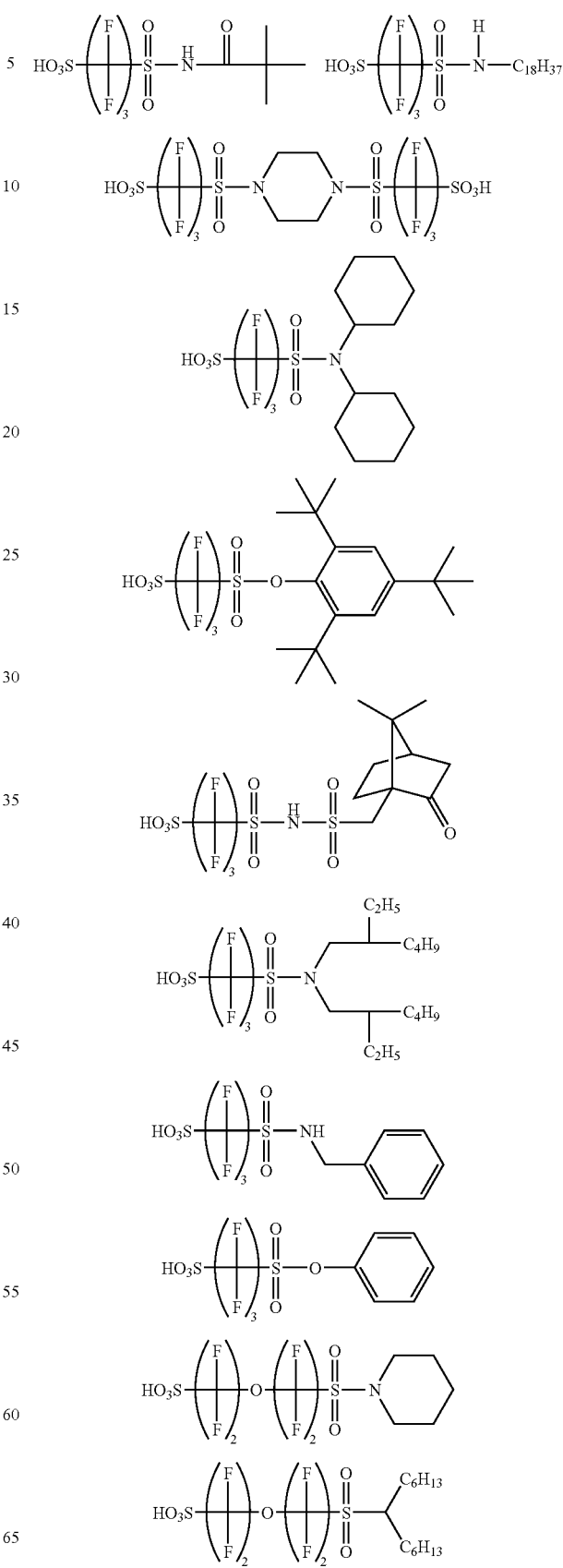

-continued
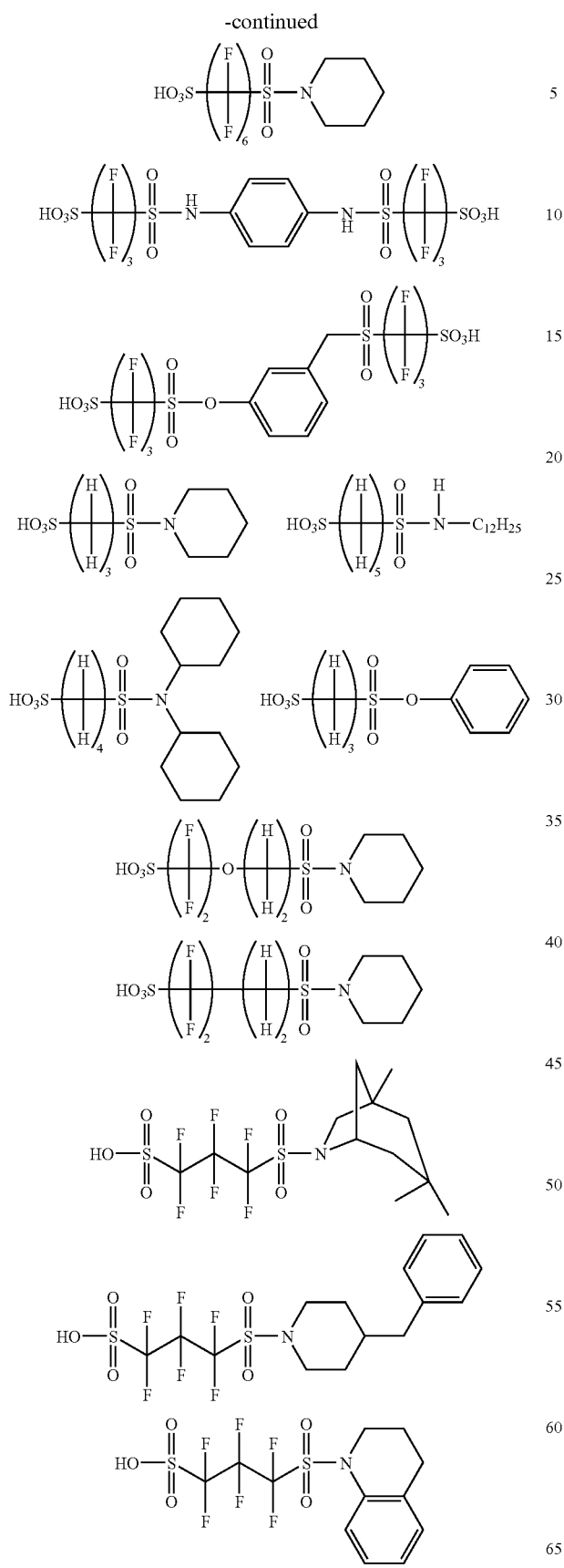
-continued
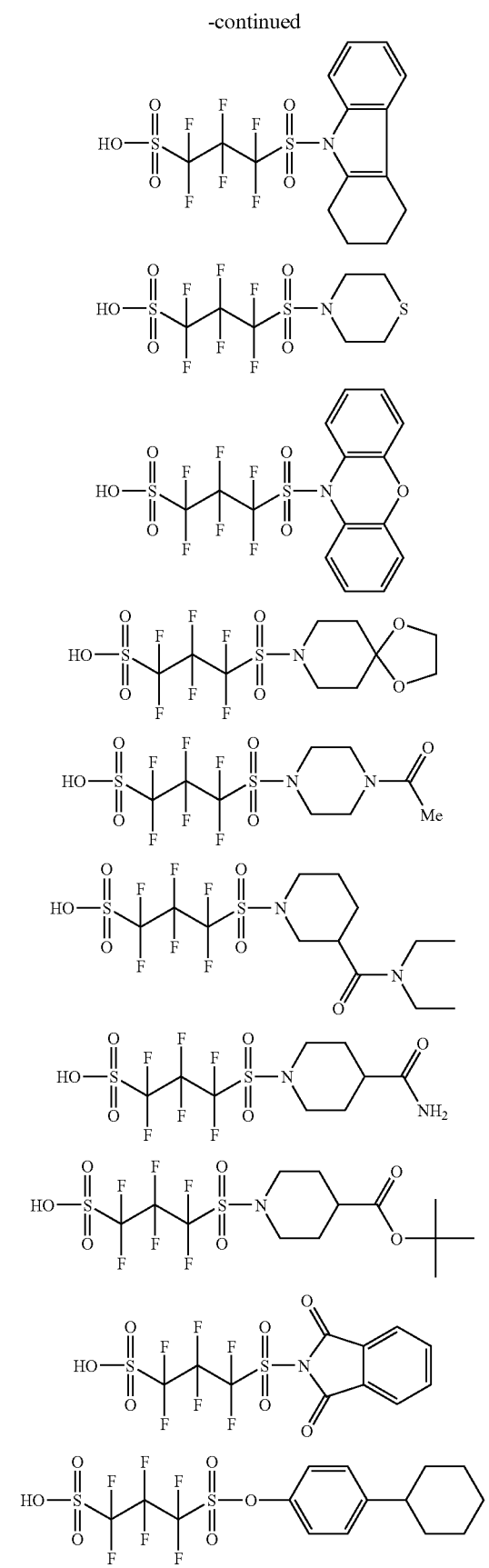

-continued

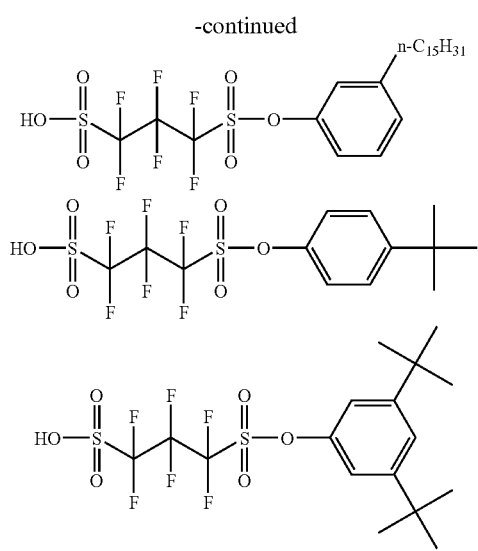

The compound capable of generating a sulfonic acid represented by formula (3) or (3') upon irradiation of actinic rays or radiation is preferably one member selected from sulfonium salt compounds and iodonium salt compounds of the sulfonic acid represented by formula (3) or (3'), or one member selected from ester compounds of the sulfonic acid represented by formula (3) or (3'), more preferably a compound represented by any one of the following formulae (A1) to (A5):

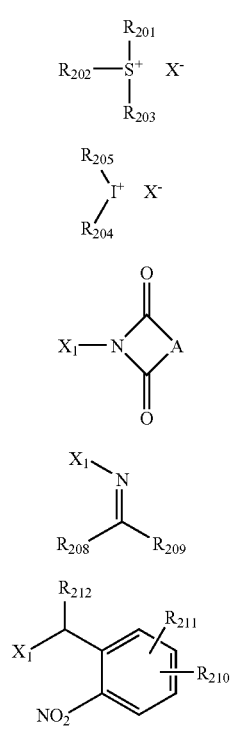

(A1)

(A2)

(A3)

(A4)

(A5)

In formulae (A1) and (A2), $X^-$ represents a sulfonate anion resulting from removal of the hydrogen atom of $-SO_3H$ in the sulfonic acid of formula (3) or (3').

In formulae (A3) to (A5), $X_1$ represents a monovalent group resulting from removal of the hydrogen atom of $-SO_3H$ in the sulfonic acid of formula (3) or (3').

Other groups are the same as those in formulae (A1) to (A5) described above for the compound capable of generating a sulfonic acid represented by formula (2) upon irradiation of actinic rays or radiation.

Among formulae (A1) to (A5), the compound represented by formula (A1) is preferred, and the compounds represented by formulae (A1a) to (A1c) are more preferred.

Specific preferred examples of the compound capable of generating a sulfonic acid represented by formula (3) or (3') upon irradiation of actinic rays or radiation are set forth below, but the present invention is not limited thereto.

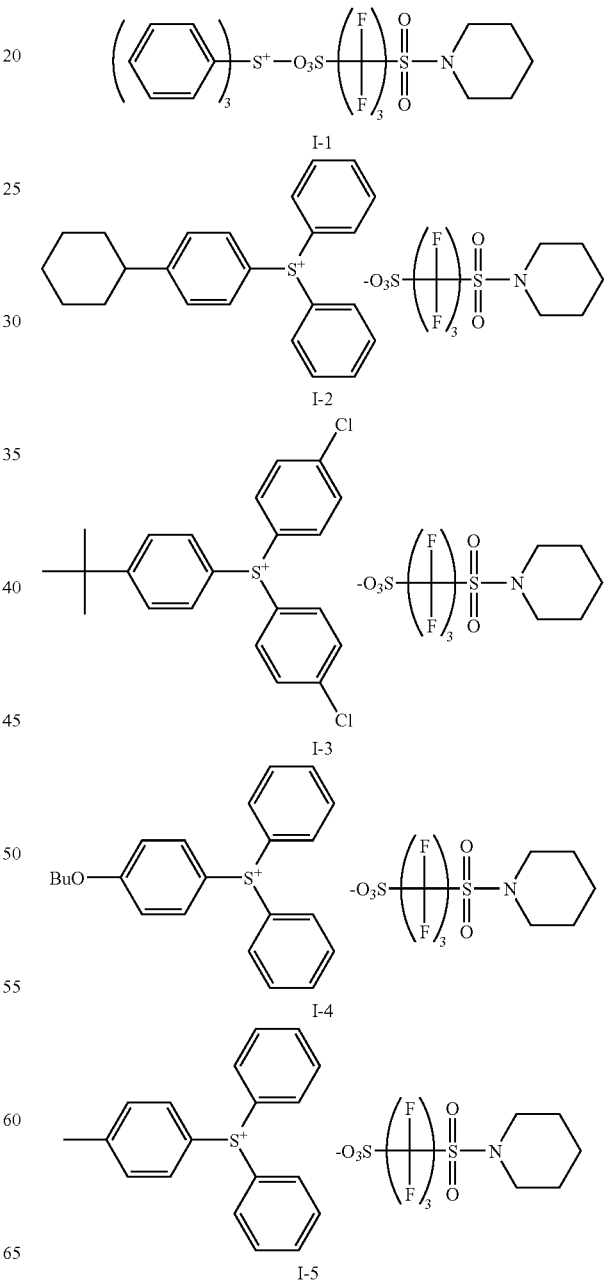

I-1

I-2

I-3

I-4

I-5

-continued
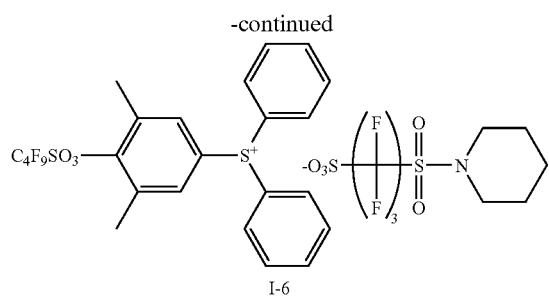
I-6
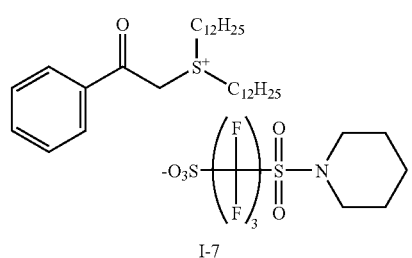
I-7
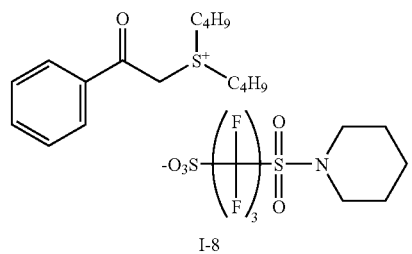
I-8
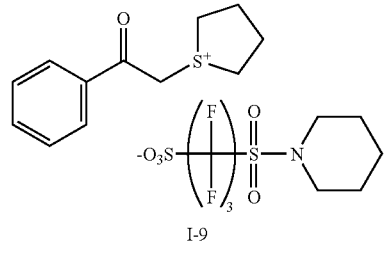
I-9
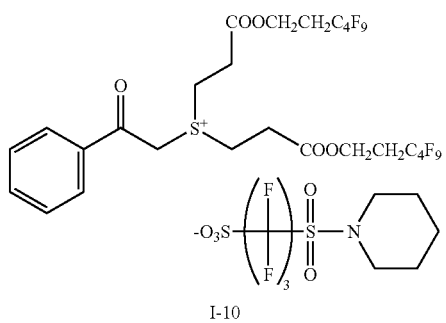
I-10
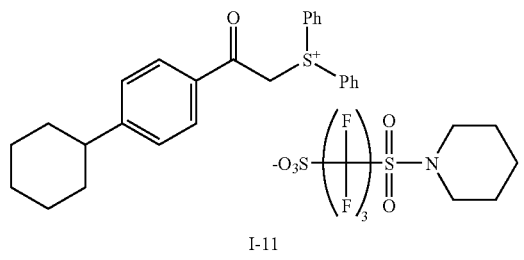
I-11
-continued
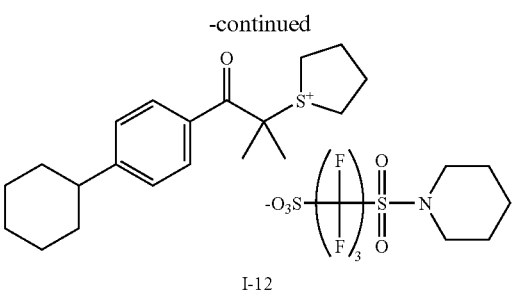
I-12
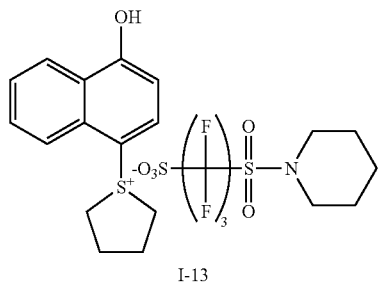
I-13
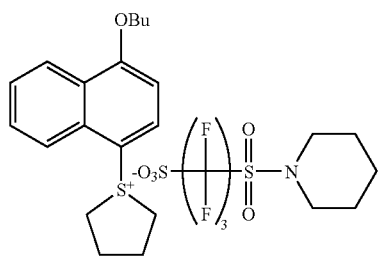
I-14
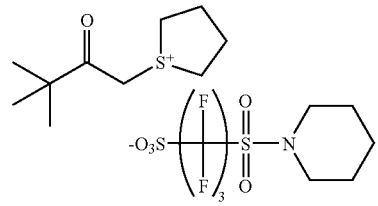
I-15
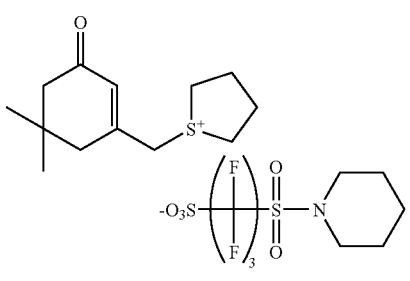
I-16
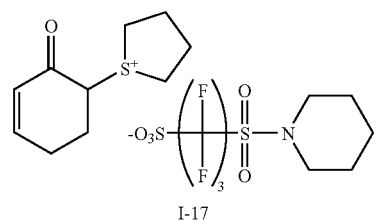
I-17

-continued
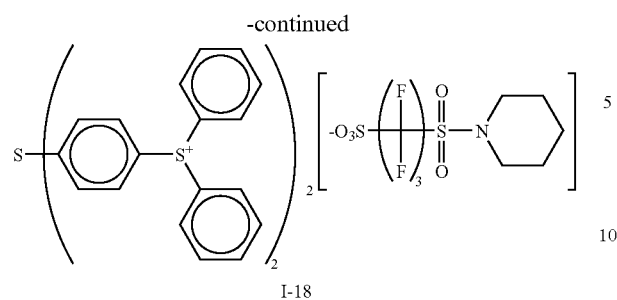
I-18
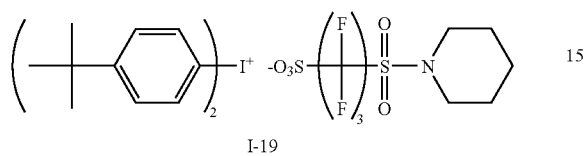
I-19
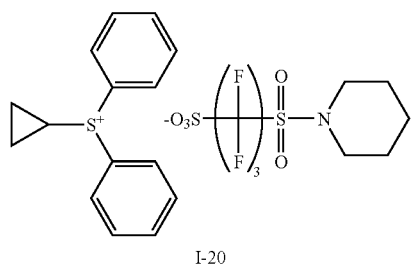
I-20
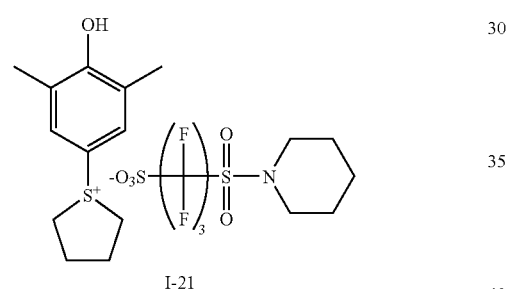
I-21
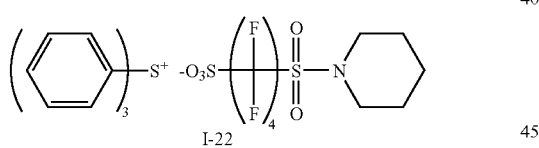
I-22
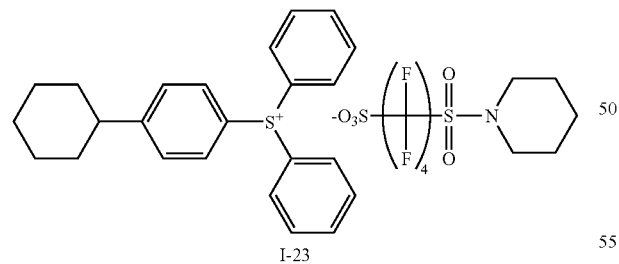
I-23
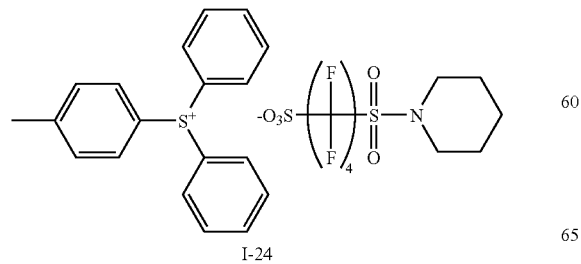
I-24
-continued
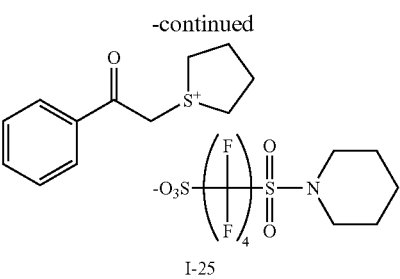
I-25
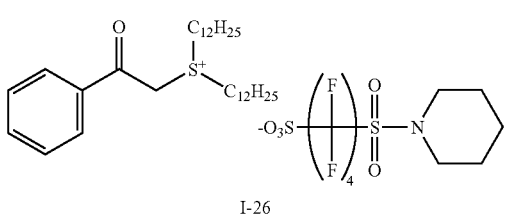
I-26
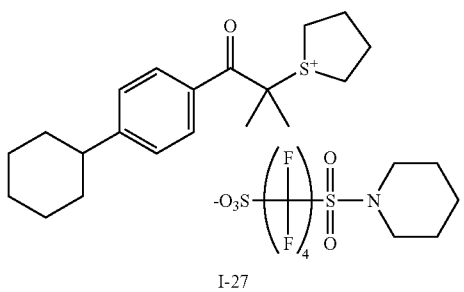
I-27
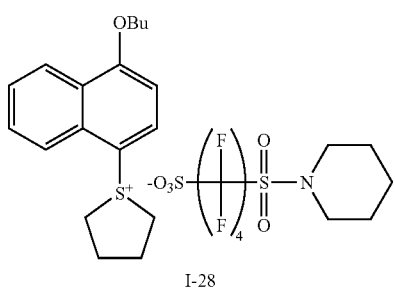
I-28
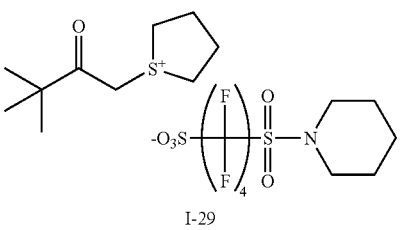
I-29
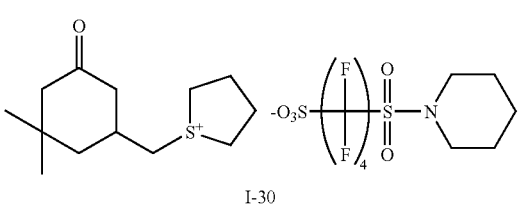
I-30

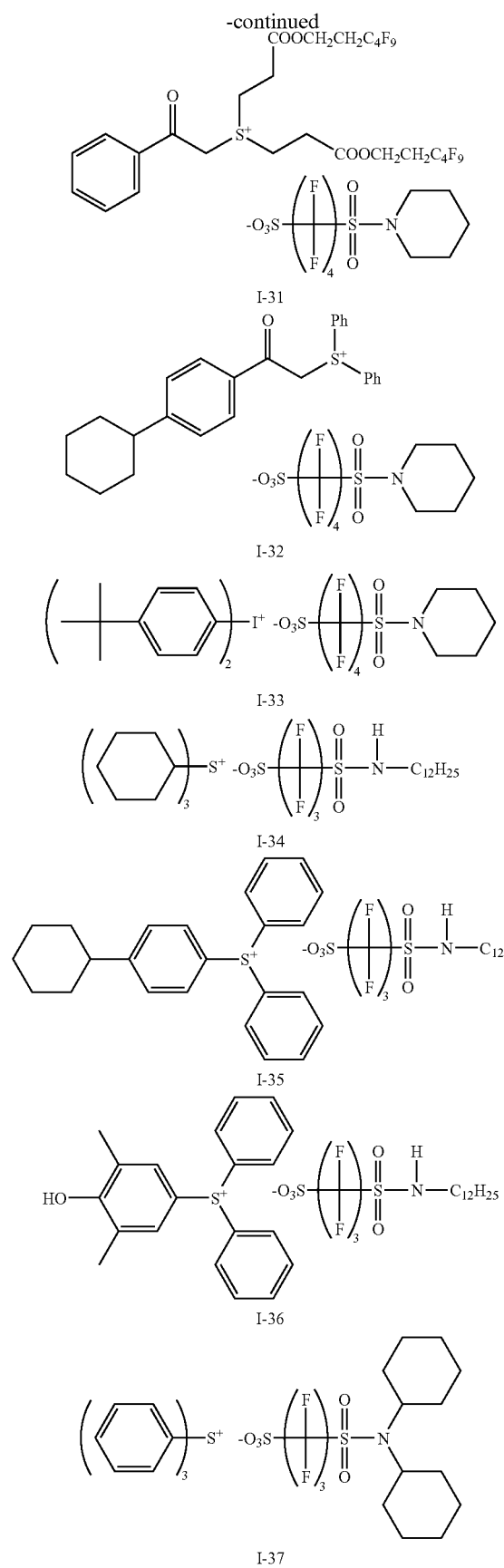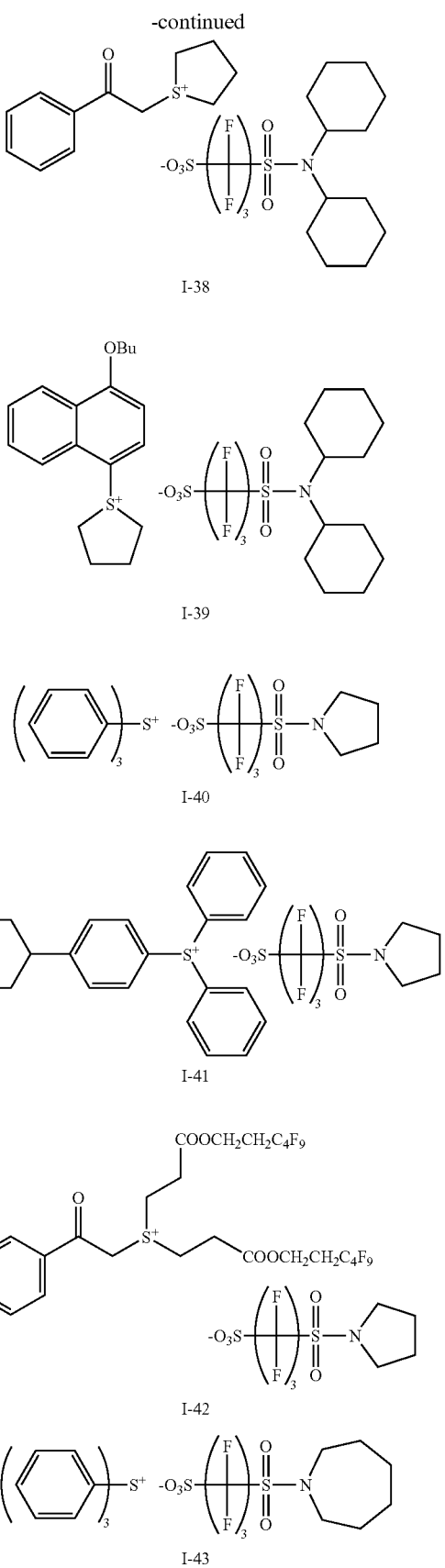

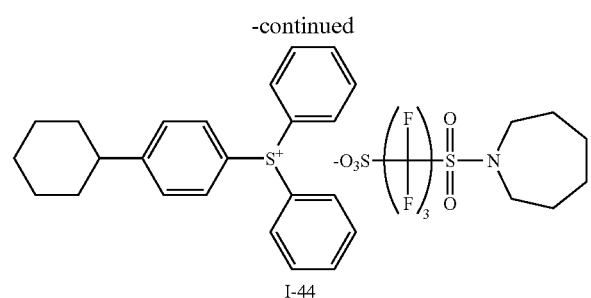
I-44
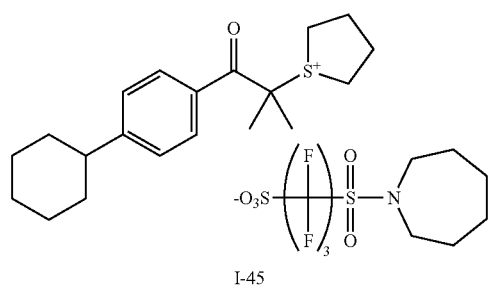
I-45
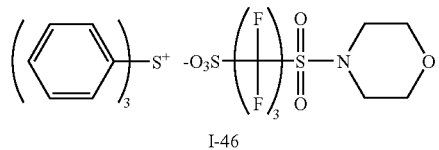
I-46
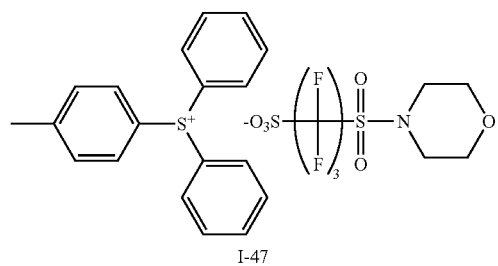
I-47
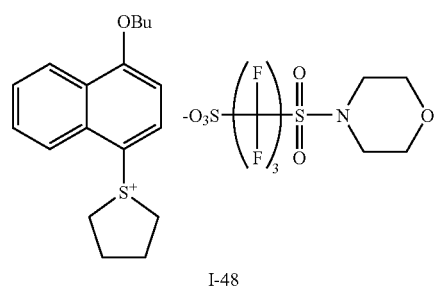
I-48
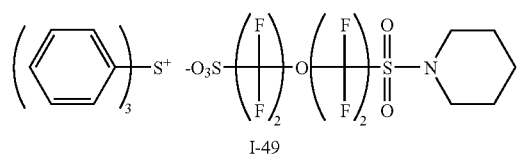
I-49
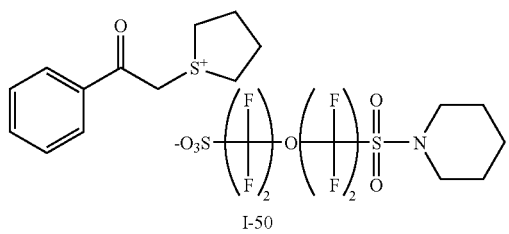
I-50
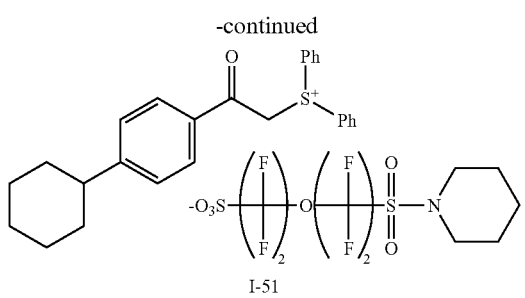
I-51
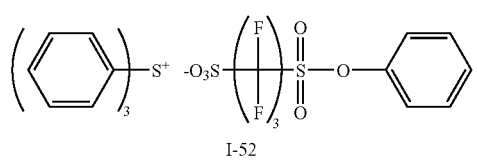
I-52
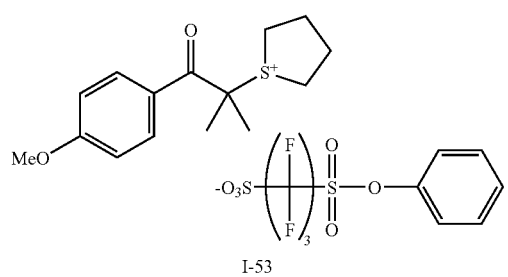
I-53
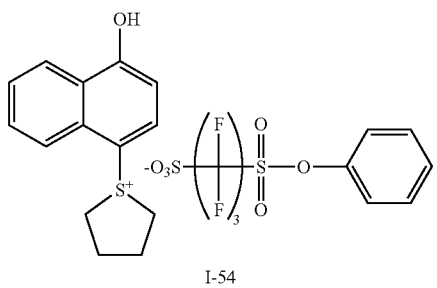
I-54
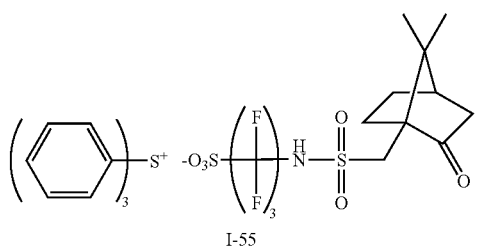
I-55
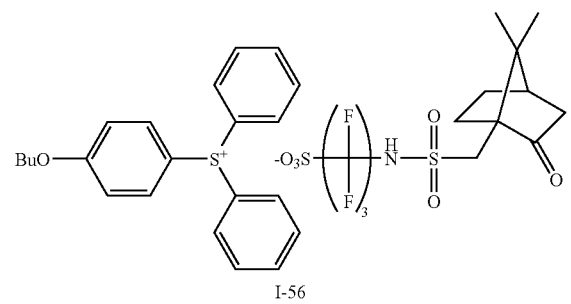
I-56

-continued
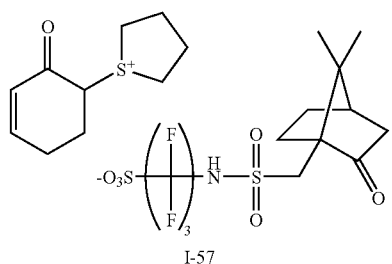
I-57
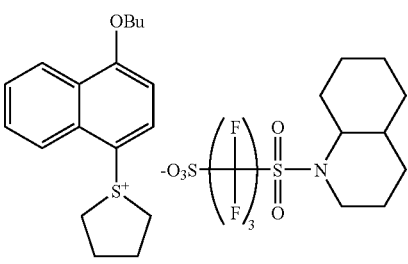
I-63
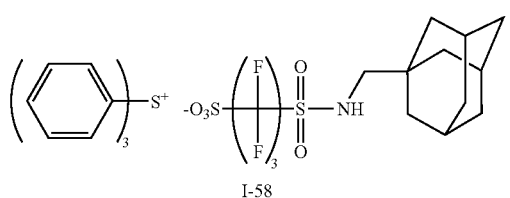
I-58
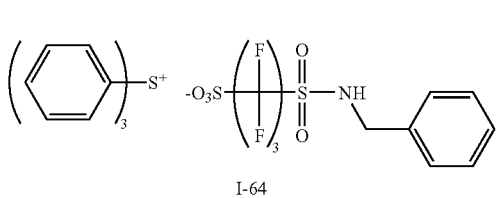
I-64
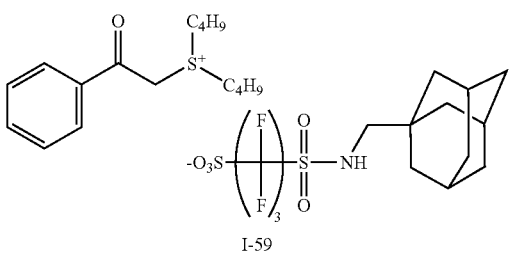
I-59
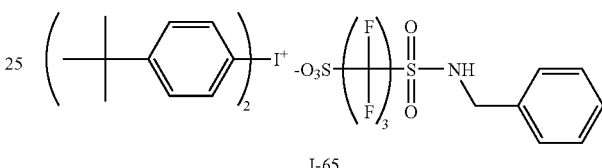
I-65
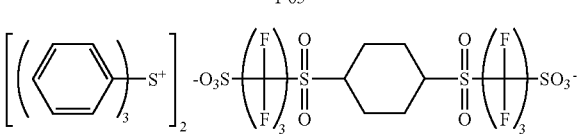
I-66
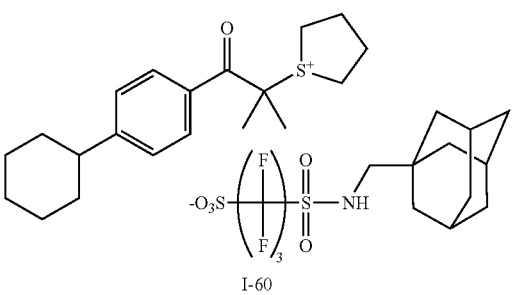
I-60
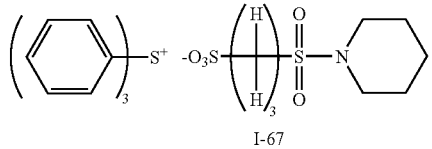
I-67
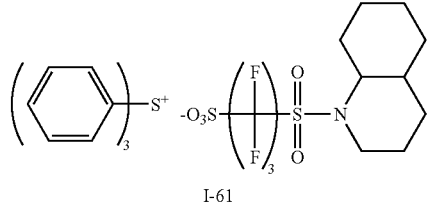
I-61
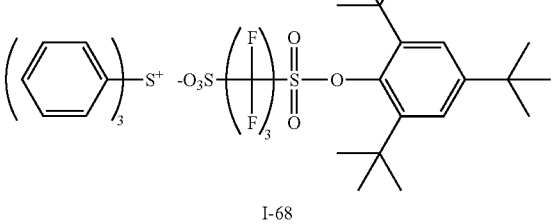
I-68
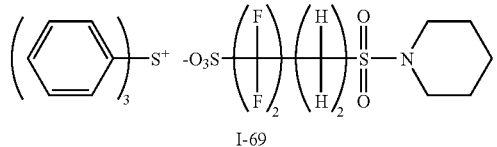
I-69
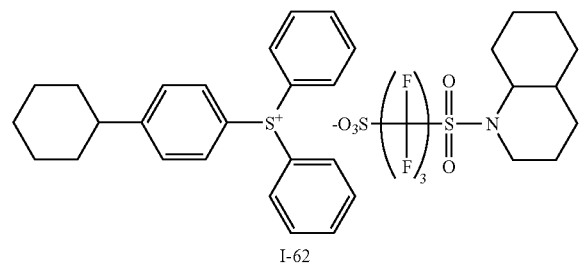
I-62
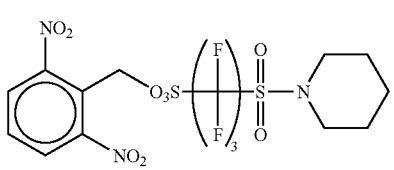
I-70

-continued

I-71

I-72

I-73

I-74

I-75

I-76

I-77

I-78

-continued

I-79

I-80

I-81

I-82

I-83

I-84

I-85

I-86

-continued

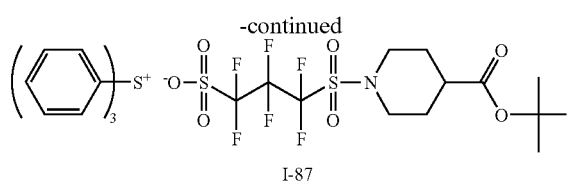

I-87

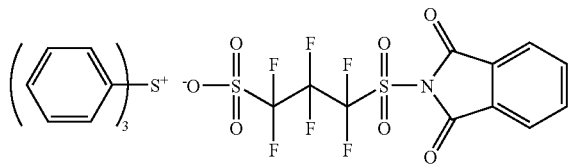

I-88

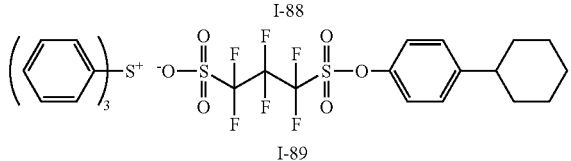

I-89

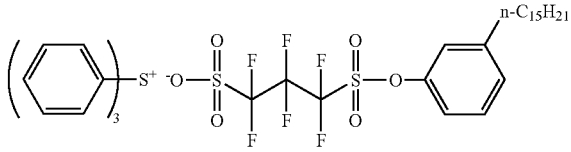

I-90

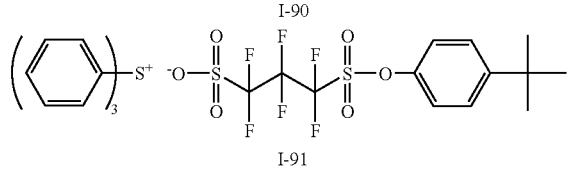

I-91

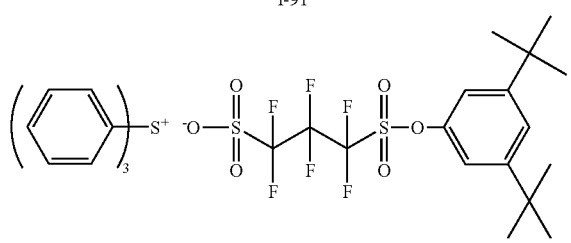

I-92

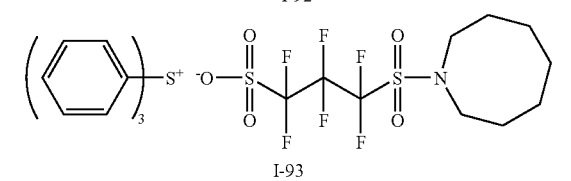

I-93

The sulfonic acid represented by formula (3) or (3') or a salt thereof (e.g., onium salt, metal salt) can be synthesized by using a sulfonic acid esterification reaction or a sulfonamidation reaction in general. For example, a method of selectively reacting one sulfonyl halide moiety of a bis-sulfonyl halide compound with an amine, an alcohol or an amide compound to form a sulfonamide bond, a sulfonic acid ester bond or a sulfonimide bond, and then hydrolyzing the other sulfonyl halide moiety, or a method of ring-opening a cyclic sulfonic anhydride by an amine, an alcohol or an amide compound may be used.

Examples of the salt of the sulfonic acid represented by formula (3) or (3') include a metal sulfonate and an onium sulfonate. Examples of the metal in the metal sulfonate include $Na^+$, $Li^+$ and $K^+$. Examples of the onium cation in the onium sulfonate include ammonium cation, sulfonium cation, iodonium cation, phosphonium cation and diazonium cation.

The sulfonic acid represented by formula (3) or (3') or a salt thereof can be used for the synthesis of a compound capable of generating a sulfonic acid represented by formula (3) or (3') upon irradiation of actinic rays or radiation.

The compound capable of generating a sulfonic acid represented by formula (3) or (3') upon irradiation of actinic rays or radiation can be synthesized by a method of salt-exchanging the sulfonic acid represented by formula (3) or (3') with a photoactive onium salt such as sulfonium salt or iodonium salt, or a method of forming an ester of the sulfonic acid represented by formula (3) or (3') with a nitrobenzyl alcohol, an N-hydroxyimide or an oxime compound.

(B3) Compound Capable of Generating an Anion Represented by the Following Formula (4) or (5) upon Irradiation of Actinic Rays or Radiation

(4)

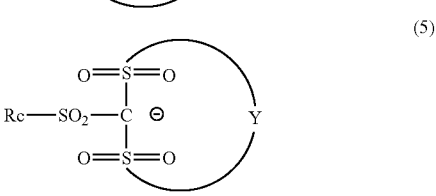

(5)

In formulae (4) and (5),

Y is an alkylene group substituted by at least one fluorine atom, preferably an alkylene group having a carbon number of 2 to 4. The alkylene chain may contain an oxygen atom. Y is more preferably a perfluoroalkylene group having a carbon number of 2 to 4, and most preferably a tetrafluoroethylene group, a hexafluoropropylene group or an octafluorobutylene group.

In formula (5), Rc represents an alkyl group or a cycloalkyl group. The alkylene chain in the alkyl or cycloalkyl group may contain an oxygen atom.

The alkyl group as Rc is preferably a fluorine-substituted alkyl group, more preferably a perfluoroalkyl group having a carbon number of 1 to 4, and examples thereof include a trifluoromethyl group, a pentafluoroethyl group, a heptafluoropropyl group, a nonafluorobutyl group and a perfluoroethoxyethyl group.

The cycloalkyl group as Rc is preferably a fluorine-substituted cycloalkyl group (preferably a cycloalkyl having a carbon number of 3 to 6, such as cyclopentyl group and cyclohexyl group).

The compound capable of generating a sulfonic acid represented by formula (4) or (5) upon irradiation of actinic rays or radiation is preferably a compound represented by the following formula (I-a) or (I-b), more preferably a compound represented by formula (I-a).

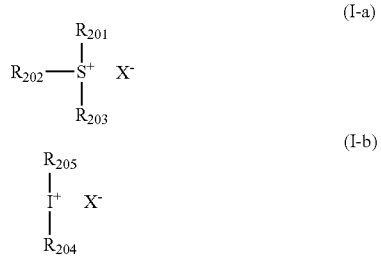

In formulae (I-a) and (I-b), $X^-$ represents an anion represented by formula (4) or (5).

In formula (I-a), $R_{201}$, $R_{202}$ and $R_{203}$ each independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

The group formed by combining two members out of $R_{201}$ to $R_{203}$ includes an alkylene group (e.g., butylene, pentylene).

Examples of the organic group as $R_{201}$, $R_{202}$ and $R_{203}$ include the corresponding groups in Compounds (I-a1), (I-a2) and (I-a3) described later.

The compound may have a plurality of structures represented by formula (I-a). For example, the compound may be a compound having a structure that at least one of $R_{201}$ to $R_{203}$ in the compound represented by formula (I-a) is bonded to at least one of $R_{201}$ to $R_{203}$ in another compound represented by formula (I-a).

The component (I-a) is more preferably a compound (I-a1), (I-a2) or (I-a3) described below.

The compound (I-a1) is an arylsulfonium compound where at least one of $R_{201}$ to $R_{203}$ in formula (I-a) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group.

Examples of the arylsulfonium compound include a triarylsulfonium compound, a diarylalkylsulfonium compound and an aryldialkylsulfonium compound.

The aryl group in the arylsulfonium compound is preferably a phenyl group or a naphthyl group, more preferably a phenyl group. In the case where the aryl-sulfonium compound has two or more aryl groups, these two or more aryl groups may be the same or different.

The alkyl group and cycloalkyl group in the arylalkylsulfonium compound and aryldialkylsulfonium compound are preferably a linear or branched alkyl group having a carbon number of 1 to 15 and a cycloalkyl group having a carbon number of 3 to 15, respectively. Examples thereof include a methyl group, an ethyl group, a propyl group, an n-butyl group, a sec-butyl group, a tert-butyl group, a cyclopropyl group, a cyclobutyl group and a cyclohexyl group. When two alkyl groups in the aryldialkylsulfonium compound are combined with each other to form a ring, good storage stability is obtained and this is preferred.

The aryl group, alkyl group and cycloalkyl group of $R_{201}$ to $R_{203}$ each may have a substituent, for example, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (having a carbon number of 1 to 15), a carboxy group, a halogen atom, a hydroxyl group or a phenylthio group. The substituent is preferably a linear or branched alkyl group having a carbon number of 1 to 12, a cycloalkyl group having a carbon number of 3 to 15, or a linear, branched or cyclic alkoxy group having a carbon number of 1 to 12, and most preferably an alkyl group having a carbon number of 1 to 4 or an alkoxy group having a carbon number of 1 to 4. The substituent may be substituted to any one of three members $R_{201}$ to $R_{203}$ or may be substituted all of those three members. In the case where $R_{201}$ to $R_{203}$ are an aryl group, the substituent is preferably substituted at the p-position of the aryl group.

The compound (I-a1) is preferably a triphenylsulfonium salt where $R_{201}$ to $R_{203}$ all are a phenyl group, more preferably a triphenylsulfonium salt where one or more phenyl group in $R_{201}$ to $R_{203}$ is substituted by at least either an alkyl group or a cycloalkyl group. The alkyl group and cycloalkyl group as the substituent of the phenyl group include a linear or branched alkyl group having a carbon number of 1 to 12 and a cycloalkyl group having a carbon number of 3 to 12, and the substituent is preferably a linear or branched alkyl group having a carbon number of 1 to 6 or a cycloalkyl group having a carbon number of 3 to 6. By this constitution, generation of a particle during storage of the solution can be reduced. Specific examples of the alkyl group and cycloalkyl group as the substituent of the phenyl group include a methyl group, an ethyl group, a propyl group, a butyl group, a tert-butyl group, a hexyl group and a cyclohexyl group. Among these, a methyl group, a tert-butyl group and a cyclohexyl group are mot preferred.

The compound (I-a2) is described below.

The compound (I-a2) is a compound when $R_{201}$ to $R_{203}$ in formula (I-a) each independently represents an organic group not containing an aromatic ring. The aromatic ring as used herein includes an aromatic ring containing a heteroatom.

The organic group as $R_{201}$ to $R_{203}$ not containing an aromatic ring has a carbon number of generally from 1 to 30, preferably from 1 to 20.

$R_{201}$ to $R_{203}$ each independently represents preferably an alkyl group (particularly, examples of the substituted alkyl group include a linear, branched or cyclic oxoalkyl group which may have a double bond in the chain, and an alkoxycarbonylmethyl group), a cycloalkyl group, an allyl group or a vinyl group, more preferably a linear, branched or cyclic 2-oxoalkyl group, a linear, branched or cyclic α,β-unsaturated 2-oxoalkyl group, or a linear, branched cyclic 2,3-unsaturated 4-oxoalkyl group, and most preferably a linear or branched 2-oxoalkyl group.

The alkyl group as $R_{201}$ to $R_{203}$ may be either linear or branched and is preferably a linear or branched alkyl group having a carbon number of 1 to 20 (e.g., methyl, ethyl, propyl, butyl, pentyl).

The cycloalkyl group as $R_{201}$ to $R_{203}$ is a cycloalkyl group having a carbon number of 3 to 10, and examples thereof include a cyclopentyl group, a cyclohexyl group and a norbornyl group.

The oxoalkyl group as $R_{201}$ to $R_{203}$ may be linear, branched or cyclic and is preferably a group having >C=O at the 2- or 4-position of the above-described alkyl or cycloalkyl group. The oxoalkyl group may have a double bond in the alkyl chain, and the double bond is preferably conjugated with a carbonyl group to form an α,β-unsaturated ketone structure.

The alkoxy group in the alkoxycarbonylmethyl group as $R_{201}$ to $R_{203}$ is preferably an alkyl group having a carbon number of 1 to 5 (e.g., methyl, ethyl, propyl, butyl, pentyl).

$R_{201}$ to $R_{203}$ each may be further substituted by a halogen atom, an alkoxy group (for example, an alkoxy group having a carbon number of 1 to 5), a hydroxyl group, a cyano group or a nitro group.

Two members out of $R_{201}$ to $R_{203}$ may combine to form a ring structure and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

The compound (I-a3) is a compound represented by the following formula (I-a3), and this is a compound having an arylacylsulfonium salt structure.

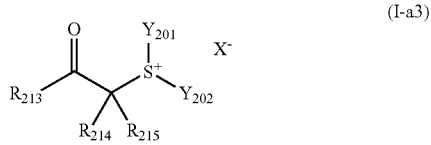

(I-a3)

In formula (I-a3), $R_{213}$ represents an aryl group and is preferably a phenyl group or a naphthyl group, more preferably a phenyl group.

Preferred examples of the substituent on $R_{213}$ include an alkyl group (preferably having a carbon number of 1 to 15), a cycloalkyl group (preferably having a carbon number of 3 to 15), an alkoxy group (preferably having a carbon number of 1 to 12), an acyl group (preferably having a carbon number of 2 to 13), a nitro group, a hydroxyl group, an alkoxycarbonyl group (preferably having a carbon number of 2 to 13) and a carboxy group.

$R_{214}$ and $R_{215}$ each represents a hydrogen atom, an alkyl group or a cycloalkyl group.

$Y_{201}$ and $Y_{202}$ each independently represents an alkyl group (particularly, examples of the substituted alkyl group include a 2-oxoalkyl group, an alkoxycarbonylalkyl group and a carboxyalkyl group), a cycloalkyl group, an aryl group or a vinyl group.

Each pair of $R_{213}$ and $R_{214}$, $R_{214}$ and $R_{215}$, and $Y_{201}$ and $Y_{202}$ may combine to form a ring structure, and the ring structure may contain an oxygen atom, a sulfur atom, an ester bond and an amide bond.

The alkyl group as $Y_{201}$ and $Y_{202}$ is preferably a linear or branched alkyl group having a carbon number of 1 to 20, and the cycloalkyl group is preferably a cycloalkyl group having a carbon number of 3 to 20.

The 2-oxoalkyl group includes a group having >C=O at the 2-position of the alkyl group as $Y_{201}$ and $Y_{202}$.

The alkoxycarbonyl group in the alkoxycarbonylalkyl group is preferably an alkoxycarbonyl group having a carbon number of 2 to 20 and may be substituted by a fluorine atom, an alkoxy group or a hydroxyl group.

Examples of the carboxyalkyl group include those resulting from substitution of a carboxy group to the above-described alkyl group.

The aryl group is preferably a phenyl group or a naphthyl group, more preferably a phenyl group.

Examples of the group formed by combining $Y_{201}$ and $Y_{202}$ include a butylene group and a pentylene group.

$Y_{201}$ and $Y_{202}$ each is preferably an alkyl group having a carbon number of 4 or more, more preferably from 4 to 16, still more preferably from 4 to 12.

At least either one of $R_{214}$ and $R_{215}$ is preferably an alkyl group, and more preferably, $R_{214}$ and $R_{215}$ both are an alkyl group. When at least either one of $R_{214}$ and $R_{215}$ is an alkyl group, the photodecomposability and in turn the sensitivity are enhanced.

In formula (I-b), $R_{204}$ and $R_{205}$ each independently represents an aryl group, an alkyl group or a cycloalkyl group.

The aryl group of $R_{204}$ and $R_{205}$ is preferably a phenyl group or a naphthyl group, more preferably a phenyl group.

The alkyl group as $R_{204}$ and $R_{205}$ may be either linear or branched and is preferably a linear or branched alkyl group having a carbon number of 1 to 10 (e.g., methyl, ethyl, propyl, butyl, pentyl).

The cycloalkyl group as $R_{204}$ and $R_{205}$ is preferably a cycloalkyl group having a carbon number of 3 to 10 (e.g., cyclopentyl, cyclohexyl, norbornyl).

Examples of the substituent which $R_{204}$ and $R_{205}$ may have include an alkyl group (for example, an alkyl group having a carbon number of 1 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

Specific examples of the compound capable of generating an acid represented by formula (4) or (5) are set forth below, but the present invention is not limited thereto.

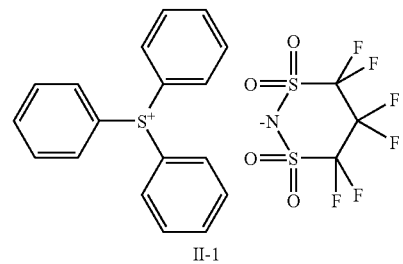

II-1

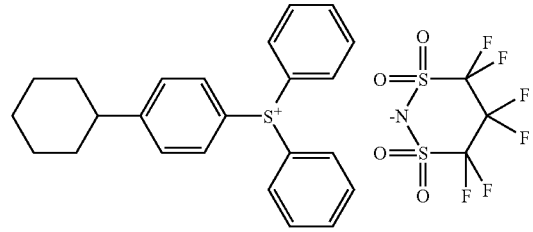

II-2

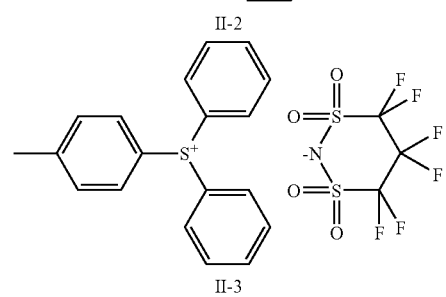

II-3

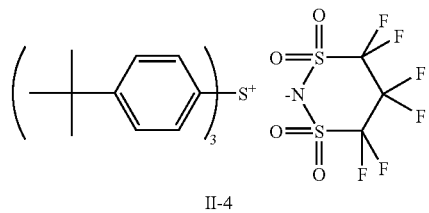

II-4

-continued
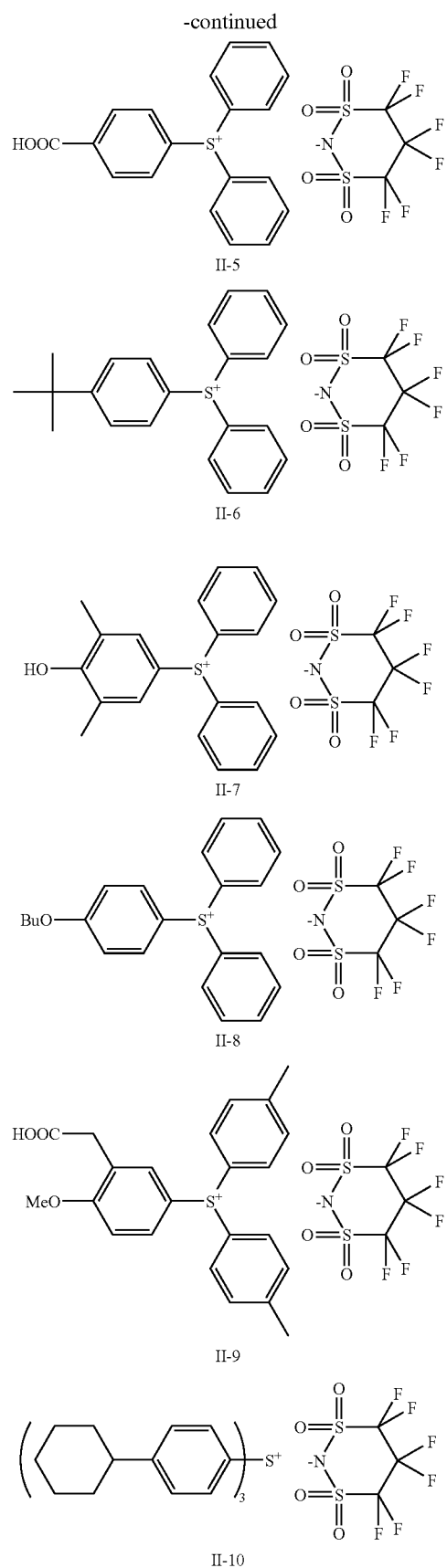
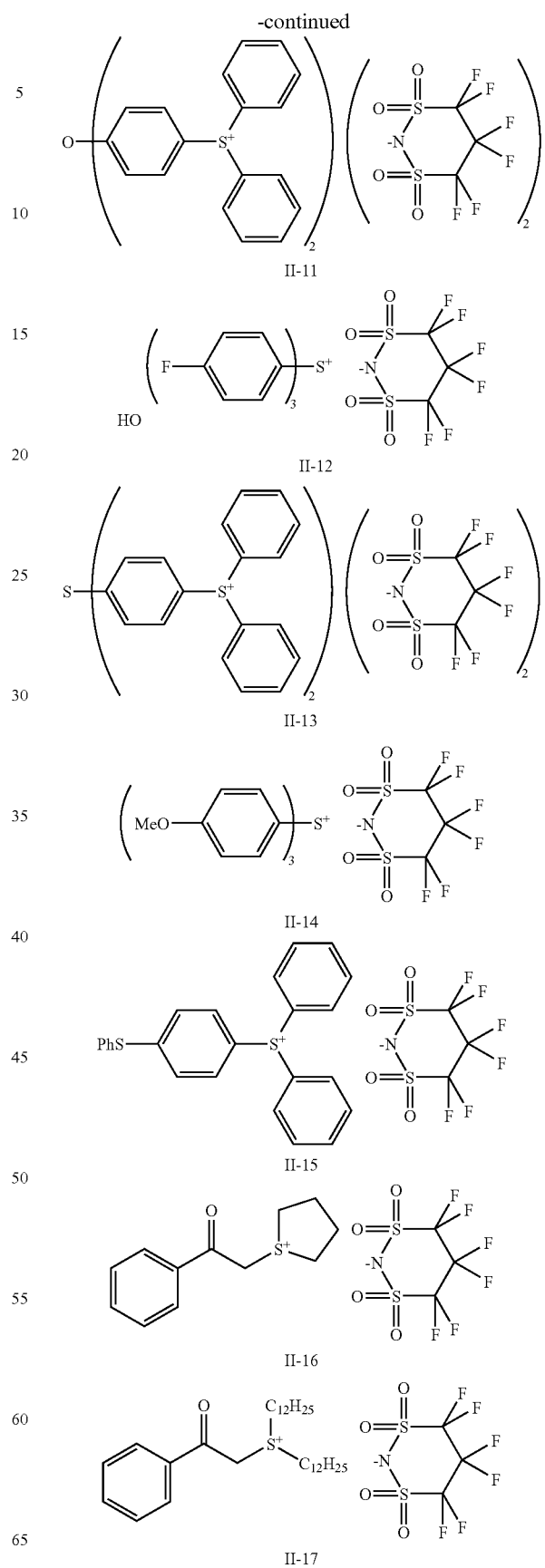

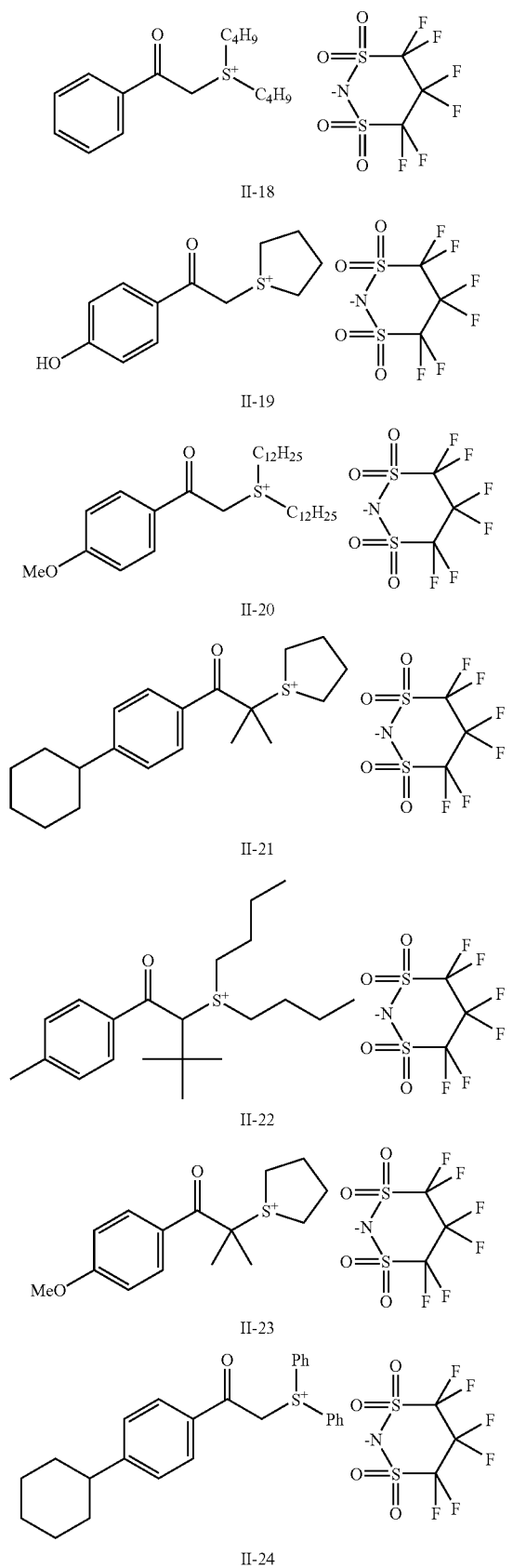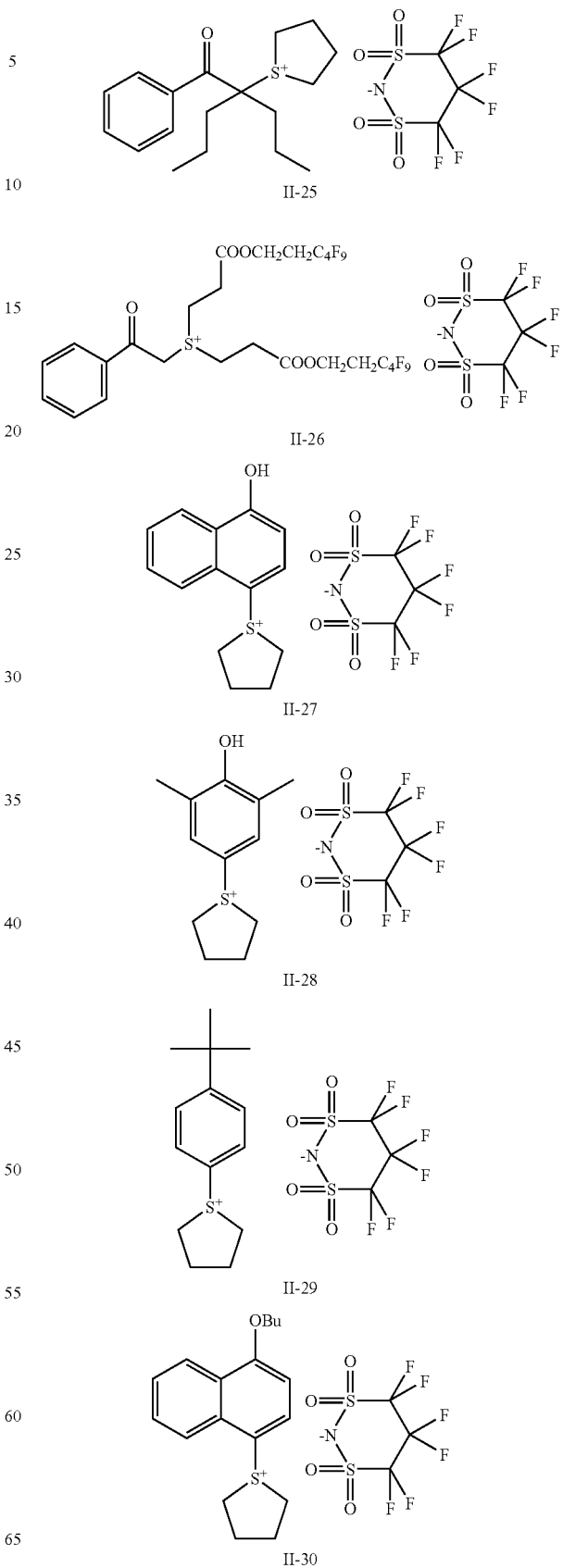

-continued
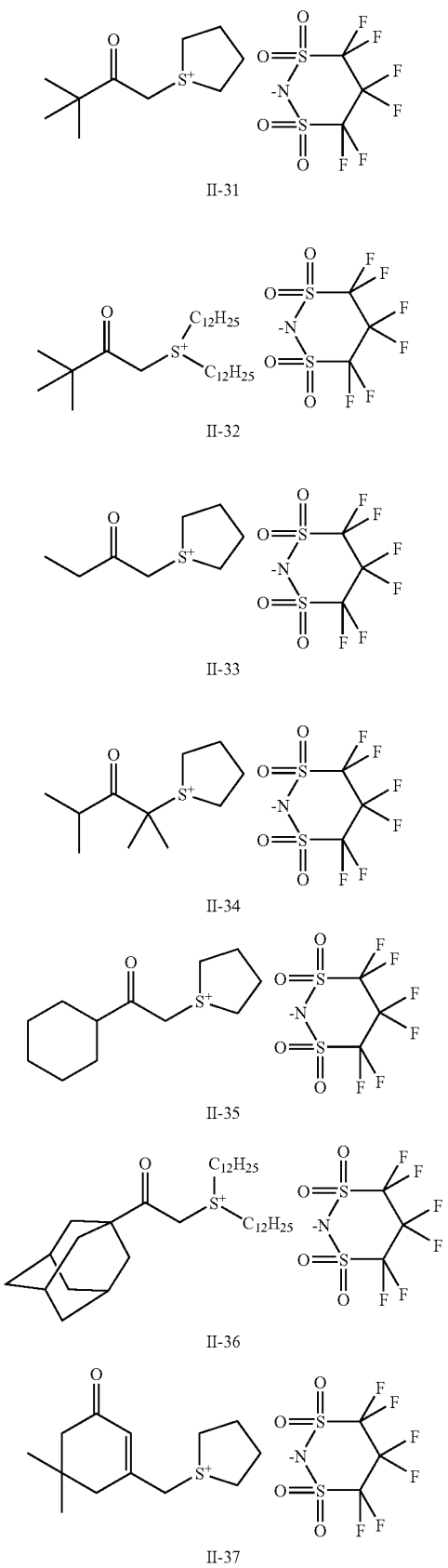
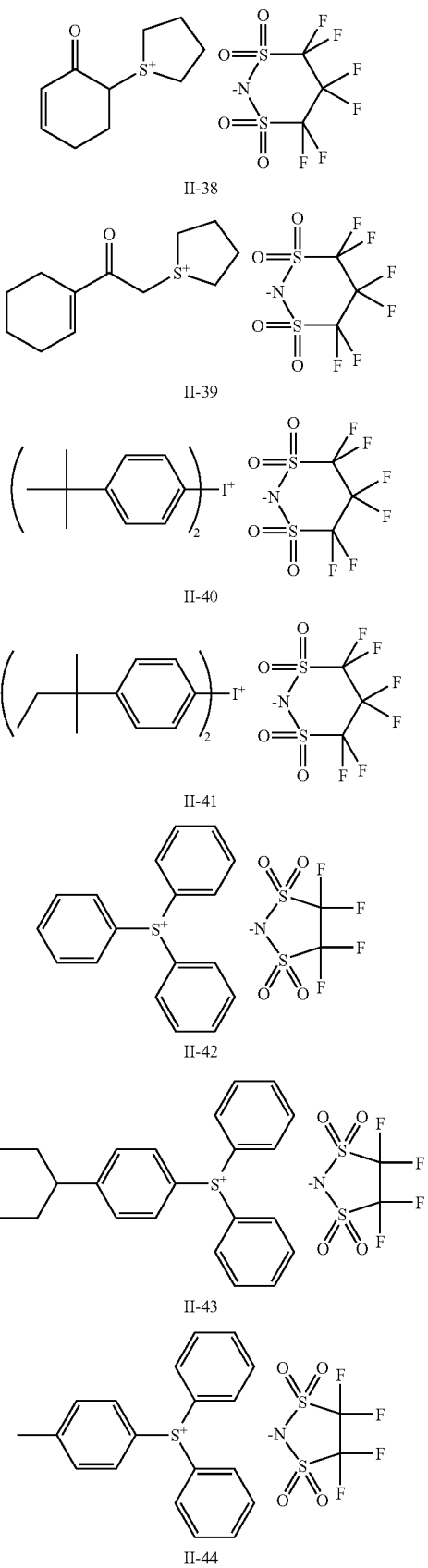

-continued
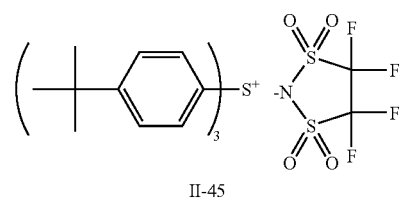
II-45
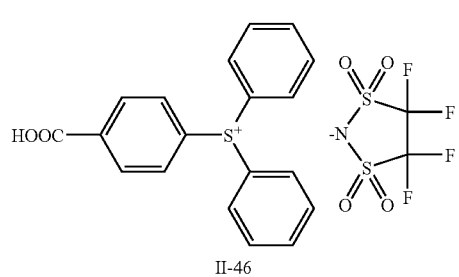
II-46
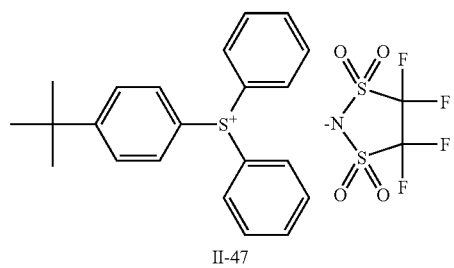
II-47
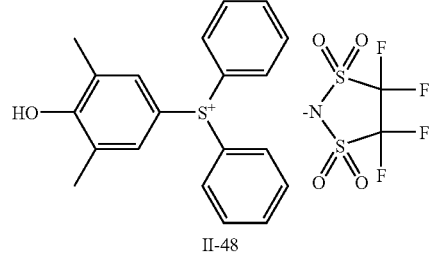
II-48
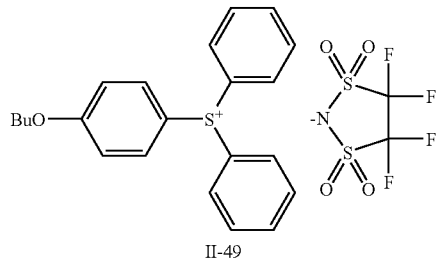
II-49
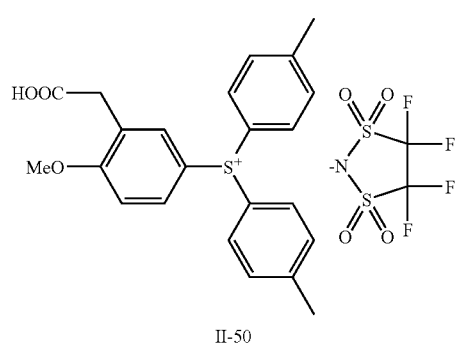
II-50
-continued
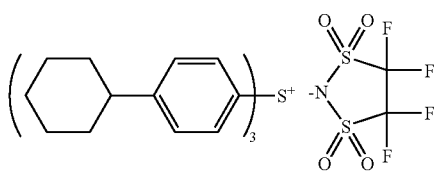
II-51
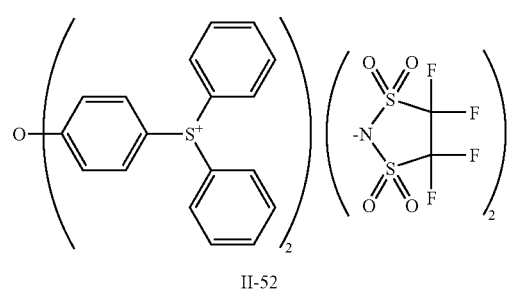
II-52
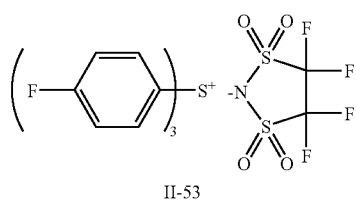
II-53
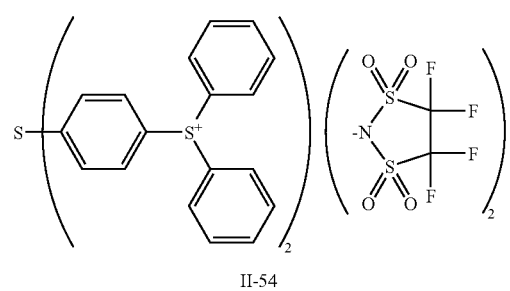
II-54
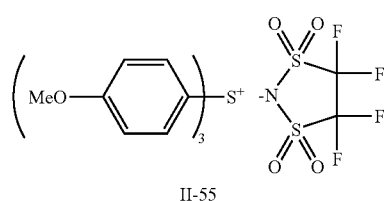
II-55
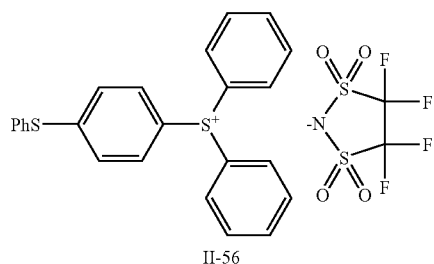
II-56
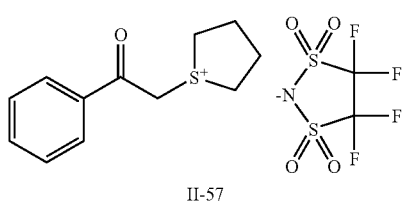
II-57

-continued
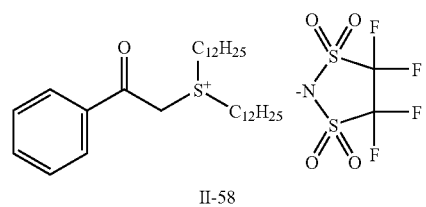
II-58
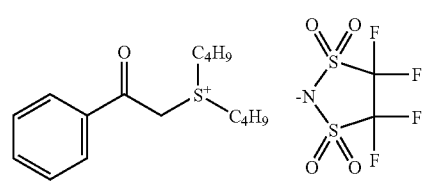
II-59
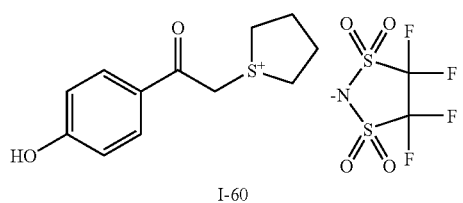
I-60
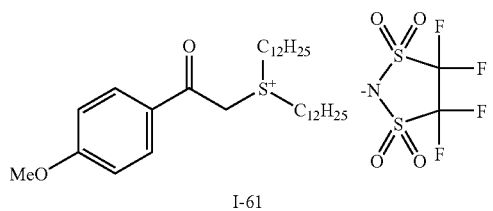
I-61
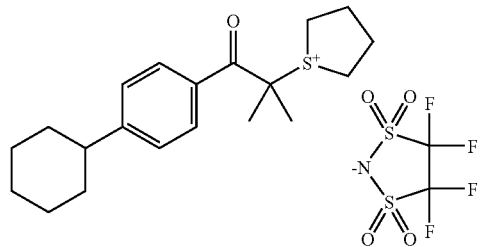
I-62
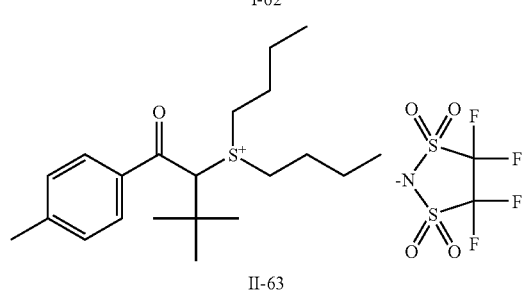
II-63
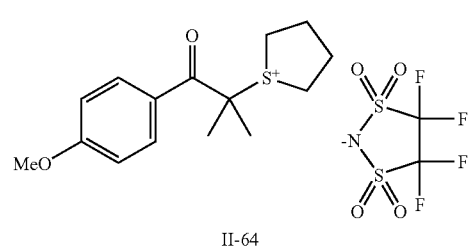
II-64
-continued
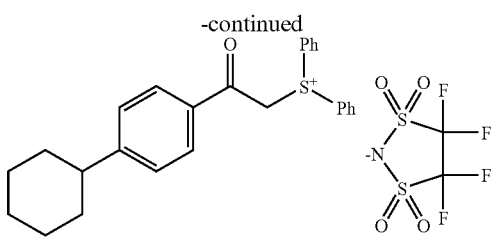
II-65
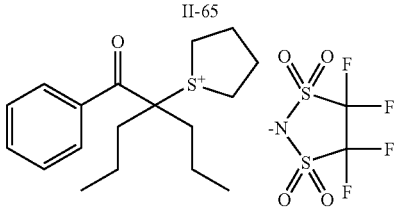
II-66
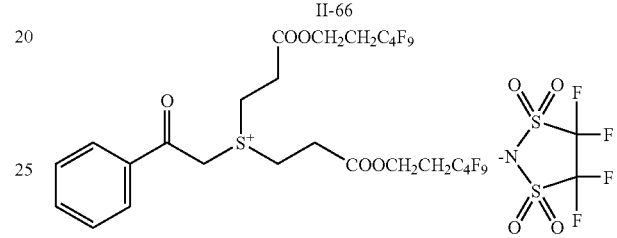
II-67
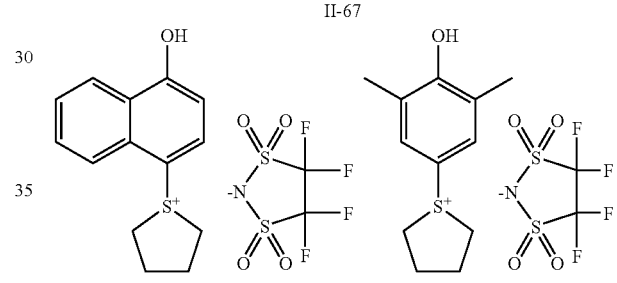
II-68    II-69
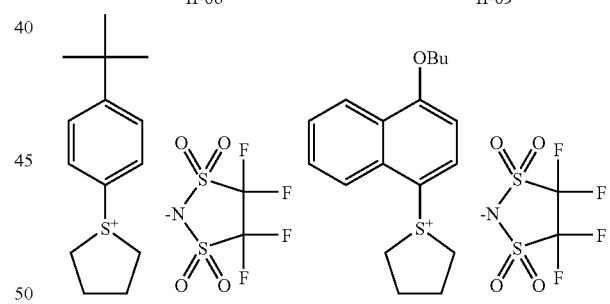
II-70    II-71
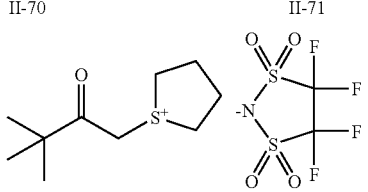
II-72
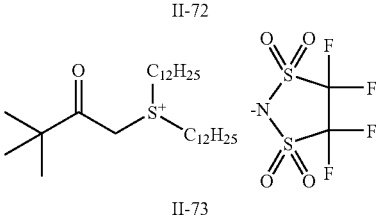
II-73

-continued
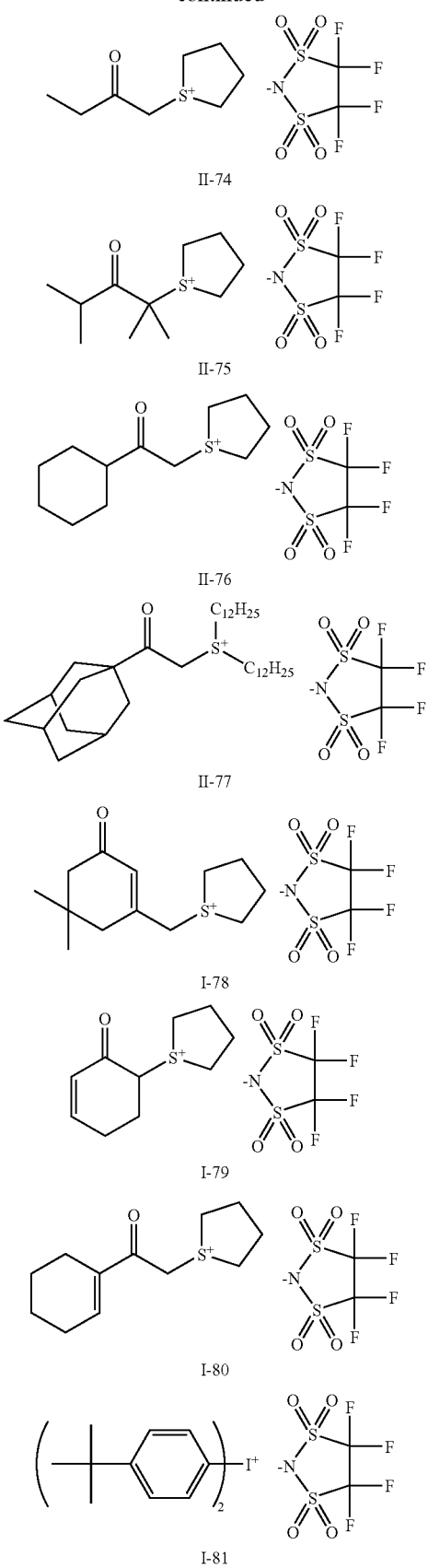
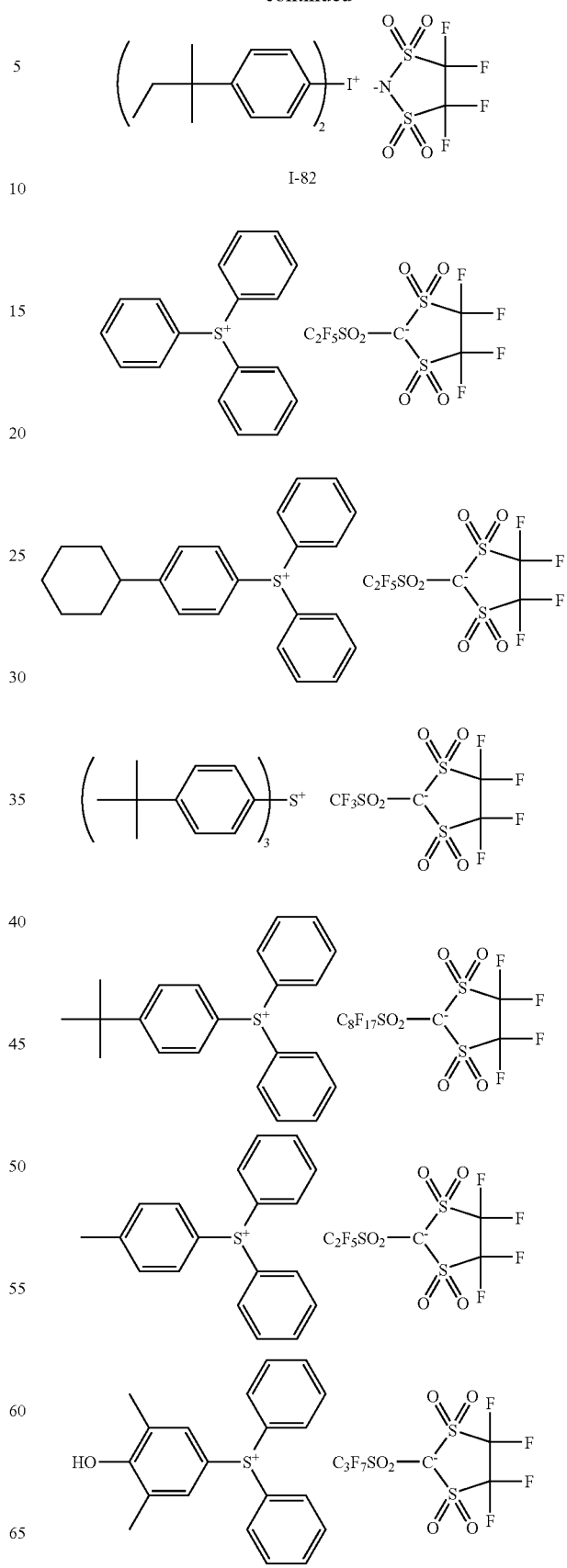

-continued
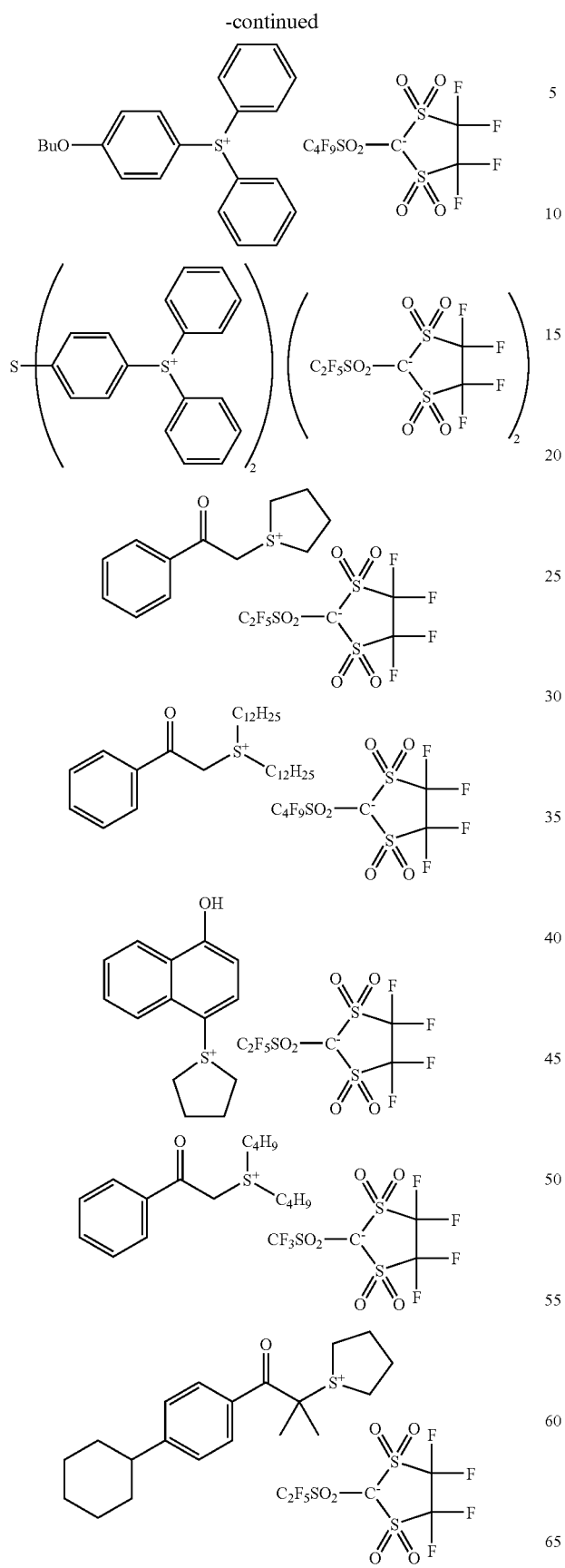
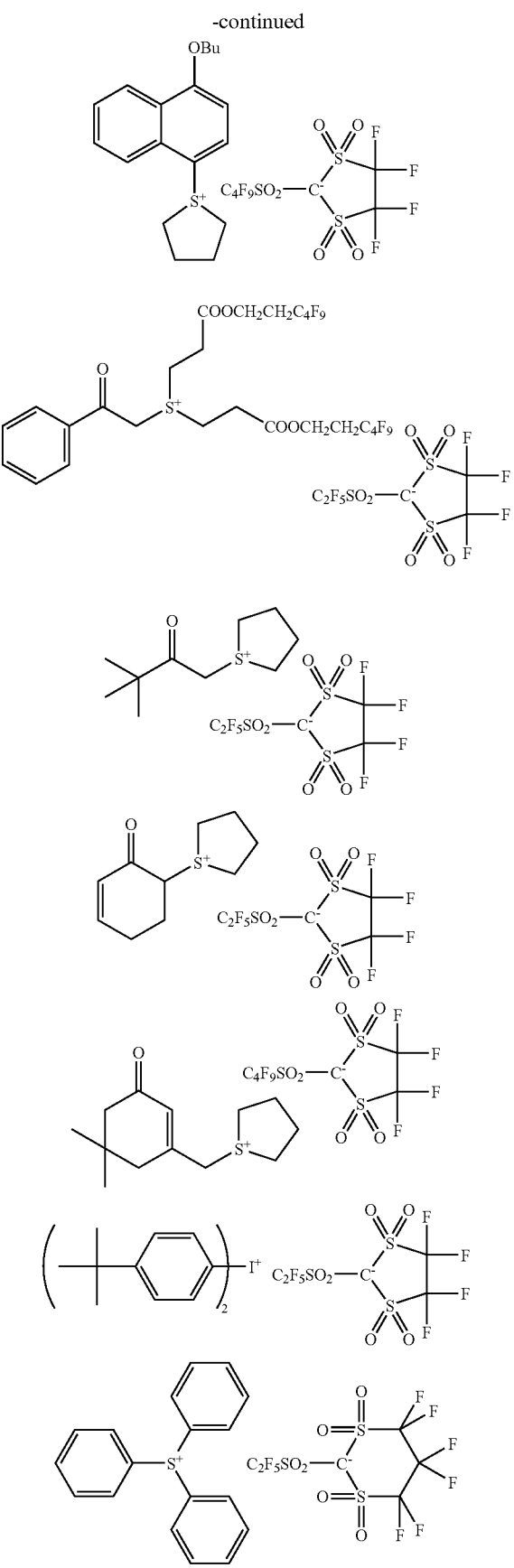

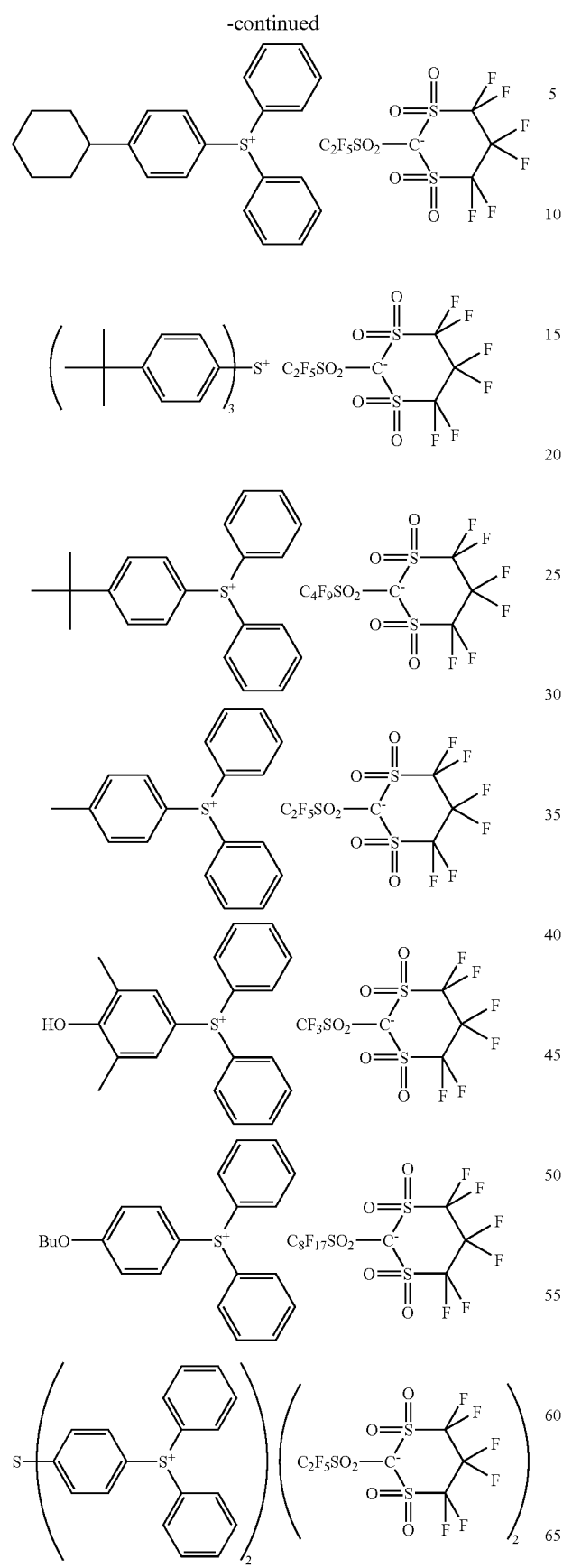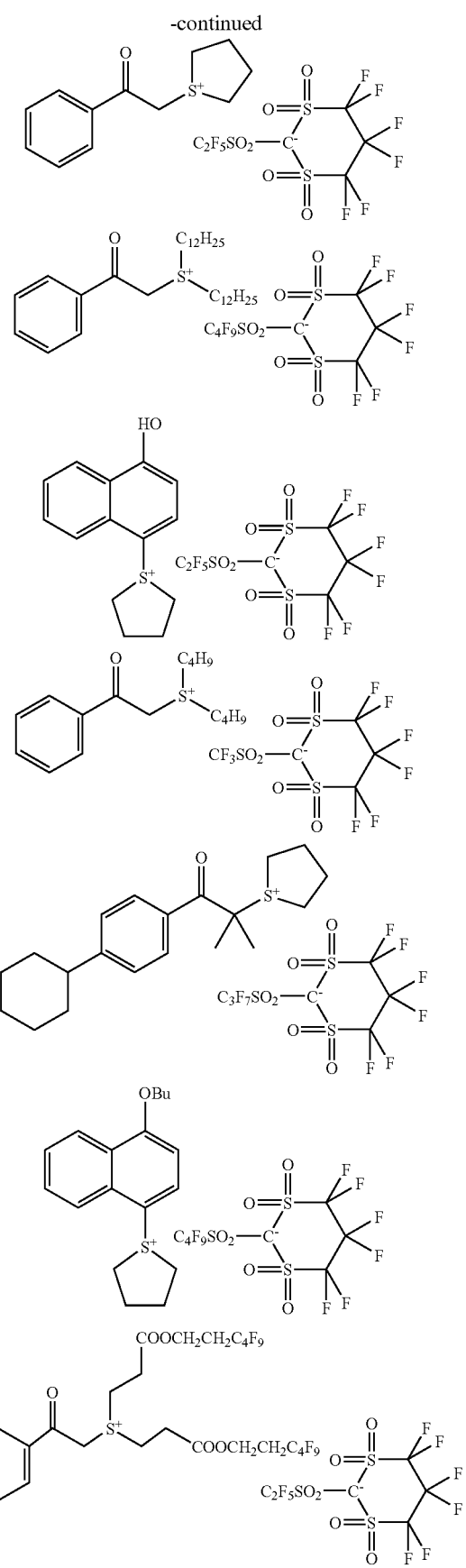

-continued

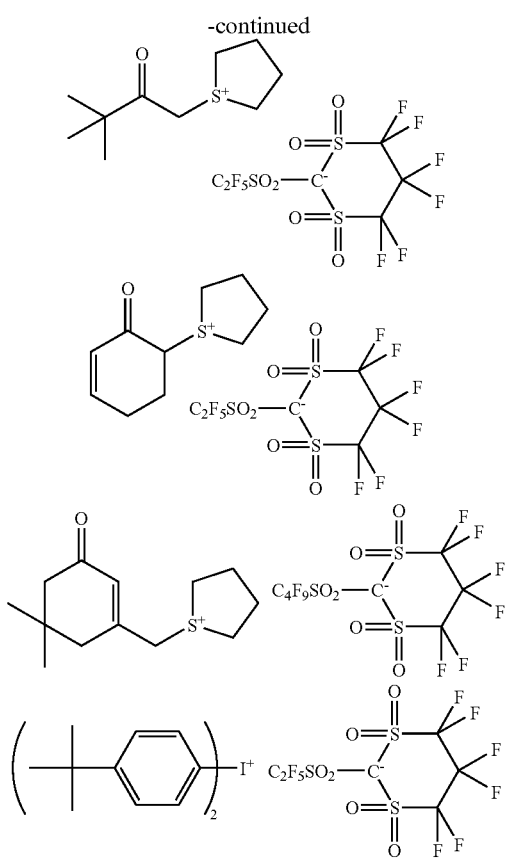

The sulfonium salt or iodonium salt having an anion represented by formula (4) or (5) can be synthesized by salt-exchanging a metal salt or ammonium salt of the anion represented by formula (4) or (5) with a sulfonium salt compound or iodonium salt compound (e.g., halide, acetate, tetrafluoroborate, perchlorate).

The amount added of the compound capable of generating an organic acid represented by formula (2), (3), (3'), (4) or (5) upon irradiation of actinic rays or radiation is, in terms of a total amount, preferably from 0.1 to 20 mass %, more preferably from 0.5 to 10 mass %, still more preferably from 1 to 7 mass %, based on the entire solid content of the resist composition.

[3] Acid Generator Used in Combination

In the present invention, a compound capable of decomposing upon irradiation of actinic rays or radiation to generate an acid (photoacid generator) may be further used in combination other than the above-described compound (B) capable of generating a specific organic acid upon irradiation of actinic rays or radiation.

The amount used of the photoacid generator which can be used in combination is, in terms of the molar ratio (compound (B)/another photoacid generator), usually from 100/0 to 20/80, preferably from 100/0 to 40/60, more preferably from 100/0 to 50/50.

The photoacid generator to be optionally used can be suitably selected from photoinitiators for cationic photopolymerization, photoinitiators for radical photopolymerization, photodecolorants or optical color changers for dyes, known compounds used in microresist formation or the like which generate an acid upon irradiation with an actinic ray or a radiation, and mixtures of two or more thereof.

Examples thereof include diazonium salts, phosphonium salts, sulfonium salts, iodonium salts, imidesulfonates, oximesulfonates, diazodisulfones, disulfones, and o-nitrobenzyl sulfonates.

Also usable are compounds obtained by incorporating any of those groups or compounds which generate an acid upon irradiation with an actinic ray or a radiation into the main chain or side chains of a polymer. Examples thereof are given in, e.g., U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Furthermore, those compounds generating an acid by the action of light which are described in U.S. Pat. No. 3,779,778, European Patent 126,712, etc. can be used.

Preferred examples of the optionally usable compounds which decompose upon irradiation with an actinic ray or a radiation to generate an acid include compounds represented by the following general formulae (ZI), (ZII), and (ZIII).

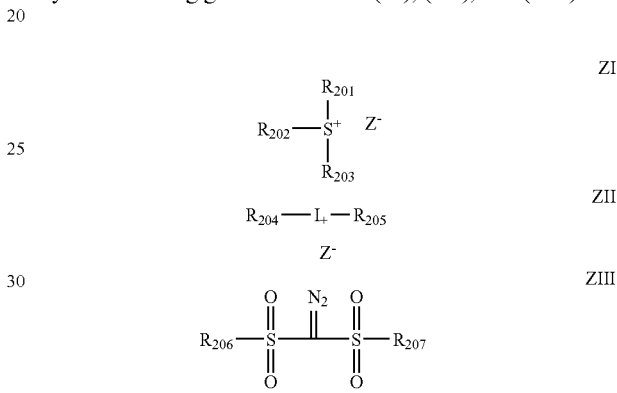

In general formula (ZI), $R_{201}$, $R_{202}$, and $R_{203}$ each independently represents an organic group.

The number of carbon atoms in each of the organic groups represented by $R_{201}$, $R_{202}$, and $R_{203}$ is generally 1 to 30, preferably 1 to 20.

Two of $R_{201}$ to $R_{203}$ may be bonded to each other to form a ring structure, which may contain an oxygen atom, sulfur atom, ester bond, amide bond, or carbonyl group therein.

Examples of the group formed by the bonding of two of $R_{201}$ to $R_{203}$ include alkylene groups (e.g., butylene and pentylene).

$Z^-$ represents a non-nucleophilic anion.

Examples of the non-nucleophilic anion represented by $Z^-$ include a sulfonic acid anion, carboxylic acid anion, sulfonylimide anion, bis(alkylsulfonyl)imide anion, and tris(alkylsulfonyl)methyl anion.

A non-nucleophilic anion is an anion the ability of which to cause a nucleophilic reaction is exceedingly low and which can be inhibited from being decomposed by an intramolecular nucleophilic reaction with the lapse of time. This anion improves the long-term stability of resists.

Examples of the sulfonic acid anion include alkylsulfonic acid anions, arylsulfonic acid anions, and camphorsulfonic acid anions.

Examples of the carboxylic acid anion include alkylcarboxylic acid anions, arylcarboxylic acid anions, and aralkylcarboxylic acid anions.

The alkyl moiety in each of the alkylsulfonic acid anions may be either an alkyl group or a cycloalkyl group. Preferred examples thereof include alkyl groups having 1 to 30 carbon atoms and cycloalkyl groups having 3 to 30 carbon atoms, such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantyl, norbornyl, and bornyl.

The aryl group in each of the arylsulfonic acid anions preferably is an aryl group having 6 to 14 carbon atoms. Examples thereof include phenyl, tolyl, and naphthyl.

Examples of substituents of the alkyl, cycloalkyl, and aryl groups in the alkylsulfonic acid anions and arylsulfonic acid anions include nitro, halogen atoms (fluorine, chlorine, bromine, and iodine atoms), carboxyl, hydroxy, amino, cyano, alkoxy groups (preferably having 1 to 5 carbon atoms), cycloalkyl groups (preferably having 3 to 15 carbon atoms), aryl groups (preferably having 6 to 14 carbon atoms), alkoxycarbonyl groups (preferably having 2 to 7 carbon atoms), acryl groups (preferably having 2 to 12 carbon atoms), and alkoxycarbonyloxy groups (preferably having 2 to 7 carbon atoms). With respect to the aryl groups and ring structures possessed by these groups, examples of the substituents further include alkyl groups (preferably having 1-15 carbon atoms).

Examples of the alkyl moiety in each of the alkylcarboxylic acid anions include the same alkyl groups and cycloalkyl groups as in the alkylsulfonic acid anions.

Examples of the aryl group in each of the arylcarboxylic acid anions include the same aryl groups as in the arylsulfonic acid anions.

Examples of the aralkyl group in each of the aralkylcarboxylic acid anions include aralkyl groups preferably having 6 to 12 carbon atoms, such as benzyl, phenethyl, naphthylmethyl, and naphthylethyl.

Examples of substituents of the alkyl, cycloalkyl, aryl, and aralkyl groups in the alkylcarboxylic acid anions, arylcarboxylic acid anions, and aralkylcarboxylic acid anions include the same halogen atoms and the same alkyl, cycloalkyl, alkoxy, and alkylthio groups as in the arylsulfonic acid anions.

Examples of the sulfonylimide anion include a saccharin anion.

The alkyl groups in the bis(alkylsulfonyl)imide anion and tris(alkylsulfonyl)methyl anion preferably are alkyl groups having 1 to 5 carbon atoms. Examples thereof include methyl, ethyl, propyl, isopropyl, n-butyl, isobutyl, sec-butyl, pentyl, and neopentyl. Examples of substituents of these alkyl groups include halogen atoms, alkyl groups substituted by one or more halogen atoms, alkoxy groups, and alkylthio groups. Preferred are alkyl groups substituted by one or more fluorine atoms.

Other examples of the non-nucleophilic anion include phosphorus fluoride, boron fluoride, and antimony fluoride.

The non-nucleophilic anion represented by $Z^-$ preferably is an alkanesulfonic acid anion in which the sulfonic acid has been substituted in the $\alpha$-position by one or more fluorine atoms, an arylsulfonic acid anion substituted by one or more fluorine atoms or fluorinated groups, a bis(alkylsulfonyl)imide anion in which the alkyl groups have been substituted by one or more fluorine atoms, or a tris(alkylsulfonyl)methide anion in which the alkyl groups have been substituted by one or more fluorine atoms. The non-nucleophilic anion especially preferably is a perfluoroalkanesulfonic acid anion having 4-8 carbon atoms or a benzenesulfonic acid anion having one or more fluorine atoms. Most preferred is a nonafluorobutanesulfonic acid anion, perfluorooctanesulfonic acid anion, pentafluorobenzenesulfonic acid anion, or 3,5-bis(trifluoromethyl)benzenesulfonic acid anion.

Examples of the organic groups represented by $R_{201}$, $R_{202}$, and $R_{203}$ include the corresponding groups in the compounds (Z1-1), (Z1-2), and (Z1-3) which will be described later.

A compound having two or more structures represented by general formula (ZI) may also be used. For example, use may be made of a compound having a structure in which at least one of the $R_{201}$ to $R_{203}$ of a compound represented by general formula (ZI) is bonded to at least one of the $R_{201}$ to $R_{203}$ of another compound represented by general formula (ZI).

More preferred examples of the ingredient (ZI) include the compounds (Z1-1), (Z1-2), and (Z1-3) which will be explained below.

Compound (Z1-1) is an arylsulfonium compound represented by general formula (ZI) wherein at least one of $R_{201}$ to $R_{203}$ is an aryl group, i.e., a compound including an arylsulfonium as a cation.

The arylsulfonium compound may be one in which all of $R_{201}$ to $R_{203}$ are aryl groups, or may be one in which part of $R_{201}$ to $R_{203}$ is an aryl group and the remainder is an alkyl or cycloalkyl group.

Examples of the arylsulfonium compound include triarylsulfonium compounds, diarylalkylsulfonium compounds, and aryldialkylsulfonium compounds.

The aryl group of the arylsulfonium compound preferably is phenyl or naphthyl, and more preferably is phenyl. In the case where the arylsulfonium compound has two or more aryl groups, these aryl groups may be the same or different.

The alkyl group or cycloalkyl group which is optionally possessed by the arylsulfonium compound preferably is a linear or branched alkyl group having 1 to 15 carbon atoms or a cycloalkyl group having 3 to 15 carbon atoms. Examples thereof include methyl, ethyl, propyl, n-butyl, sec-butyl, t-butyl, cyclopropyl, cyclobutyl, and cyclohexyl.

The aryl, alkyl, and cycloalkyl groups represented by $R_{201}$ to $R_{203}$ may have substituents selected from alkyl groups (e.g., ones having 1 to 15 carbon atoms), cycloalkyl groups (e.g., ones having 3 to 15 carbon atoms), aryl groups (e.g., ones having 6 to 14 carbon atoms), alkoxy groups (e.g., ones having 1 to 15 carbon atoms), halogen atoms, hydroxy, and phenylthio. Preferred examples of the substituents are linear or branched alkyl groups having 1 to 12 carbon atoms, cycloalkyl groups having 3 to 12 carbon atoms, and linear, branched, or cyclic alkoxy groups having 1 to 12 carbon atoms. Most preferred are alkyl groups having 1 to 4 carbon atoms and alkoxy groups having 1 to 4 carbon atoms. Any one of $R_{201}$ to $R_{203}$ may have such a substituent or each of $R_{201}$ to $R_{203}$ may have such a substituent. In the case where $R_{201}$ to $R_{203}$ are aryl groups, it is preferred that a substituent be bonded to the p-position in each aryl group.

Next, compound (Z1-2) will be explained.

Compound (Z1-2) is a compound represented by formula (ZI) wherein $R_{201}$ to $R_{203}$ each independently represents an organic group containing no aromatic ring. The term aromatic ring herein implies any of aromatic rings including ones containing one or more heteroatoms.

The organic groups containing no aromatic ring which are represented by $R_{201}$ to $R_{203}$ each have generally 1 to 30, preferably 1 to 20 carbon atoms.

Preferably, $R_{201}$ to $R_{203}$ each independently are an alkyl, cycloalkyl, allyl, or vinyl group. $R_{201}$ to $R_{203}$ each more preferably are a linear or branched 2-oxoalkyl, 2-oxocycloalkyl, or alkoxycarbonylmethyl group, and most preferably are a linear or branched 2-oxoalkyl group.

Preferred examples of the alkyl groups and cycloalkyl groups represented by $R_{201}$ to $R_{203}$ include linear or branched alkyl groups having 1 to 10 carbon atoms (e.g., methyl, ethyl, propyl, butyl, and pentyl) and cycloalkyl groups having 3 to 10 carbon atoms (e.g., cyclopentyl, cyclohexyl, and norbornyl). More preferred examples of the alkyl groups include 2-oxoalkyl groups and alkoxycarbonylmethyl groups. More preferred examples of the cycloalkyl groups include 2-oxocycloalkyl groups.

The 2-oxoalkyl groups may be either linear or branched. Preferred examples thereof include the alkyl groups enumerated above which each have >C=O in the 2-position.

Preferred examples of the 2-oxocycloalkyl groups include the cycloalkyl groups enumerated above which each have >C=O in the 2-position.

Examples of the alkyl groups in the alkoxycarbonylmethyl groups include alkyl groups preferably having 1 to 5 carbon atoms (methyl, ethyl, propyl, butyl, and pentyl).

$R_{201}$ to $R_{203}$ may have been further substituted by substituents selected from halogen atoms, alkoxy groups (e.g., ones having 1 to 5 carbon atoms), hydroxy, cyano, and nitro.

Two of $R_{201}$ to $R_{203}$ may be bonded to each other to form a ring structure, which may contain an oxygen atom, sulfur atom, ester bond, amide bond, or carbonyl group therein. Examples of the group formed by the bonding of two of $R_{201}$ to $R_{203}$ include alkylene groups (e.g., butylene and pentylene).

Compound (Z1-3) is a compound represented by the following general formula (Z1-3). Namely, it is a compound having a phenacylsulfonium salt structure.

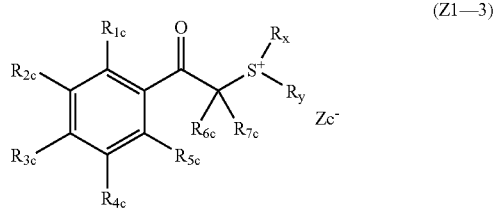

(Z1—3)

$R_{1C}$ to $R_{5C}$ each independently represents a hydrogen atom, alkyl, cycloalkyl, or alkoxy group, or halogen atom.

$R_{6C}$ and $R_{7C}$ each represent a hydrogen atom or an alkyl or cycloalkyl group.

$R_x$ and $R_y$ each independently represents an alkyl, cycloalkyl, allyl, or vinyl group.

Two or more of $R_{1C}$ to $R_{5C}$ may be bonded to each other to form a ring structure, and $R_x$ and $R_y$ may be bonded to each other to form a ring structure. These ring structures may contain an oxygen atom, sulfur atom, ester bond, or amide bond.

$Zc^-$ represents a non-nucleophilic anion. Examples thereof include the same non-nucleophilic anions as those enumerated above as examples of $X^-$ in general formula (ZI).

The alkyl groups represented by $R_{1C}$ to $R_{5C}$ may be either linear or branched. Examples thereof include alkyl groups having 1 to 20 carbon atoms, preferably, linear or branched alkyl groups having 1 to 12 carbon atoms (e.g., methyl, ethyl, linear or branched propyl, linear or branched butyl, and linear or branched pentyl). Examples of the cycloalkyl groups include cycloalkyl groups having 3 to 8 carbon atoms (e.g., cyclopentyl and cyclohexyl).

The alkoxy groups represented by $R_{1C}$ to $R_{5C}$ may be either linear or branched or cyclic. Examples thereof include alkoxy groups having 1 to 10 carbon atoms. Preferred examples thereof include linear or branched alkoxy groups having 1 to 5 carbon atoms (e.g., methoxy, ethoxy, linear or branched propoxy, linear or branched butoxy, and linear or branched pentoxy) and cyclic alkoxy groups having 3 to 8 carbon atoms (e.g., cyclopentyloxy and cyclohexyloxy).

It is preferred that any of $R_{1C}$ to $R_{5C}$ be a linear or branched alkyl group, cycloalkyl group, or linear, branched, or cyclic alkoxy group. It is more preferred that the total number of carbon atoms in $R_{1C}$ to $R_{5C}$ be from 2 to 15. This compound has further improved solubility in solvents and is inhibited from generating particles during storage.

Examples of the alkyl groups and cycloalkyl groups represented by $R_x$ and $R_y$ include the same alkyl groups and cycloalkyl groups as those enumerated above as examples of $R_{1C}$ to $R_{5C}$. More preferred are 2-oxoalkyl groups, 2-oxocycloalkyl groups, and alkoxycarbonylmethyl groups.

Examples of the 2-oxoalkyl groups and 2-oxocycloalkyl groups include those alkyl and cycloalkyl groups represented by $R_{1C}$ to $R_{5C}$ which each have >C=O in the 2-position.

Examples of the alkoxy groups in the alkoxycarbonylmethyl groups include the same alkoxy groups as those enumerated above as examples of $R_{1C}$ to $R_{5C}$.

Examples of the group formed by the bonding of $R_x$ and $R_y$ include butylene and pentylene.

$R_x$ and $R_y$ each preferably are an alkyl or cycloalkyl group having 4 or more carbon atoms, and more preferably are an alkyl or cycloalkyl group having 6 or more, especially 8 or more carbon atoms.

In general formulae (ZII) and (ZIII, $R_{204}$ to $R_{207}$ each independently represents an aryl, alkyl, or cycloalkyl group.

The aryl groups represented by $R_{204}$ to $R_{207}$ preferably are phenyl or naphthyl, and more preferably are phenyl.

Preferred examples of the alkyl groups and cycloalkyl groups represented by $R_{204}$ to $R_{207}$ include linear or branched alkyl groups having 1-10 carbon atoms (e.g., methyl, ethyl, propyl, butyl, and pentyl) and cycloalkyl groups having 3-10 carbon atom (e.g., cyclopentyl, cyclohexyl, and norbornyl).

Examples of substituents which may be possessed by $R_{204}$ to $R_{207}$ include alkyl groups (e.g., ones having 1 to 15 carbon atoms), cycloalkyl groups (e.g., ones having 3 to 15 carbon atoms), aryl groups (e.g., ones having 6-15 carbon atoms), alkoxy groups (e.g., ones having 1 to 15 carbon atoms), halogen atoms, hydroxy, and phenylthio.

$Z^-$ represents a non-nucleophilic anion, and examples thereof include the same non-nucleophilic anions as those enumerated above as examples of $Z^-$ in general formula (ZI).

Other preferred examples of the optionally usable compounds which decompose upon irradiation with an actinic ray or a radiation to generate an acid include compounds represented by the following general formulae (ZIV), (ZV), and (ZVI).

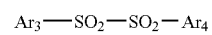

ZIV

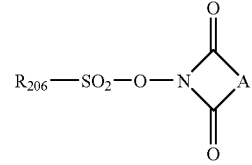

ZV

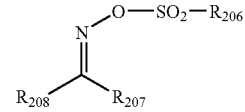

ZVI

In general formulae (ZIV) to (ZVI), $Ar_3$ and $Ar_4$ each independently represents an aryl group.

$R_{206}$, $R_{207}$, and $R_{208}$ each represent an alkyl, cycloalkyl, or aryl group.

Symbol A represents an alkylene, alkenylene, or arylene group.

Even more preferred of the optionally usable compounds which decompose upon irradiation with an actinic ray or a radiation to generate an acid are the compounds represented by general formulae (ZI) to (ZIII).

Preferred optionally usable compounds which decompose upon irradiation with an actinic ray or a radiation to generate an acid are compounds which generate a sulfonic acid having one sulfo group. More preferred are compounds which generate a monobasic perfluoroalkanesulfonic acid and compounds which generate an aromatic sulfonic acid substituted by one or more fluorine atoms or fluorinated groups. Especially preferred are sulfonium salts of monobasic perfluoroalkanesulfonic acids.

Especially preferred examples of the optionally usable compounds which decompose upon irradiation with an actinic ray or a radiation to generate an acid are shown below.

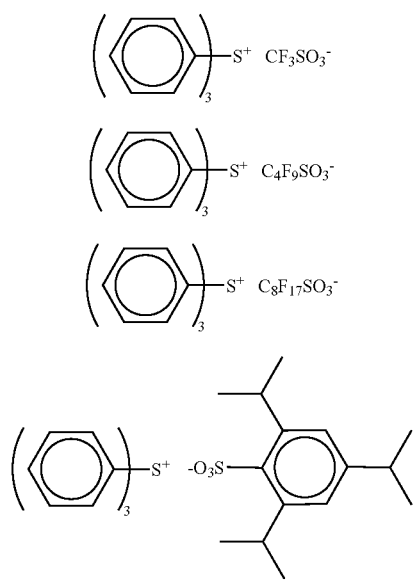

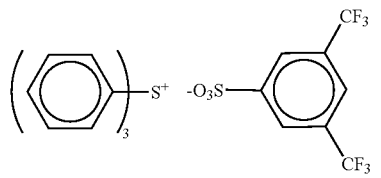

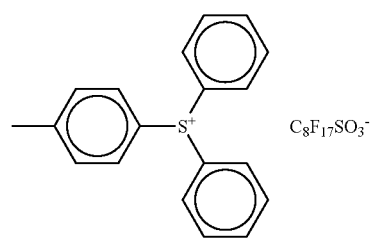

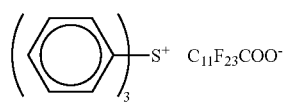

-continued

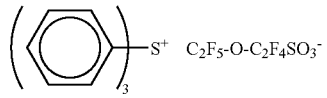

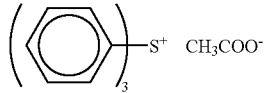

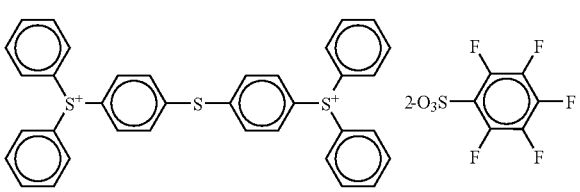

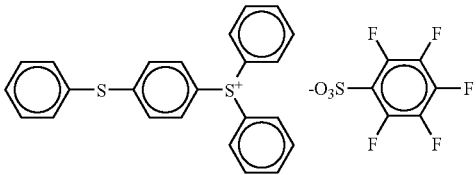

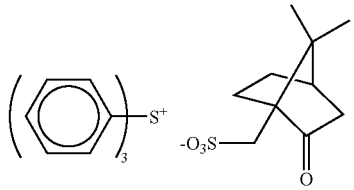

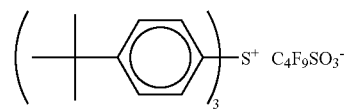

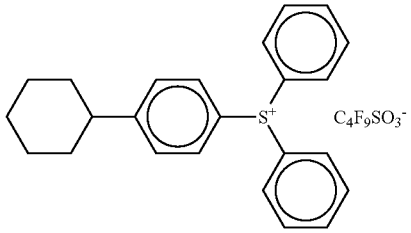

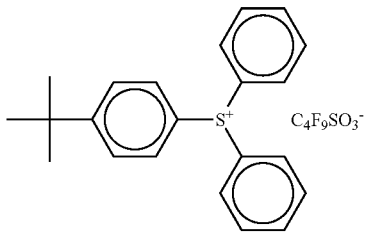

-continued

-continued (z35) (z36) (z37) (z38) (z39) (z40) (z41) (z42)

-continued (z43) (z44) (z45) (z46) (z47) (z48) (z49)

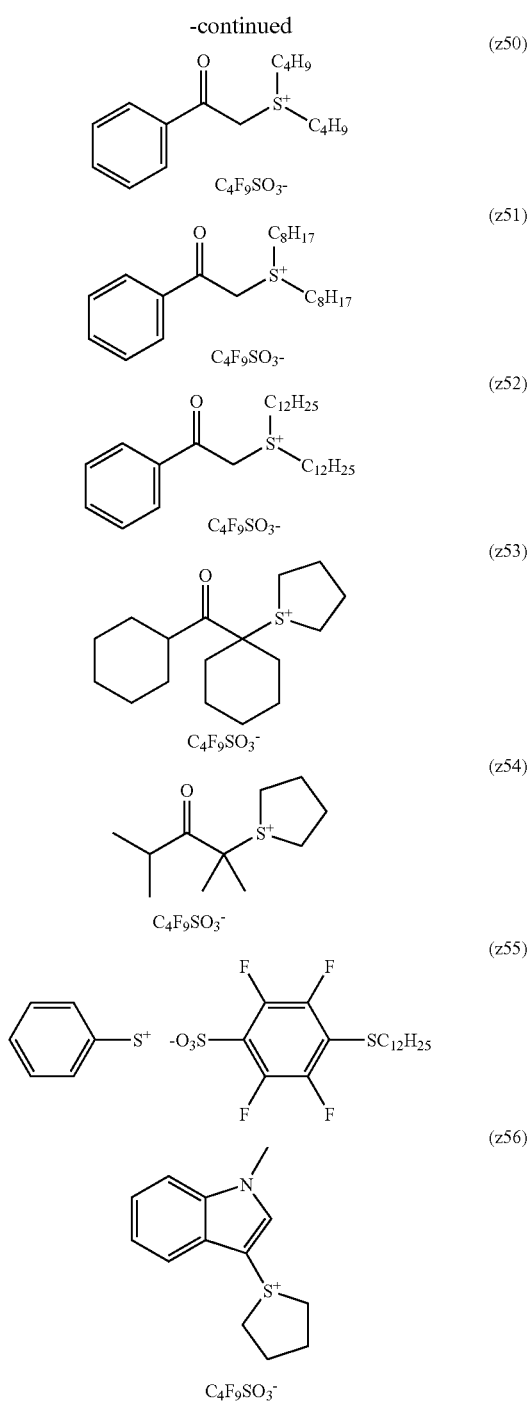

[4] Organic Solvent

The positive resist composition of the present invention is used by dissolving the above-described components in a predetermined organic solvent.

Examples of the organic solvent which can be used include propylene glycol monomethyl ether acetate (PGMEA), propylene glycol monomethyl ether (PGME), ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone, methoxybutanol and tetrahydrofuran.

The solvent for use in the present invention is preferably a solvent having at least one ketone structure.

The solvent having a ketone structure includes a chain ketone solvent and a cyclic ketone solvent, and a compound having a total carbon number of 5 to 8 is preferred because of good coatability.

Examples of the chain ketone solvent include 2-heptanone, methyl ethyl ketone and methyl isobutyl ketone. Among these, 2-heptanone is preferred.

Examples of the cyclic ketone solvent include cyclopentanone, 3-methyl-2-cyclopentanone, cyclohexanone, 2-methylcyclohexanone, 2,6-dimethylcyclohexanone, cycloheptanone, cyclooctanone and isophorone. Among these, cyclohexanone and cycloheptanone are preferred.

The solvent is preferably used as a sole solvent having a ketone structure or as a mixed solvent with another solvent. Examples of the solvent mixed (solvent used in combination) include propylene glycol monoalkyl ether carboxylate, alkyl lactate, propylene glycol monoalkyl ether, alkyl alkoxypropionate and a lactone compound.

Examples of the propylene glycol monoalkyl ether carboxylate include propylene glycol monomethyl ether acetate, propylene glycol monomethyl ether propionate and propylene glycol monoethyl ether acetate.

Examples of the alkyl lactate include methyl lactate and ethyl lactate.

Examples of the propylene glycol monoalkyl ether include propylene glycol monomethyl ether and propylene glycol monoethyl ether.

Examples of the alkyl alkoxypropionate include methyl methoxypropionate, ethyl methoxypropionate, methyl ethoxypropionate and ethyl ethoxypropionate.

Examples of the lactone compound include γ-butyrolactone.

Among these, the solvent used in combination is preferably propylene glycol monoalkyl ether carboxylate, alkyl lactate or propylene glycol monoalkyl ether, more preferably propylene glycol monomethyl ether acetate.

By mixing the ketone-based solvent with the solvent used in combination, for example, adhesion to substrate, developability and DOF are improved.

The ratio (by mass) between the ketone-based solvent and the solvent used in combination is preferably from 10/90 to 95/5, more preferably from 20/80 to 80/20, still more preferably from 30/70 to 70/30.

Also, from the standpoint of enhancing the film thickness uniformity or development defect performance, a high boiling point solvent having a boiling point of 200° C. or more, such as ethylene carbonate and propylene carbonate, may be mixed.

The amount added of such a high boiling point solvent is usually from 0.1 to 15 mass %, preferably from 0.5 to 10 mass %, more preferably from 1 to 5 mass %.

By using such a ketone-based solvent alone or using a mixed solvent with another solvent, a resist composition is prepared to have a solid content concentration of usually from 3 to 25 mass %, preferably from 5 to 22 mass %, more preferably from 5 to 15 mass %.

[5] Dissolution Inhibiting Compound Having a Molecular Weight of 3,000 or Less and Capable of Decomposing Under the Action of an Acid to Increase the Solubility in an Alkali Developer The positive resist composition of the present invention may contain a dissolution inhibiting compound having a molecular weight of 3,000 or less and capable of decomposing under the action of an acid to increase the solubility in an alkali developer (hereinafter sometimes referred to as a "dissolution inhibiting compound").

In order to prevent reduction in the transmittance at 220 nm or less, the dissolution inhibiting compound having a molecular weight of 3,000 or less and capable of decomposing under the action of an acid to increase the solubility in an alkali developer is preferably an alicyclic or aliphatic compound containing an acid-decomposable group, such as acid-decomposable group-containing cholic acid derivative described in *Proceeding of SPIE*, 2724, 355 (1996). Examples of the acid-decomposable group and the alicyclic structure include those described above regarding the alicyclic hydrocarbon-based acid-decomposable resin.

The molecular weight of the dissolution inhibiting compound for use in the present invention is 3,000 or less, preferably from 300 to 3,000, more preferably from 500 to 2,500.

The amount added of the dissolution inhibiting compound is preferably from 1 to 30 mass %, more preferably from 2 to 20 mass %, based on the solid content of the resist composition.

Specific examples of the dissolution inhibiting compound are set forth below, but the present invention is not limited thereto.

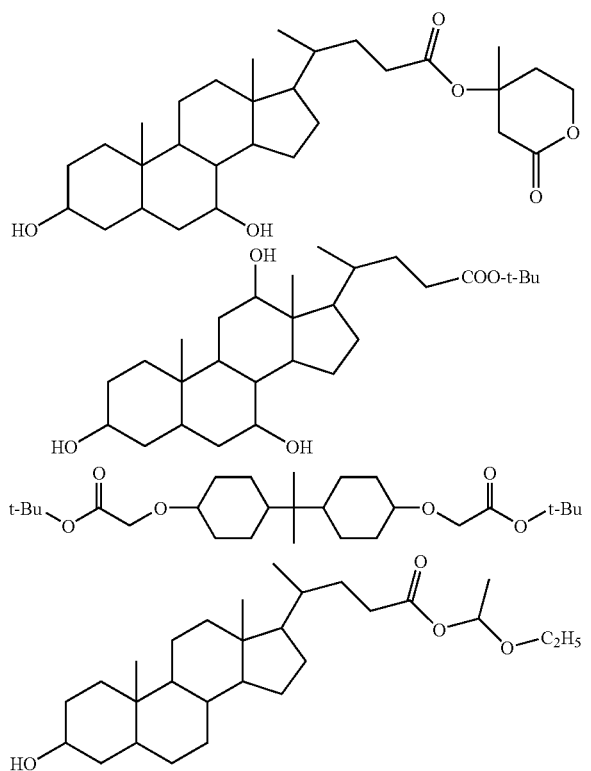

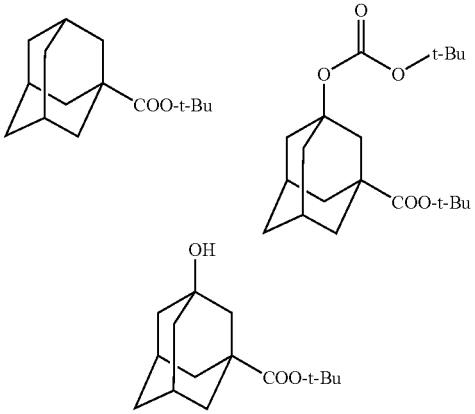

[6] Basic Compound

The positive resist composition of the present invention preferably further contains a basic compound. Examples of the basic compound include a nitrogen-containing basic compound such as organic amine, basic ammonium salt, basic sulfonium salt and basic iodonium salt, and the basic compound may be sufficient if it does not deteriorate sublimation or resist performance.

The basic compound is a component having a function of suppressing a phenomenon that the acid generated from the acid generator upon exposure diffuses in the resist film, and preventing occurrence of an undesired chemical reaction in the non-exposed region. When such a basic compound is blended, the acid generated from the acid generator upon exposure is prevented from a diffusion phenomenon in the resist film and the storage stability of the obtained radiation-sensitive resin composition is enhanced. Furthermore, not only the resolution as a resist in more enhanced but also the resist pattern can be prevented from change in the line width due to fluctuation of the post-exposure time delay (PED) from exposure to development, and a composition having very excellent process stability can be obtained.

As for the basic compound, an organic amine can be used, and examples thereof include primary, secondary or tertiary aliphatic amines, aromatic amines, heterocyclic amines, a nitrogen-containing compound having a carboxy group, a nitrogen-containing compound having a sulfonyl group, a nitrogen-containing compound having a hydroxyl group, a nitrogen-containing having a hydroxyphenyl group, an alcoholic nitrogen-containing compound, an amide derivative and an imide derivative.

Examples of the aliphatic amines include methylamine, ethylamine, n-propylamine, isopropylamine, n-butylamine, isobutylamine, sec-butylamine, tert-butylamine, pentylamine, tert-amylamine, cyclopentylamine, hexylamine, cyclo-hexylamine, heptylamine, octylamine, nonylamine, decylamine, dodecylamine, cetylamine, methylenediamine, ethylenediamine, tetraethylenepentamine, dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, trimethylamine, triethylamine, tri-n-propylamine, triisopropylamine, tri-n-butylamine, trisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, dimethylethylamine, methylethylpropylamine, benzylamine, phenethylamine and benzyldimethylamine. Examples of the aromatic amines and heterocyclic amines include an aniline derivative (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine), diphenyl(p-tolyl)amine, methyldiphenylamine, triphenylamine, phenylenediamine, naphthylamine, diaminonaphthalene, a pyrrole derivative (e.g., pyrrole, 2H-pyrrole, 1-methylpyrrole, 2,4-dimethylpyrrole, 2,5-dimethylpyrrole, N-methylpyrrole), an oxazole derivative (e.g., oxazole, isoxazole), a thiazole derivative (e.g., thiazole, isothiazole), an imidazole derivative (e.g., imidazole, 4-methylimidazole, 4-methyl-2-phenylimidazole), a pyrazole derivative, a furazan derivative, a pyrroline derivative (e.g., pyrroline, 2-methyl-1-pyrroline), a pyrrolidine derivative (e.g., pyrrolidine, N-methylpyrrolidine, pyrrolidinone, N-methylpyrrolidone), an imidazoline derivative, an imidazolidine derivative, a pyridine derivative (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, dimethylaminopyridine), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (e.g., quinoline, 3-quinolinecarbonitrile), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, a uracil derivative and a uridine derivative. Examples of the nitrogen-containing compound having a carboxy group include an aminobenzoic acid, an indolecarboxylic acid, and an amino acid derivative (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, methoxyalanine). Examples of the nitrogen-containing compound having a sulfonyl group include 3-pyridinesulfonic acid and pyridinium p-toluenesulfonate. Examples of the nitrogen-containing compounds having a hydroxyl group include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl) pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide and N-(2-hydroxyethyl) isonicotinamide. Examples of the amide derivative include formamide, N-methylformamide, N,N-dimethylformamide, acetamide, N-methylacetamide, N,N-dimethylacetamide, propionamide and benzamide. Examples of the imide derivative include phthalimide, succinimide and maleimide.

Specific examples of the base having a cyano group include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-amino-propiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis (2-methoxyethyl)-3-aminopropionate, cyanomethyl N,N-bis [2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate and 2-cyanoethyl 4-morpholinepropionate.

Preferred examples of the nitrogen-containing basic compound include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidines, hexamethylenetetramine, imidazoles, hyroxypyridines, pyridines, anilines, hydroxyalkylanilines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, tri-i-octylamine, tris(ethylhexyl)amine, tridecylamine, tridodecylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)-propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, N,N,N',N'-tetrakis(2-hydroxypropyl)ethylenediamine, tri(cyclo)alkylamines (e.g., tricyclohexylamine), aromatic amines (e.g., aniline, N-methylaniline, N,N-dimethylaniline, 2-methylaniline, 3-methylaniline, 4-methylaniline, 4-nitroaniline, diphenylamine, triphenylamine, naphthylamine, 1,6-diisopropylaniline), polyethyleneimine, polyallylamine, a polymer of 2-dimethylaminoethylacrylamide, N-tert-butoxycarbonyl di-n-octylamine, N-tert-butoxycarbonyl di-n-nonylamine, N-tert-butoxycarbonyl di-n-decylamine, N-tert-butoxycarbonyl dicyclohexylamine, N-tert-butoxycarbonyl-1-adamantylamine, N-tert-butoxycarbonyl-N-methyl-1-adamantylamine, N,N-di-tert-butoxycarbonyl-1-adamantylamine, N,N-di-tert-butoxycarbonyl-N-methyl-1-adamantylamine, N-tert-butoxycarbonyl-4,4'-diaminodiphenylmethane, N,N'-di-tert-butoxycarbonylhexamethylenediamine, N,N,N'N'-tetra-tert-butoxycarbonylhexamethylenediamine, N,N'-di-tert-butoxycarbonyl-1,7-diaminoheptane, N,N'-di-tert-butoxycarbonyl-1,8-diaminooctane, N,N'-di-tert-butoxycarbonyl-1,9-diaminononane, N,N'-di-tert-butoxycarbonyl-1,10-diaminodecane, N,N'-di-tert-butoxycarbonyl-1,12-diaminododecane, N,N'-di-tert-butoxycarbonyl-4,4'-diaminodiphenylmethane, N-tert-butoxycarbonylbenzimidazole, N-tert-butoxycarbonyl-2-methylbenzimidazole, N-tert-butoxycarbonyl-2-phenylbenzimidazole, formamide, N-methylformamide, N,N-dimethylformamide, acetamide, N-methylacetamide, N,N-dimethylacetamide, propionamide, benzamide, pyrrolidone, N-methylpyrrolidone, urea, methylurea, 1,1-dimethylurea, 1,3-dimethylurea, 1,1,3,3-tetramethylurea, 1,3-diphenylurea, tri-n-butylthiourea, imidazoles (e.g., imidazole, 4-methylimidazole, 4-methyl-2-phenylimidazole, benzimidazole, 2-phenylbenzimidazole), pyridines (e.g., pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, acridine), piperazines (e.g., piperazine, 1-(2-hydroxyethyl)piperazine), pyrazine, pyrazole, pyridazine, quinoxaline, purine, pyrrolidine, piperidine, 3-piperidino-1,2-propanediol, morpholine, 4-methylmorpholine, 1,4-dimethylpiperazine and 1,4-diazabicyclo[2.2.2]octane.

Among these, an organic amine is preferred, such as 1,5-diazabicyclo[4.3.0]-5-nonene, 1,8-diazabicyclo[5.4.0]-7-undecene, 1,4-diazabicyclo[2.2.2]octane, 4-dimethyl-aminopyridine, 1-naphthylamine, piperidine, 4-hydroxypiperidine, 2,2,6,6-tetramethyl-4-hydroxypiperidine, hexamethylenetetramine, imidazoles, hydroxypyridines, pyridines, 4,4'-diaminodiphenylether, triethylamine, tributylamine, tripentylamine, tri-n-octylamine, tris(ethylhexyl)amine, tridodecylamine, N,N-dihydroxyethylaniline and N-hydroxyethyl-N-ethylaniline.

One nitrogen-containing basic compound may be used alone or two or more nitrogen-containing basic compounds may be used in combination. It is preferred to use two or more nitrogen-containing basic compounds.

The positive resist composition of the present invention preferably further contains an ammonium salt compound. Specific examples of the ammonium salt include, but are not limited to, the following compounds.

Specific examples thereof include ammonium hydroxide, ammonium triflate, ammonium pentaflate, ammonium heptaflate, ammonium nonaflate, ammonium undecaflate, ammonium tridecaflate, ammonium pentadecaflate, ammonium methylcarboxylate, ammonium ethylcarboxylate, ammonium propylcarboxylate, ammonium butylcarboxylate, ammonium heptylcarboxylate, ammonium hexylcarboxylate, ammonium octylcarboxylate, ammonium nonylcarboxylate, ammonium decylcarboxylate, ammonium undecylcarboxylate, ammonium dodecadecyl-carboxylate, ammonium tridecylcarboxylate, ammonium tetradecylcarboxylate, ammonium pentadecylcarboxylate, ammonium hexadecylcarboxylate, ammonium heptadecylcarboxylate and ammonium octadecylcarboxylate.

Specific examples of the ammonium as used above include tetramethylammonium, tetraethylammonium hydroxide, tetrapropylammonium hydroxide, tetrabutylammonium hydroxide, tetrapentylammonium hydroxide, tetrahexylammonium hydroxide, tetraheptylammonium hydroxide, methyltrioctylammonium hydroxide, tetraoctylammonium hydroxide, didecyldimethyl-ammonium hydroxide, tetrakisdecylammonium hydroxide, dodecyltrimethylammonium hydroxide, dodecylethyldimethylammonium hydroxide, didodecyldimethylammonium hydroxide, tridodecylmethylammonium hydroxide, myristylmethylammonium hydroxide, dimethylditetradecylammonium hydroxide, hexadecyltrimethylammonium hydroxide, octadecyltrimethylammonium hydroxide, dimethyldioctadecylammonium hydroxide, tetraoctadecylammonium hydroxide, diallyldimethylammonium hydroxide, (2-chloroethyl)trimethylammonium hydroxide, (2-bromoethyl)trimethylammonium hydroxide, (3-bromopropyl)trimethylammonium hydroxide, (3-bromopropyl)triethylammonium hydroxide, glycidyl trimethylammonium hydroxide, choline hydroxide, (R)-(+)-(3-chloro-2-hydroxypropyl)trimethylammonium hydroxide, (S)-(−)-(3-chloro-2-hydroxypropyl)trimethylammonium hydroxide, (3-chloro-2-hydroxypropyl)trimethylammonium hydroxide, (2-aminoethyl)trimethylammonium hydroxide, hexamethonium hydroxide, decamethonium hydroxide, 1-azonia-propellane hydroxide, petronium hydroxide, 2-chloro-1,3-dimethyl-2-imidazolinium hydroxide and 3-ethyl-2-methyl-2-thiazolinium hydroxide.

That is, as for the ammonium hydroxide, specific examples thereof include tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraheptylammonium hydroxide, methyltrioctylammonium hydroxide, tetraoctylammonium hydroxide, didecyldimethylammonium hydroxide, tetrakis-decylammonium hydroxide, dodecyltrimethylammonium hydroxide, dodecylethyldimethylammonium hydroxide, didodecyldimethylammonium hydroxide, tridodecylmethylammonium hydroxide, myristylmethylammonium hydroxide, dimethylditetradecylammonium hydroxide, hexadecyltrimethylammonium hydroxide, octadecyltrimethylammonium hydroxide, dimethyldioctadecylammonium hydroxide, tetraoctadecylammonium hydroxide, diallyldimethylammonium hydroxide, (2-chloroethyl)trimethylammonium hydroxide, (2-bromoethyl)trimethylammonium hydroxide, (3-bromopropyl)trimethylammonium hydroxide, (3-bromopropyl)triethylammonium hydroxide, glycidyl trimethylammonium hydroxide, choline hydroxide, (R)-(+)-(3-chloro-2-hydroxypropyl)trimethylammonium hydroxide, (S)-(−)-(3-chloro-2-hydroxypropyl)trimethylammonium hydroxide, (3-chloro-2-hydroxypropyl)trimethylammonium hydroxide, (2-aminoethyl)trimethylammonium hydroxide, hexamethonium hydroxide, decamethonium hydroxide, 1-azonia-propellane hydroxide, petronium hydroxide, 2-chloro-1,3-dimethyl-2-imidazolinium hydroxide and 3-ethyl-2-methyl-2-thiazolinium hydroxide.

The amount used of the organic amine or basic ammonium salt is, in terms of the total amount, preferably from 0.001 to 10 mass %, more preferably from 0.01 to 5 mass %, based on the solid content of the positive resist composition. The amount used is preferably 0.001 mass % or more in view of sufficient high effect and preferably 10 mass % or less in view of sensitivity and developability of the non-exposed part.

(7) Surfactant

Examples of the surfactant for use in the positive composition of the present invention include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Examples of the commercially available product for these surfactants include a fluorine-containing surfactant and a silicon-containing surfactant, such as EFtop EF301 and EF303 (produced by Shin-Akita Kasei K.K.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical). In addition, a polysiloxane polymer KP-341 (produced by Shin-Etsu Chemical Co., Ltd.) and a surfactant represented by the following formula (S1), that is, commercially available PF636 (n=1, m=6, $R_1$: a methyl group), PF6320 (n=1, m=20, $R_1$: a methyl group), PF656 (n=2, m=6, $R_1$: a methyl group) and PF6520 (n=2, m=20, $R_1$: a methyl group) (produced by OMNOVA), may also be used.

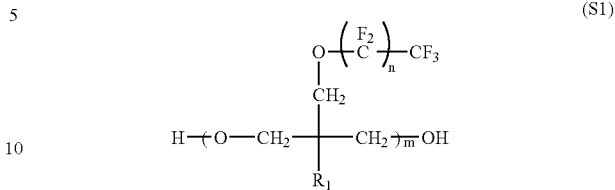

(S1)

wherein $R_1$ represents a hydrogen atom or an alkyl group, m represents a number of 1 to 30, and n represents a number of 1 to 3.

Other than these known surfactants, a surfactant using a polymer having a fluoro-aliphatic group derived from a fluoro-aliphatic compound, produced by telomerization (also called a telomer process) or oligomerization (also called an oligomer process), may also be used. The fluoro-aliphatic compound can be synthesized by the method described in JP-A-2002-90991.

The polymer having a fluoro-aliphatic group is preferably a copolymer of a fluoro-aliphatic group-containing monomer and a (poly(oxyalkylene))acrylate and/or a (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may be a unit having alkylenes differing in the chain length within the same chain, such as block-linked poly(oxyethylene, oxypropylene and oxyethylene) group and block-linked poly(oxyethylene and oxypropylene) group. Furthermore, the copolymer of a fluoro-aliphatic group-containing monomer and a (poly(oxyalkylene))acrylate (or methacrylate) may be not only a binary copolymer but also a ternary or higher copolymer obtained by simultaneously copolymerizing two or more different fluoro-aliphatic group-containing monomers or two or more different (poly(oxyalkylene))acrylates (or methacrylates).

Examples thereof include Megafac F178, F470, F473, F475, F-476 and F-472 (produced by Dainippon Ink & Chemicals, Inc.), a copolymer of a $C_6F_{13}$ group-containing acrylate (or methacrylate) and a (poly(oxyalkylene))acrylate (or methacrylate), a copolymer of a $C_6F_{13}$ group-containing acrylate (or methacrylate), a (poly(oxyethylene))acrylate (or methacrylate) and a (poly(oxypropylene))acrylate (or methacrylate), a copolymer of a $C_8F_{17}$ group-containing acrylate (or methacrylate) and a (poly(oxyalkylene))acrylate (or methacrylate), and a copolymer of a $C_8F_{17}$ group-containing acrylate (or methacrylate), a (poly(oxyethylene))acrylate (or methacrylate) and a (poly(oxypropylene))acrylate (or methacrylate).

Also, a surfactant other than the fluorine-containing and/or silicon-containing surfactants can be used. Specific examples thereof include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene•polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

The amount of the surfactant used is preferably from 0.00001 to 0.5 mass %, more preferably from 0.0001 to 0.1 mass %, based on the entire amount (excluding the solvent) of the positive resist composition.

[8] Alkali-Soluble Resin

The positive resist composition of the present invention may further contain a resin not containing an acid-decomposable group and being insoluble in water and soluble in an alkali developer (alkali-soluble resin), and by containing this resin, the sensitivity is elevated.

In the present invention, a novolak resin having a molecular weight of approximately from 1,000 to 20,000, or a polyhydroxystyrene derivative having a molecular weight of approximately from 3,000 to 50,000 can be used as this resin, but such a resin exhibits large absorption for light of 250 nm or less and therefore, is preferably used after partially hydrogenating it or in an amount of 30 mass % or less of the entire resin amount.

Also, a resin containing a carboxyl group as the alkali-soluble group may be used. The carboxyl group-containing resin preferably has a monocyclic or polycyclic alicyclic hydrocarbon group so as to enhance the dry etching resistance. Specific examples thereof include a copolymer of a (meth)acrylic acid and a methacrylic acid ester having an alicyclic hydrocarbon structure not exhibiting acid decomposability, and a resin of a (meth)acrylic acid ester of an alicyclic hydrocarbon group having a carboxyl group at the end.

[9] Onium Carboxylate

The positive resist composition of the present invention may further contain an onium carboxylate. Examples of the onium carboxylate include sulfonium carboxylate, iodonium carboxylate and ammonium carboxylate. In particular, the onium carboxylate is preferably an iodonium salt or a sulfonium salt. Also, in the onium carboxylate, the carboxylate residue preferably contains neither an aromatic group nor a carbon-carbon double bond. The anion moiety is preferably a linear, branched, monocyclic or polycyclic alkyl carboxylate anion having a carbon number of 1 to 30, more preferably a carboxylate anion where the alkyl group is partially or entirely substituted by fluorine. The alkyl chain may contain an oxygen atom. By using such a salt, the transparency to light of 220 nm or less is ensured, the sensitivity and the resolving power are enhanced, and the defocus latitude depended on line pitch and the exposure margin are improved.

Examples of the fluorine-substituted carboxylate anion include fluoroacetate anion, difluoroacetate anion, trifluoroacetate anion, pentafluoropropionate anion, heptafluorobutyrate anion, nonafluoropentanoate anion, perfluorododecanoate anion, perfluorotridecanoate anion, perfluorocyclohexanecarboxylate anion and 2,2-bistrifluoromethylpropionate anion.

These onium carboxylates can be synthesized by reacting a sulfonium, iodonium or ammonium hydroxide and a carboxylic acid with silver oxide in an appropriate solvent.

The onium carboxylate content in the composition is suitably from 0.1 to 20 mass %, preferably from 0.5 to 10 mass %, more preferably from 1 to 7 mass %, based on the entire solid content of the composition.

[10] Other Additives

If desired, the positive resist composition of the present invention may further contain, for example, a dye, a plasticizer, a surfactant other than those described above, a photosensitizer and a compound which accelerates the dissolution in a developer.

Such a phenol compound having a molecular weight of 1,000 or less can be easily synthesized by one skilled in the art according to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

[11] Pattern Forming Method

The positive resist composition of the present invention is used by dissolving the above-described components in a predetermined organic solvent, preferably a mixed solvent described above, and coating the obtained solution on a predetermined support as follows.

That is, the positive resist composition is coated on a substrate (e.g., silicon/silicon dioxide-coated substrate) as used in the production of a precision integrated circuit device, by an appropriate coating method such as spinner or coater. Examples of the substrate which can be used include a normal bare Si substrate, an SOG substrate, and a substrate having thereon the following inorganic or organic antireflection film.

As for the antireflection film, an inorganic film type such as titanium, titanium dioxide, titanium nitride, chromium oxide, carbon and α-silicone, or an organic film type comprising a light absorbent and a polymer material can be used. As for the organic antireflection film, for example, DUV30 Series, DUV-40 Series and ARC25 produced by Brewer Science, Inc.; and AC-2, AC-3, AR19 and AR-20 produced by Shipley Co., Ltd., may also be used.

After the coating, the resist film is exposed by actinic rays or radiation through a predetermined mask, then preferably baked (heated), and thereafter subjected to development and rinsing, whereby a good resist pattern can be obtained.

Examples of the actinic ray or radiation used for exposure include KrF excimer laser light (248 nm), ArF excimer laser light (193 nm), $F_2$ excimer laser light (157 nm), X-ray and electron beam. Among these, preferred is far ultraviolet ray at a wavelength of 250 nm or less, more preferably at a wavelength of 220 nm or less.

The alkali developer which can be used for the development is an alkaline aqueous solution containing, for example, inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), a quaternary ammonium salt (e.g., tetramethylammonium hydroxide, tetraethylammonium hydroxide, choline), or cyclic amines (e.g., pyrrole, piperidine).

In this alkaline aqueous solution, alcohols and a surfactant may be added in an appropriate amount.

The alkali concentration of the alkali developer is usually from 0.1 to 20 mass %.

The pH of the alkali developer is usually from 10.0 to 15.0.

As for the rinsing solution after development, for example, pure water is used, and a surfactant may be added thereto in an appropriate amount.

EXAMPLES

<Synthesis Example of Photoacid Generator>

Synthesis Example 1

Synthesis of Compound (A-1)

Methylpropanyl-pentafluorobenzenesulfonic acid ester (13.2 g (43.4 mmol)), 12.1 g (65.1 mmol) of 1-dodecanol, 1.47 g (4.34 mmol) of tetrabutylammonium hydrogensulfate, 130 mL of an aqueous 1M-sodium hydroxide solution and 130 mL of toluene were stirred at 70° C. for 12 hours. The resulting reaction solution was rendered neutral by adding dilute sulfuric acid, and the organic layer was dried over magnesium sulfate. After removing the solvent, the residue was purified by column chromatography ($SiO_2$, ethyl acetate/hexane=10/1) to obtain a colorless transparent oil (17.4 g). This oil was dissolved in 160 mL of acetonitrile and after adding 5.93 g (39.6 mmol) of sodium iodide, stirred at room temperature for 6 hours. The resulting reaction solution was ice-cooled and the precipitated solid was filtered and vacuum-dried to obtain 17.4 g (37 mmol, 85%) of 4-dodecyloxy-2,3,5,6-tetrafluorobenzenesulfonic acid as a whitish yellow solid.

$^1$H-NMR (300 MHz, $(CD_3)_2SO$):

δ 0.854 (t, 3H), 1.243 (bs, 16H), 1.392 (quintet, 2H), 1.655 (quintet, 2H), 4.212 (t, 2H).

$^{19}$F-NMR (300 MHz, $(CD_3)_2SO$):

δ −137.11 (m, 2F), −152.66 (m, 2F).

Triphenylsulfonium iodide (2.82 g (7.21 mmol)), 1.26 g (7.57 mmol) of silver acetate, 80 mL of acetonitrile and 40 mL of water were added and stirred at room temperature for 1 hour. The resulting reaction solution was filtered to obtain a triphenylsulfonium acetate solution. Subsequently, 3.00 g (6.87 mmol) of sodium sulfonate prepared above was added thereto and stirred at room temperature for 3 hours. After adding 300 mL of chloroform, the organic layer was washed sequentially with water, with an aqueous saturated ammonium chloride solution and with water. Thereafter, the organic layer was filtered through a 0.1-μm filter and then the solvent was removed to obtain the objective compound (4.40 g, 84%) as a colorless transparent oil.

$^1$H-NMR (300 MHz, $CDCl_3$):

δ 0.877 (t, 3H), 1.262 (bs, 16H), 1.427 (quintet, 2H), 1.729 (m, 2H), 4.177 (t, 2H), 7.662-7.813 (m, 15H).

$^{19}$F-NMR (300 MHz, $CDCl_3$):

δ −140.01 (m, 2F), −156.21 (m, 2F).

(A-1)

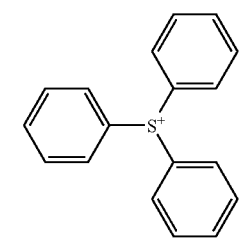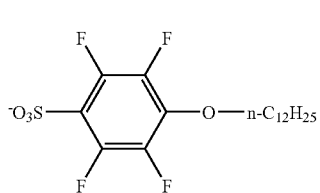

Synthesis Example 2

Synthesis of Compound I-1

I-1: Triphenylsulfonium 1,1,2,2,3,3-hexafluoro-3-(piperidine-1-sulfonyl)propane-1-sulfonate In a nitrogen steam, 4.0 g (12.65 mmol) of 1,1,2,2,3,3-hexafluoropropane-1,3-disulfonyl difluoride, 2.56 g (25.3 mmol) of triethylamine and 30 mL of diisopropyl ether were ice-cooled, and a mixed solution containing 1.08 g (12.6 mmol) of piperidine and 15 mL of diisopropyl ether was added dropwise thereto over 30 minutes. The resulting solution was stirred under ice cooling for 1 hour and further stirred at room temperature for 1 hour. The organic layer was washed sequentially with water, with an aqueous saturated ammonium chloride solution and with water, and then dried over sodium sulfate. After removing the solvent, 20 mL of ethanol and 200 mg of sodium hydroxide were added to the residue and stirred at room temperature for 2 hours. The resulting reaction solution was neutralized with dilute hydrochloric acid to obtain an ethanol solution of the sulfonic acid represented by the following formula.

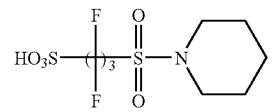

A triphenylsulfonium acetate solution was added to the thus-obtained sulfonic acid solution and stirred at room temperature for 2 hours. After adding 300 mL of chloroform, the organic layer was washed sequentially with water, with an aqueous saturated ammonium chloride solution and with water and then purified by column chromatography ($SiO_2$; chloroform/methanol=5/1) to obtain 3.0 g (4.68 mmol) of a white solid.

Incidentally, the triphenylsulfonium acetate solution was prepared by adding 5.07 g (13 mol) of triphenylsulfonium iodide, 2.25 g (13.5 mmol) of silver acetate, 120 mL of acetonitrile and 60 mL of water, stirring the mixture at room temperature for 1 hour, and filtering the obtained reaction solution.

$^1$H-NMR (300 MHz, $CDCl_3$):

δ 1.64 (bs, 6H), 3.29 (bs, 2H), 3.64 (bs, 2H), 7.70 (m, 15H).

$^{19}$F-NMR (300 MHz, $CDCl_3$):

δ −111.1 (t, 2F), −114.3 (t, 2F), −119.4 (m, 2F).

(I-1):

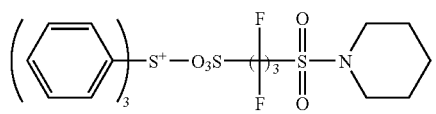

Synthesis Example 3

Synthesis of Compound (II-1)

Triphenylsulfonium iodide (3.3 g) was dissolved in acetonitrile/distilled water=2/1 (by mass), and 1.5 of silver acetate was added thereto and stirred for 30 minutes. The precipitated silver compound was filtered and to the filtrate, 3.0 g of Compound (IA) shown below, which was dissolved in acetonitrile/distilled water=2/1 (by mass), was added. The resulting reaction solution was concentrated and dissolved in 200 ml of chloroform. Subsequently, the organic phase was washed with distilled water, an aqueous ammonium chloride solution and water, then filtered through a 0.10-μm polyfluorotetraethylene filter and thereafter concentrated to obtain 4.2 g of Compound II-1.

$^1$H-NMR (300 MHz, CHCl$_3$): δ 7.6-7.8 (m, 15H)

$^{19}$F-NMR (300 MHz, CHCl$_3$): δ 115.59 (4F), δ 122.29 (2F)

(IA):

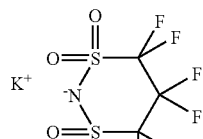

II-1:

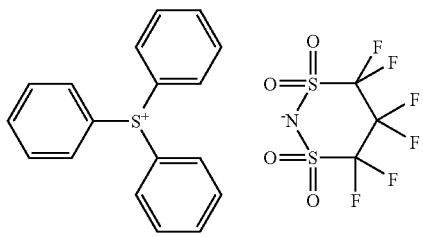

The photoacid generators used in the following Examples were synthesized according to the above-described synthesis methods.

Resins (A1) and (A2) shown below were synthesized as follows by the radical polymerization method.

[Synthesis of Resin (A1)]

In a nitrogen steam, 8.4 g of methyl isobutyl ketone was charged into a three-neck flask and heated at 80° C. Subsequently, a solution obtained by dissolving 9.4 g of 2-methyl-2-adamantyl methacrylate, 4.7 g of 3-hydroxy-1-adamantyl methacrylate, 6.8 g of β-methacryloyloxy-γ-butyrolactone and azobisisobutyronitrile in a proportion of 6 mol % based on the entire monomer amount, in 75.3 g of methyl isobutyl ketone was added dropwise thereto over 6 hours. After the completion of dropwise addition, the solution was further reacted at 80° C. for 2 hours. The resulting reaction solution was allowed to cool and then poured in 720 ml of heptane/80 ml of ethyl acetate, and the precipitated powder was collected by filtration and dried, as a result, 18.3 g of Resin (A1) was obtained. The obtained resin had a weight average molecular weight of 9,300 and a dispersity (Mw/Mn) of 1.98.

[Synthesis of Resin (A2)]

In a nitrogen steam, 8.6 g of methyl isobutyl ketone was charged into a three-neck flask and heated at 80° C. Subsequently, a solution obtained by dissolving 9.9 g of 2-ethyl-2-adamantyl methacrylate, 4.7 g of 3-hydroxy-1-adamantyl methacrylate, 6.8 g of β-methacryloyloxy-γ-butyrolactone and azobisisobutyronitrile in a proportion of 6 mol % based on the entire monomer amount, in 77 g of methyl isobutyl ketone was added dropwise thereto over 6 hours. After the completion of dropwise addition, the solution was further reacted at 80° C. for 2 hours. The resulting reaction solution was allowed to cool and then poured in 2,700 ml of hexane/300 ml of ethyl acetate, and the precipitated powder was collected by filtration and dried, as a result, 19.0 g of Resin (A2) was obtained. The obtained resin had a weight average molecular weight of 9,600 and a dispersity (Mw/Mn) of 1.93.

(A1) Mw=9,300, Mw/Mn=1.98

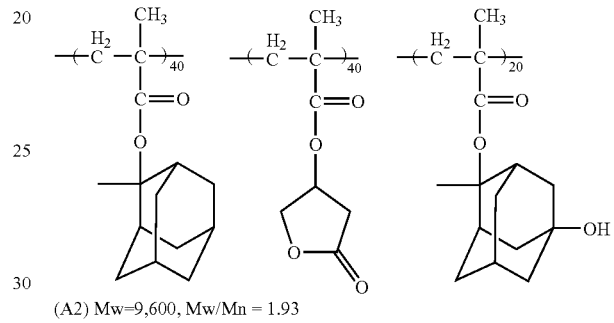

(A2) Mw=9,600, Mw/Mn = 1.93

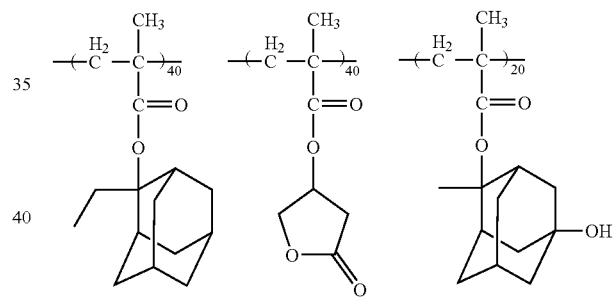

Examples 1 to 12 and Comparative Examples 1 and 2

<Preparation of Resist>

A solution having a solid content concentration of 7.5 mass %, obtained by dissolving the components shown in Table 1 in a solvent, was filtered through a 0.1-μm polyethylene filter to prepare a positive resist solution. The obtained positive resist solutions were evaluated by the following methods and the results are shown in Table 1.

TABLE 1

| | | | Composition | | | | |
|---|---|---|---|---|---|---|---|
| | | Resin (2 g) | Photoacid Generator (0.06 g) | Solvent (mass ratio) | Basic Compound (4 mg) | Surfactant, amount added in parenthesis | Evaluation MEF |
| Example | 1 | A1 | A-1 | SL-1/2 = 95/5 | N-1 | W-2(0.5 mg) | 2.6 |
| | 2 | A1 | A-4 | SL-1/2 = 95/5 | N-1 | W-3(1.0 mg) | 2.9 |
| | 3 | A1 | I-1 | SL-1/2 = 95/5 | N-1 | W-1(2.0 mg) | 2.7 |
| | 4 | A1 | I-43 | SL-1/2 = 95/5 | N-1 | W-5(3.0 mg) | 2.5 |

TABLE 1-continued

| | | Resin (2 g) | Photoacid Generator (0.06 g) | Solvent (mass ratio) | Basic Compound (4 mg) | Surfactant, amount added in parenthesis | Evaluation MEF |
|---|---|---|---|---|---|---|---|
| | 5 | A1 | I-89 | SL-1/2 = 95/5 | N-1 | W-3(2.0 mg) | 2.6 |
| | 6 | A1 | II-1 | SL-1/2 = 95/5 | N-1 | W-4(0.5 mg) | 2.7 |
| | 7 | A2 | A-1 | SL-1/2 = 95/5 | N-1 | W-2(0.5 mg) | 2.9 |
| | 8 | A2 | A-4 | SL-1/2 = 95/5 | N-1 | W-3(1.0 mg) | 2.8 |
| | 9 | A2 | I-1 | SL-1/2 = 95/5 | N-1 | W-1(2.0 mg) | 2.8 |
| | 10 | A2 | I-43 | SL-1/2 = 95/5 | N-1 | W-5(3.0 mg) | 2.6 |
| | 11 | A22 | I-89 | SL-1/2 = 95/5 | N-1 | W-3(2.0 mg) | 2.7 |
| | 12 | A2 | II-1 | SL-1/2 = 95/5 | N-1 | W-4(0.5 mg) | 2.6 |
| Comparative Example | 1 | A1 | z1 | SL-1/2 = 95/5 | N-1 | W-5(1.0 mg) | 5.0 |
| | 2 | A2 | z2 | SL-1/2 = 95/5 | N-1 | W-5(1.0 mg) | 5.3 |

In Table 1, the symbol for each component is as follows.
N-1: 2,6-Diisopropylaniline
W-1: PF636 (produced by OMNOVA) (fluorine-containing)
W-2: PF6320 (produced by OMNOVA) (fluorine-containing)
W-3: PF656 (produced by OMNOVA) (fluorine-containing)
W-4: Megafac F176 (produced by Dainippon Ink & Chemicals, Inc.) (fluorine-containing)
W-5: Florad FC430 (produced by Sumitomo 3M Inc.) (fluorine-containing)
SL-1: Propylene glycol monomethyl ether acetate
SL-2: γ-Butyrolactone
The photoacid generators are as described above.

<Image Performance Test (Evaluation of MEF)>

An organic antireflection film ARC29A (produced by Nissan Chemical Industries, Ltd.) was applied to a silicon wafer and baked at 205° C. for 60 seconds to form a 78-nm antireflection film, and the resist composition prepared above was coated thereon and baked at 120° C. for 60 seconds to form a 200-nm resist film. The obtained wafer was subjected to pattern exposure through a halftone phase shift mask with a transmittance of 6% by using an ArF excimer laser scanner (PAS 5500/1100, manufactured by ASLM, NA: 0.75, σo/σi=0.85/0.55). After heating at 120° C. for 60 seconds, the resist film was developed with an aqueous tetramethylammonium hydroxide solution (2.38 mass %), rinsed with pure water and spin-dried to obtain a resist pattern.

The resist pattern used for the evaluation of MEF was a dense pattern having a 90-nm line and space ratio of 1:1 (pitch=180 nm). The exposure amount (Eopt) necessary for reproducing the above-described mask size was determined by an SEM (S-9260) manufactured by Hitachi Ltd. and assuming that the mask size is fluctuated at the Eopt, the finished size of each line mask pattern of 86 nm and 94 nm (90 mm±4 nm (pitch=180 nm, fixed) was measured. At this time, when CD1 and CD2 (nm) are assigned to the finished sizes of line pattern masks of 86 nm and 94 nm, respectively, (CD2−CD1)/(94−86) is defined as the MEF performance.

This value indicates a variation of finished size per fluctuation of 1 nm, and a smaller numerical value reveals higher MEF performance.

As seen from the results in Table 1, a positive resist composition capable of improving the MEF performance can be provided according to the technique of the present invention.

This application is based on Japanese Patent application JP 2005-77103, filed Mar. 17, 2005, the entire content of which is hereby incorporated by reference, the same as if set forth at length.

What is claimed is:

1. A positive resist composition comprising:
   (A) a resin insoluble or sparingly soluble in an alkali but capable of decomposing under an action of an acid to increase a solubility in an alkali developer, the resin having a β-(meth)acroyloxy-γ-butyrolactone repeating unit represented by the following formula (1) containing a lactone ring which may have a substituent; and
   (B) a compound capable of generating an organic acid represented by the following formula (2), (3), (3'), (4) or (5) upon irradiation of actinic rays or radiation:

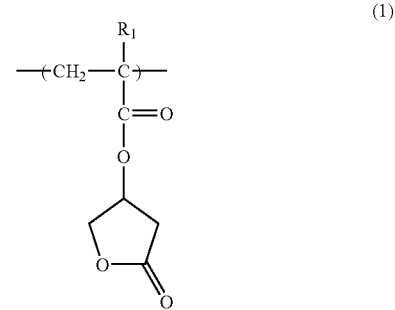

(1)

wherein $R_1$ represents a hydrogen atom or an alkyl group, and the lactone ring may have a substituent;

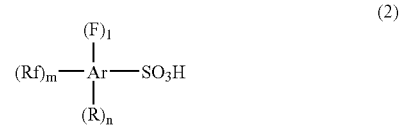

(2)

wherein
Rf represents an organic group having a fluorine atom,
R represents a hydroxyl group or an organic group,
Ar represents an aromatic group,
l represents an integer of 1 to 6,
m represents an integer of 0 to 4, and
n represents an integer of 0 to 4,
provided that m+n represents an integer of 1 or more;

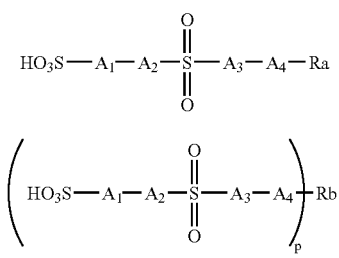
(3)

(3')

wherein
- $A_1$ represents a divalent linking group,
- $A_2$ and $A_3$ each independently represents a single bond, an oxygen atom or —N(Rx)-,
- Rx represents a hydrogen atom, an aryl group, an alkyl group or a cycloalkyl group,
- $A_4$ represents a single bond or —C(=O)—,
- Ra represents a hydrogen atom or an organic group,
- p represents 2 or 3,
- Rb represents a p-valent linking group, and
- when $A_3$ is —N(Rx)-, Ra and Rx, or Rb and Rx may combine to form a ring; and

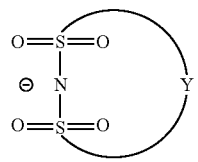
(4)

-continued
(5)

wherein
Y represents an alkylene group substituted by at least one fluorine atom, and
Rc represents an alkyl group or a cycloalkyl group.

2. The positive resist composition as claimed in claim 1, further comprising a dissolution inhibiting compound having a molecular weight of 3,000 or less and capable of decomposing under an action of an acid to increase a solubility in an alkali developer.

3. The positive resist composition as claimed in claim 2, wherein the dissolution inhibiting compound has a molecular weight of 300 to 3,000.

4. The positive resist composition as claimed in claim 2, wherein the dissolution inhibiting compound has a molecular weight of 500 to 2,500.

5. The positive resist composition as claimed in claim 1, further comprising a basic compound.

6. The positive resist composition as claimed in claim 5, wherein the basic compound is as organic amine, basic ammonium salt, basic sulfonium salt and basic iodonium salt.

7. A pattern forming method comprising steps of forming a resist film from the positive resist composition claimed in claim 1, and exposing and developing the resist film.

* * * * *